(12) United States Patent
Sugihara et al.

(10) Patent No.: US 11,543,749 B2
(45) Date of Patent: Jan. 3, 2023

(54) RESIST COMPOSITION AND METHOD FOR PRODUCING RESIST PATTERN, AND METHOD FOR PRODUCING PLATED MOLDED ARTICLE

(71) Applicant: SUMITOMO CHEMICAL COMPANY, LIMITED, Tokyo (JP)

(72) Inventors: Masako Sugihara, Osaka (JP); Takashi Nishimura, Osaka (JP); Junji Nakanishi, Osaka (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 168 days.

(21) Appl. No.: 17/178,794

(22) Filed: Feb. 18, 2021

(65) Prior Publication Data

US 2021/0278765 A1 Sep. 9, 2021

(30) Foreign Application Priority Data

Feb. 21, 2020 (JP) .............................. JP2020-028862

(51) Int. Cl.
| | | |
|---|---|---|
| G03F 7/023 | (2006.01) | |
| G03F 7/022 | (2006.01) | |
| G03F 7/30 | (2006.01) | |
| G03F 7/039 | (2006.01) | |
| C08F 212/14 | (2006.01) | |
| G03F 7/038 | (2006.01) | |

(52) U.S. Cl.
CPC .......... *G03F 7/0233* (2013.01); *C08F 212/24* (2020.02); *G03F 7/0236* (2013.01); *G03F 7/038* (2013.01); *G03F 7/039* (2013.01); *G03F 7/30* (2013.01)

(58) Field of Classification Search
CPC .... G03F 7/0233; G03F 7/0226; G03F 7/0236; G03F 7/30
See application file for complete search history.

(56) References Cited

U.S. PATENT DOCUMENTS

| | | | | |
|---|---|---|---|---|
| 5,019,488 A | * | 5/1991 | Mammato | G03F 7/039 430/328 |
| 5,629,135 A | * | 5/1997 | Kobayashi | G03F 7/039 430/905 |
| 2006/0228644 A1 | * | 10/2006 | Chen | G03F 7/0226 430/270.1 |
| 2019/0169348 A1 | * | 6/2019 | Imada | G03F 7/0236 |

FOREIGN PATENT DOCUMENTS

| | | | |
|---|---|---|---|
| JP | 2018070868 A | * | 5/2018 |
| JP | 2018101129 A | | 6/2018 |

* cited by examiner

*Primary Examiner* — John S Chu
(74) *Attorney, Agent, or Firm* — Buchanan, Ingersoll & Rooney PC

(57) ABSTRACT

The present invention provides a resist composition which has sufficient resistant to a plating treatment and is capable of forming a resist pattern with high accuracy. The present invention also provides a method for producing a resist pattern using the resist composition, and a method for producing a plated molded article using the resist pattern. The present invention relates to a resist composition comprising a compound (I) having a quinone diazide sulfonyl group, a resin comprising a structural unit having an acid-labile group (A1), an alkali-soluble resin (A2) and an acid generator (B); a method for producing a resist pattern using the resist composition; and a method for producing a plated molded article using the resist pattern.

10 Claims, 1 Drawing Sheet

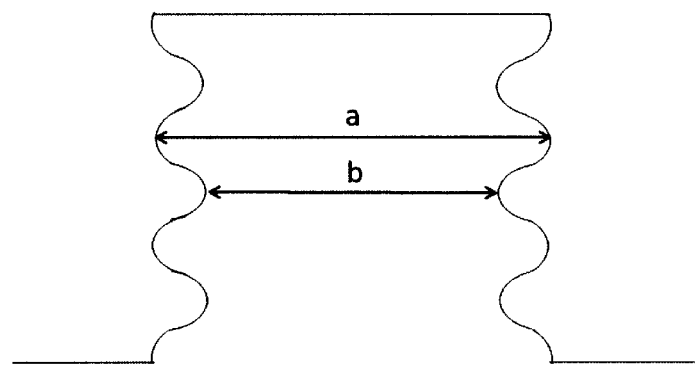

RESIST COMPOSITION AND METHOD FOR PRODUCING RESIST PATTERN, AND METHOD FOR PRODUCING PLATED MOLDED ARTICLE

BACKGROUND OF THE INVENTION

Field of the Invention

The present invention relates to a resist composition and a method for producing a resist pattern, and a method for producing a plated molded article.

Description of the Related Art

JP 2018-101129 A mentions a resist composition including a compound having a naphthoquinone diazide sulfonyl group.

SUMMARY OF THE INVENTION

When a plating treatment is performed using a resist pattern obtained by using a conventional resist composition as mentioned in JP 2018-101129 A, there was still further room for improvement in forming a plated molded article with high accuracy.

Thus, it is an object of the present invention to provide a resist composition which has sufficient resistant to a plating treatment and is capable of forming a resist pattern with high accuracy. It is also an object to provide a method for producing a resist pattern using the resist composition.

The present inventors have found that the above objects can be achieved by a resist composition comprising a compound having a quinone diazide sulfonyl group, a resin comprising a structural unit having an acid-labile group, an alkali-soluble resin and an acid generator.

The present invention provides the following inventions.

[1]
A resist composition comprising a compound (I) having a quinone diazide sulfonyl group, a resin comprising a structural unit having an acid-labile group (A1), an alkali-soluble resin (A2) and an acid generator (B).

[2]
The resist composition according to [1], wherein the compound (I) having a quinone diazide sulfonyl group is a compound having a group represented by formula (a), a group represented by formula (b) or a group represented by formula (c):

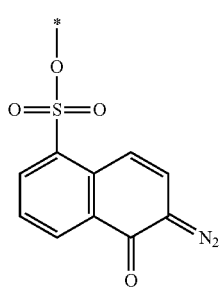
(a)

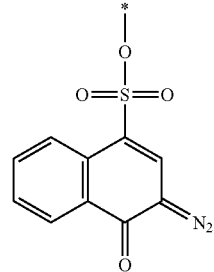
(b)

wherein, in formula (a) and formula (b), * represents a bond:

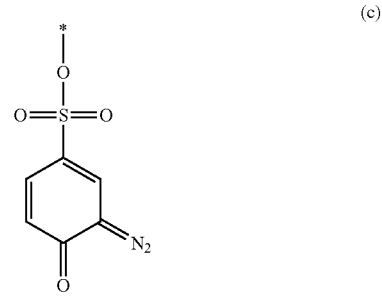
(c)

wherein, in formula (c), * represents a bond.

[3]
The resist composition according to [2], wherein the compound (I) having a quinone diazide sulfonyl group is at least one selected from the group consisting of a compound represented by formula (II), a compound represented by formula (III), a compound represented by formula (IV) and a compound represented by formula (V):

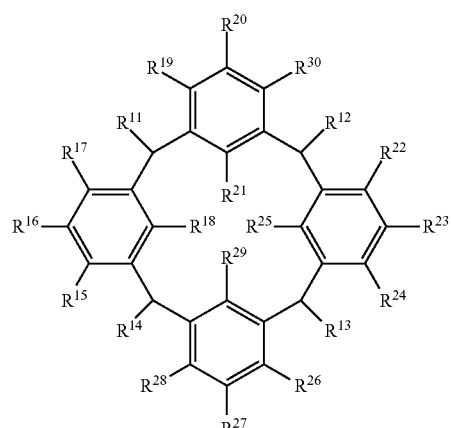
(II)

wherein, in formula (II),
$R^{11}$ to $R^{14}$ each independently represent a hydrogen atom, a hydroxy group, a hydrocarbon group having 1 to 18 carbon atoms, a group represented by formula (a), a group represented by formula (b) or a group represented by formula (c), and a methylene group included in the hydrocarbon group having 1 to 18 carbon atoms may be replaced by an oxygen atom, a carbonyl group or —$NR^{d1}$—,
$R^{d1}$ represents a hydrogen atom or an alkyl group having 1 to 6 carbon atoms, R$^{15}$ to R$^{30}$ each independently represent a hydrogen atom, a hydroxy group, a group represented by formula (a), a group represented by formula (b) or a group represented by formula (c), and at least one of R$^{11}$ to R$^{30}$ is a group represented by formula (a), a group represented by formula (b) or a group represented by formula (c):

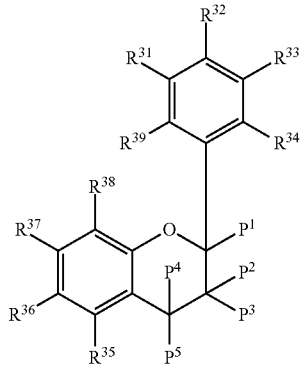

(III)

wherein, in formula (III),

R$^{31}$ to R$^{39}$ each independently represent a hydrogen atom, a hydroxy group, an alkyl group having 1 to 6 carbon atoms, a group represented by formula (a), a group represented by formula (b) or a group represented by formula (c), and at least one of R$^{31}$ to R$^{39}$ is a group represented by formula (a), a group represented by formula (b) or a group represented by formula (c), P$^1$ to P$^5$ each independently represent a hydrogen atom, a hydrocarbon group having 1 to 18 carbon atoms, a methylene group included in the hydrocarbon group having 1 to 18 carbon atoms may be replaced by an oxygen atom, a carbonyl group or —NR$^{d2}$—, and P$^1$ and P$^2$ may be bonded to each other to form a ring together with two carbon atoms to which P$^1$ and P$^2$ are bonded, and P$^4$ and P$^3$ may be bonded to each other to form a ring together with carbon atoms to which P$^4$ and P$^3$ are bonded, and R$^{d2}$ represents a hydrogen atom or an alkyl group having 1 to 6 carbon atoms:

(IV)

R$^{53}$ R$^{49}$ R$^{44}$
R$^{40}$ R$^{45}$
R$^{41}$ R$^{52}$ R$^{50}$ R$^{48}$ R$^{46}$
R$^{42}$ R$^{43}$ R$^{51}$ R$^{47}$ wherein, in formula (IV), R$^{40}$ to R$^{53}$ each independently represent a hydrogen atom, a hydroxy group, an alkyl group having 1 to 6 carbon atoms, a group represented by formula (a), a group represented by formula (b) or a group represented by formula (c), and at least one of R$^{40}$ to R$^{53}$ is a group represented by formula (a), a group represented by formula (b) or a group represented by formula (c), and n$^a$ represents an integer of 1 to 5, and when n$^a$ is an integer of 2 or more, a plurality of R$^{49}$ to R$^{52}$ may be the same or different from each other:

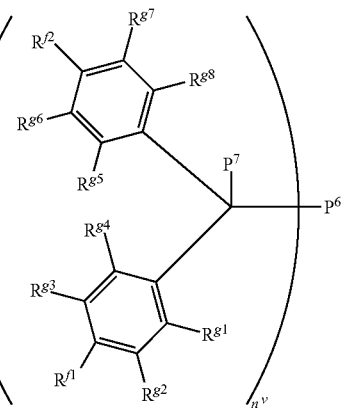

(V)

wherein, in formula (V),

R$^{f1}$, R$^{f2}$ and R$^{g1}$ to R$^{g8}$ each independently represent a hydrogen atom, a hydroxy group, an alkyl group having 1 to 6 carbon atoms, a group represented by formula (a), a group represented by formula (b) or a group represented by formula (c), and at least one of R$^{f1}$, R$^{f2}$ and R$^{g1}$ to R$^{g8}$ is a group represented by formula (a), a group represented by formula (b) or a group represented by formula (c), P$^6$ represents a monovalent aromatic hydrocarbon group having 6 to 12 carbon atoms or a divalent aromatic hydrocarbon group having 6 to 12 carbon atoms, and the aromatic hydrocarbon group may be substituted with at least one selected from the group consisting of a hydroxy group and an alkyl group having 1 to 6 carbon atoms, P$^7$ represents a hydrogen atom or a hydrocarbon group having 1 to 18 carbon atoms which may have a substituent, a methylene group included in the hydrocarbon group having 1 to 18 carbon atoms may be replaced by an oxygen atom, a carbonyl group or —NR$^{d3}$-, and P$^6$ and P$^7$ may be bonded to each other to form a ring, n$^v$ represents 1 or 2, and R$^{d3}$ represents a hydrogen atom or an alkyl group having 1 to 6 carbon atoms.

[4]

The resist composition according to any one of [1] to [3], wherein the resin comprising a structural unit having an acid-labile group (A1) is a resin comprising a structural unit having a group represented by formula (10) or a group represented by formula (20):

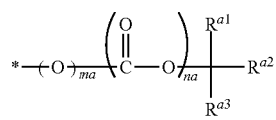

(10)

wherein, in formula (10), R$^{a1}$, R$^{a2}$ and R$^{a3}$ each independently represent an alkyl group having 1 to 8 carbon atoms or an alicyclic hydrocarbon group having 3 to 20 carbon atoms, or R$^{a1}$ and R$^{a2}$ are bonded to each other to form a ring having 3 to 20 carbon atoms together with carbon atoms to which R$^{a1}$ and R$^{a2}$ are bonded, and R$^{a3}$ represents an alkyl group having 1 to 8 carbon atoms or an alicyclic hydrocarbon group having 3 to 20 carbon atoms, ma and na each independently represent 0 or 1, at least one of ma and na represents 1, and * represents a bond:

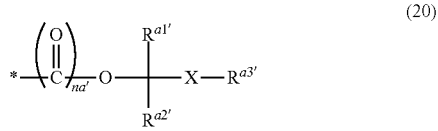

(20)

wherein, in formula (20), $R^{a1'}$ and $R^{a2'}$ each independently represent a hydrogen atom or a hydrocarbon group having 1 to 20 carbon atoms, $R^{a3'}$ represents a hydrocarbon group having 1 to 20 carbon atoms, or $R^{a1'}$ represents a hydrogen atom or a hydrocarbon group having 1 to 20 carbon atoms, and $R^{a2'}$ and $R^{a3'}$ are bonded to each other to form an heterocyclic ring having 3 to 20 carbon atoms together with carbon atoms and X to which $R^{a2'}$ and $R^{a3'}$ are bonded, a methylene group included in the hydrocarbon group having 1 to 20 carbon atoms and the heterocyclic ring having 3 to 20 carbon atoms may be replaced by an oxygen atom or a sulfur atom, X represents an oxygen atom or a sulfur atom, na' represents 0 or 1, and * represents a bond.

[5]

The resist composition according to any one of [1] to [4], wherein the resin comprising a structural unit having an acid-labile group (A1) is a resin comprising a structural unit represented by formula (a1-1) or a structural unit represented by formula (a1-2):

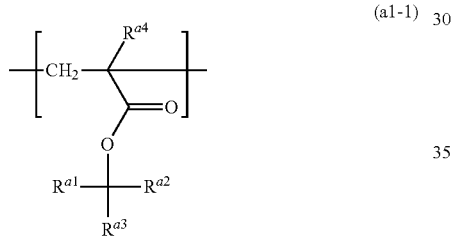

(a1-1)

wherein, in formula (a1-1), $R^{a1}$, $R^{a2}$ and $R^{a3}$ each independently represent an alkyl group having 1 to 8 carbon atoms or an alicyclic hydrocarbon group having 3 to 20 carbon atoms, or $R^{a1}$ and $R^{a2}$ are bonded to each other to form a ring having 3 to 20 carbon atoms together with carbon atoms to which $R^{a1}$ and $R^{a2}$ are bonded, and $R^{a3}$ represents an alkyl group having 1 to 8 carbon atoms or an alicyclic hydrocarbon group having 3 to 20 carbon atoms, and $R^{a4}$ represents a hydrogen atom or a methyl group:

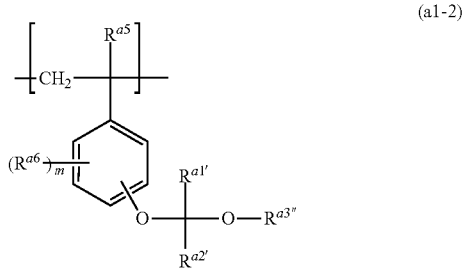

(a1-2)

wherein, in formula (a1-2), $R^{a1'}$ and $R^{a2'}$ each independently represent a hydrogen atom or a hydrocarbon group having 1 to 20 carbon atoms, $R^{a3'}$ represents a hydrocarbon group having 1 to 20 carbon atoms, or $R^{a1'}$ represents a hydrogen atom or a hydrocarbon group having 1 to 20 carbon atoms, and $R^{a2'}$ and $R^{a3'}$ are bonded to each other to form an heterocyclic ring having 3 to 20 carbon atoms together with carbon atoms and oxygen atoms to which $R^{a2'}$ and $R^{a3'}$ are bonded, and a methylene group included in the hydrocarbon group having 1 to 20 carbon atoms and the heterocyclic ring having 3 to 20 carbon atoms may be replaced by an oxygen atom or a sulfur atom, $R^{a5}$ represents a hydrogen atom or a methyl group, $R^{a6}$ represents an alkyl group having 1 to 6 carbon atoms or an alkoxy group having 1 to 6 carbon atoms, and m represents an integer of 0 to 4, and when m is 2 or more, a plurality of $R^{a6}$ may be the same or different from each other.

[6]

The resist composition according to any one of [1] to [4], wherein the resin comprising a structural unit having an acid-labile group (A1) is a resin comprising a structural unit represented by formula (a3A) or a structural unit represented by formula (a3B):

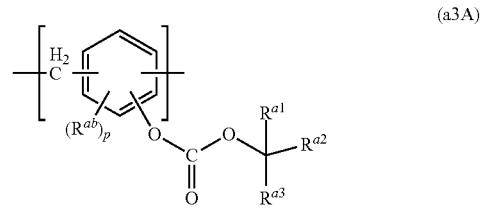

(a3A)

wherein, in formula (a3A), $R^{a1}$, $R^{a2}$ and $R^{a3}$ each independently represent an alkyl group having 1 to 8 carbon atoms or an alicyclic hydrocarbon group having 3 to 20 carbon atoms, or $R^{a1}$ and $R^{a2}$ are bonded to each other to form a ring having 3 to 20 carbon atoms together with carbon atoms to which $R^{a1}$ and $R^{a2}$ are bonded, and $R^{a3}$ represents an alkyl group having 1 to 8 carbon atoms or an alicyclic hydrocarbon group having 3 to 20 carbon atoms, $R^{ab}$ represents a hydroxy group, an alkyl group having 1 to 6 carbon atoms or an alkoxy group having 1 to 6 carbon atoms, and p represents 0, 1, 2 or 3, and when p is 2 or 3, $R^{ab}$ may be the same or different:

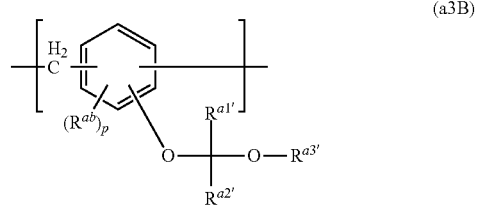

(a3B)

wherein, in formula (a3B), $R^{a1'}$ and $R^{a2'}$ each independently represent a hydrogen atom or a hydrocarbon group having 1 to 20 carbon atoms, $R^{a3'}$ represents a hydrocarbon group having 1 to 20 carbon atoms, or $R^{a1'}$ represents a hydrogen atom or a hydrocarbon group having 1 to 20 carbon atoms, and $R^{a2'}$ and $R^{a3'}$ are bonded to each other to form an heterocyclic ring having 3 to 20 carbon atoms together with carbon atoms and oxygen atoms to which $R^{a2'}$ and $R^{a3'}$ are bonded, a methylene group included in the hydrocarbon group having 1 to 20 carbon atoms and the heterocyclic ring having 3 to 20 carbon atoms may be replaced by an oxygen atom or a sulfur atom, $R^{ab}$ represents a hydroxy group, an alkyl group having 1 to 6 carbon atoms or an alkoxy group having 1 to 6 carbon atoms, and p represents 0, 1, 2 or 3, and when p is 2 or 3, $R^{ab}$ may be the same or different.

[7]

The resist composition according to any one of [1] to [6], wherein the alkali-soluble resin (A2) is a resin which comprises a structural unit having a carboxy group or a hydroxy group and does not comprise a structural unit having an acid-labile group.

[8]

The resist composition according to any one of [1] to [7], further comprising a quencher (C).

[9]

A method for producing a resist pattern, which comprises:
(1) a step of applying the resist composition according to any one of [1] to [8] on a metal surface of a substrate having the metal surface,
(2) a step of drying the applied composition to form a composition layer,
(3) a step of exposing the composition layer, and
(4) a step of developing the exposed composition layer.

[10]

A method for producing a plated molded article, which comprises:
(1) a step of applying the resist composition according to any one of [1] to [8] on a metal surface of a substrate having the metal surface,
(2) a step of drying the applied composition to form a composition layer,
(3) a step of exposing the composition layer,
(4) a step of developing the exposed composition layer,
(5) a step of forming a plated molded article using the resist pattern thus obtained as a mold, and
(6) a step of stripping the resist pattern.

By using the resist composition of the present invention, a resist pattern can be formed with high accuracy and the resist pattern is capable of forming a plated molded article with high accuracy.

BRIEF DESCRIPTION OF THE DRAWINGS

FIG. 1 is a drawing schematically showing a maximum value a and a minimum value b of a line width in a line and space pattern of the resist pattern.

DETAILED DESCRIPTION OF THE PREFERRED EMBODIMENTS

In the present specification, unless otherwise specified, in the description of a structural formula of a compound, "aliphatic hydrocarbon group" means a linear or branched aliphatic hydrocarbon group, and "alicyclic hydrocarbon group" means a group in which the number corresponding to the valence of hydrogen atoms are eliminated from the ring of an alicyclic hydrocarbon. "Aromatic hydrocarbon group" also includes a group in which a hydrocarbon group is bonded to an aromatic ring. When stereoisomers exist, all stereoisomers are included.

In the present specification, "(meth)acrylic acid" means "at least one of acrylic acid and methacrylic acid", and "(meth)acrylate" means "at least one of acrylate and methacrylate".

In groups mentioned in the present specification, those that can take both linear and branched structures are interpreted to include both.

In the present specification, "solid content of resist composition" means the total of contents in which the below-mentioned solvent (E) is removed from the total amount of the resist composition.

1. Resist Composition

The resist composition of the present invention comprises a compound having a quinone diazide sulfonyl group (hereinafter sometimes referred to as "compound (I)"), a resin comprising a structural unit having an acid-labile group (hereinafter sometimes referred to as "resin (A1)"), an alkali-soluble resin (hereinafter sometimes referred to as "resin (A2)") and an acid generator (hereinafter sometimes referred to as "acid generator (B)").

It is preferable that the resist composition of the present invention comprises, in addition to the compound (I), the resin (A1), the resin (A2) and the acid generator (B), a quencher (hereinafter sometimes referred to as "quencher (C)") and/or a solvent (hereinafter sometimes referred to as "solvent (E)").

<Compound (I)>

The compound (I) of the present invention is a compound having a quinone diazide sulfonyl group.

While the compound (I) interacts with a hydrophilic group of a resin (A2), thus enabling suppression of dissolution of the resin (A2) in a developer (aqueous alkali solution) in the light unirradiated (unexposed) area, it causes decomposition of a quinone diazide group to form a carboxy group, leading to generation of carboxylic acid, thus enabling promotion of dissolution of the resin (A2) in a developer (aqueous alkali solution) in the light irradiated (exposed) area. In the light unirradiated (unexposed) area, crosslinking of the resin (A2) in the presence of a developer (aqueous alkali solution) causes resistance to the developer (aqueous alkali solution) and a plating solution, thus enabling an improvement in accuracy of a plated molded article.

The compound (I) is not particularly limited as long as it has one or more quinone diazide sulfonyl groups in the molecule. The molecular weight of the compound obtained by substituting all the quinone diazide sulfonyl groups existing in the molecule of the compound (I) with hydrogen atoms is preferably 3,000 or less, more preferably 2,000 or less, and still more preferably 1,500 to 400.

Examples of the compound having a quinone diazide sulfonyl group include a compound having a naphthoquinone diazide sulfonyl group, a compound having a benzoquinone diazide sulfonyl group, a compound having an anthraquinone diazide sulfonyl group and the like, and the compound having a naphthoquinone diazide sulfonyl group and the compound having a benzoquinone diazide sulfonyl group are preferable. The compound having a naphthoquinone diazide sulfonyl group is preferably a compound having a 1,2-naphthoquinone diazide sulfonyl group, more preferably a compound having a group represented by formula (a) or a group represented by formula (b), and still more preferably a compound having a group represented by formula (a). The compound having a benzoquinone diazide sulfonyl group is preferably a compound having a 1,2-benzoquinone diazide sulfonyl group, and more preferably a compound having a group represented by formula (c):

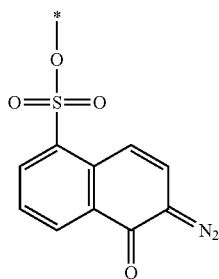

(a)

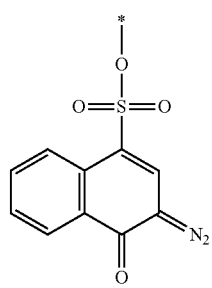

(b)

wherein, in formula (a) and formula (b), * represents a bond:

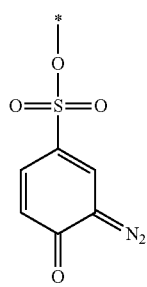

(c)

wherein, in formula (c), * represents a bond.

The compound obtained by substituting all the quinone diazide sulfonyl groups existing in the molecule of the compound having a quinone diazide sulfonyl group with hydrogen atoms is preferably an aromatic compound having a phenolic hydroxyl group. The compound having a quinone diazide sulfonyl group is preferably a compound in which an aromatic compound having a phenolic hydroxyl group has been subjected to quinonediazidosulfonic acid esterification. The compound having a quinone diazide sulfonyl group is more preferably at least one selected from the group consisting of a compound represented by formula (II) (hereinafter sometimes referred to as "compound (II)"), a compound represented by formula (III) (hereinafter sometimes referred to as "compound (III)"), a compound represented by formula (IV) (hereinafter sometimes referred to as "compound (IV)") and a compound represented by formula (V) (hereinafter sometimes referred to as "compound (V)"):

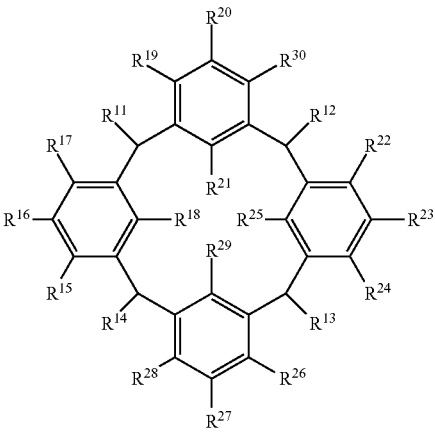

(II)

wherein, in formula (II), $R^{11}$ to $R^{14}$ each independently represent a hydrogen atom, a hydroxy group, a hydrocarbon group having 1 to 18 carbon atoms, a group represented by formula (a), group represented by formula (b) or a group represented by formula (c), and a methylene group included in the hydrocarbon group having 1 to 18 carbon atoms may be replaced by an oxygen atom, a carbonyl group or —$NR^{d1}$—, $R^{d1}$ represents a hydrogen atom or an alkyl group having 1 to 6 carbon atoms, $R^{15}$ to $R^{30}$ each independently represent a hydrogen atom, a hydroxy group, a group represented by formula (a), a group represented by formula (b) or a group represented by formula (c), at least one of $R^{11}$ to $R^{30}$ is a group represented by formula (a), a group represented by formula (b) or a group represented by formula (c):

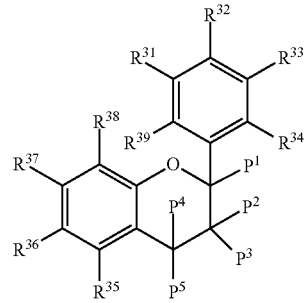

(III)

wherein, in formula (III), $R^{31}$ to $R^{39}$ each independently represent a hydrogen atom, a hydroxy group, an alkyl group having 1 to 6 carbon atoms, a group represented by formula (a), a group represented by formula (b) or a group represented by formula (c), and at least one of $R^{31}$ to $R^{39}$ is a group represented by formula (a), a group represented by formula (b) or a group represented by formula (c), $P^1$ to $P^5$ each independently represent a hydrogen atom or a hydrocarbon group having 1 to 18 carbon atoms, a methylene group included in the hydrocarbon group having 1 to 18 carbon atoms may be replaced by an oxygen atom, a carbonyl group or —$NR^{d2}$—, $P^1$ and $P^2$ may be bonded to each other to form a ring together with two carbon atoms to which $P^1$ and $P^2$ are bonded, and $P^4$ and $P^3$ may be bonded to each other to form a ring together with carbon atoms to which P⁴ and P³ are bonded, and $R^{d2}$ represents a hydrogen atom or an alkyl group having 1 to 6 carbon atoms:

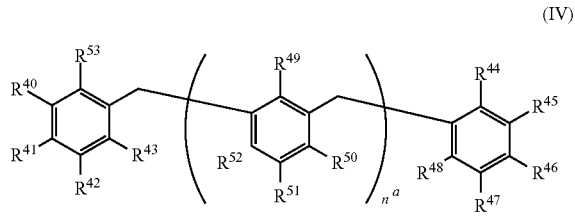

(IV)

wherein, in formula (IV), $R^{40}$ to $R^{53}$ each independently represent a hydrogen atom, a hydroxy group, an alkyl group having 1 to 6 carbon atoms, a group represented by formula (a), a group represented by formula (b) or a group represented by formula (c), and at least one of $R^{40}$ to $R^{53}$ is a group represented by formula (a), a group represented by formula (b) or a group represented by formula (c), $n^a$ represents an integer of 1 to 5, and when $n^a$ is an integer of 2 or more, a plurality of $R^{49}$ to $R^{52}$ may be the same or different from each other:

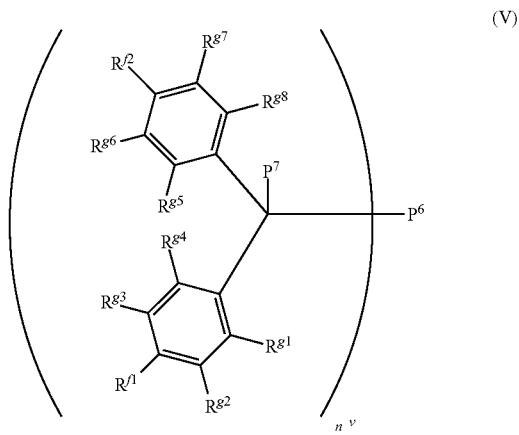

(V)

wherein, in formula (V), $R^{f1}$, $R^{f2}$ and $R^{g1}$ to $R^{g8}$ each independently represent a hydrogen atom, a hydroxy group, an alkyl group having 1 to 6 carbon atoms, a group represented by formula (a), a group represented by formula (b) or a group represented by formula (c), and at least one of $R^{f1}$, $R^{f2}$ and $R^{g1}$ to $R^{g8}$ is a group represented by formula (a), a group represented by formula (b) or a group represented by formula (c), $P^6$ represents a monovalent aromatic hydrocarbon group having 6 to 12 carbon atoms or a divalent aromatic hydrocarbon group having 6 to 12 carbon atoms, and the aromatic hydrocarbon group may be substituted with at least one selected from the group consisting of a hydroxy group and an alkyl group having 1 to 6 carbon atoms, $P^7$ represents a hydrogen atom or a hydrocarbon group having 1 to 18 carbon atoms which may have a substituent, a methylene group included in the hydrocarbon group having 1 to 18 carbon atoms may be replaced by an oxygen atom, a carbonyl group or —$NR^{d3}$—, and $P^6$ and $P^7$ may be bonded to each other to form a ring, $n^v$ represents 1 or 2, and $R^{d3}$ represents a hydrogen atom or an alkyl group having 1 to 6 carbon atoms.

Examples of the hydrocarbon group having 1 to 18 carbon atoms include a chain hydrocarbon group having 1 to 18 carbon atoms (including a linear or branched saturated chain hydrocarbon group having 1 to 18 carbon atoms (an alkyl group), a linear or branched unsaturated chain hydrocarbon group having 2 to 18 carbon atoms (an alkenyl group, an alkynyl group), etc.), a monocyclic or polycyclic alicyclic hydrocarbon group having 3 to 18 carbon atoms (including a saturated alicyclic hydrocarbon group having 3 to 18 carbon atoms, an unsaturated alicyclic hydrocarbon group having 3 to 18 carbon atoms, etc.), an aromatic hydrocarbon group having 6 to 18 carbon atoms and the like, and those obtained by combining two or more of these groups may be exemplified.

The alkyl group having 1 to 18 carbon atoms may be either linear or branched, and examples thereof include a methyl group, an ethyl group, a propyl group, an isopropyl group, a t- or sec-butyl group, a pentyl group, a hexyl group, a heptyl group, an octyl group, a nonyl group, a decyl group, an undecyl group, a dodecyl group and the like. Of these, a linear alkyl group is preferable.

The alkenyl group having 2 to 18 carbon atoms may be either linear or branched, and examples thereof include an ethenyl group, a propenyl group, an isopropenyl group, a methylpropenyl group, a methylbutenyl group, a butenyl group, an isobutenyl group, a tert-butenyl group, a pentenyl group, a hexenyl group, a heptenyl group, an octenyl group, an isooctenyl group, a nonenyl group and the like.

The alkynyl group having 2 to 20 carbon atoms may be either linear or branched, and examples thereof include an ethynyl group, a propynyl group, an isopropynyl group, a butynyl group, an isobutynyl group, a tert-butynyl group, a pentynyl group, a hexynyl group, an octynyl group, a nonynyl group and the like.

The chain hydrocarbon group having 1 to 18 carbon atoms preferably has 1 to 16 carbon atoms, more preferably 1 to 12 carbon atoms, still more preferably 1 to 8 carbon atoms, yet more preferably 1 to 6 carbon atoms, and further preferably 1 to 4 carbon atoms.

Examples of the monocyclic alicyclic hydrocarbon group having 3 to 18 carbon atoms include monocyclic saturated alicyclic hydrocarbon groups, for example, cycloalkyl groups such as a cyclopentyl group, a cyclohexyl group, a cycloheptyl group and a cyclooctyl group; and monocyclic unsaturated alicyclic hydrocarbon groups such as a cyclopropenyl group and a cyclobutenyl group. Examples of the polycyclic alicyclic hydrocarbon group having 3 to 18 carbon atoms include polycyclic saturated alicyclic hydrocarbon groups such as a decahydronaphthyl group, an adamantyl group and a norbornyl group. The alicyclic hydrocarbon group having 3 to 18 carbon atoms preferably has 3 to 16 carbon atoms, more preferably 3 to 12 carbon atoms, and still more preferably 3 to 10 carbon atoms.

Examples of the aromatic hydrocarbon group having 6 to 18 carbon atoms include a phenyl group, a naphthyl group, an anthryl group, a biphenyl group, a phenanthryl group and the like. The aromatic hydrocarbon group having 6 to 18 carbon atoms preferably has 6 to 14 carbon atoms, and more preferably 6 to 10 carbon atoms.

It is possible to select, as the alkyl group having 1 to 6 carbon atoms, a group corresponding to an alkyl group having 1 to 6 carbon atoms form the above-mentioned alkyl group having 1 to 18 carbon atoms.

Examples of the ring formed by bonding $P^1$ and $P^2$ to each other together with two carbon atoms to which $P^1$ and $P^2$ are bonded and the ring formed by bonding $P^4$ and $P^5$ to each other together with carbon atoms to which $P^4$ and $P^5$ are bonded include, each independently, a monocyclic or polycyclic alicyclic hydrocarbon ring having 3 to 18 carbon atoms and the like. Examples of these rings include cycloalkane rings such as a cyclopentane ring, a cyclohexane ring, a cycloheptane ring and a cyclooctane ring; a decahydronaphthalene ring, an adamantane ring, a norbornane ring, and the like. The alicyclic hydrocarbon ring having 3 to 18 carbon atoms preferably has 3 to 16 carbon atoms, more preferably 3 to 12 carbon atoms, and still more preferably 3 to 10 carbon atoms.

Examples of the substituent of the hydrocarbon group having 1 to 18 carbon atoms in $P^7$ include a halogen atom, a hydroxy group, an alkoxy group having 1 to 12 carbon atoms, an acyl group having 2 to 4 carbon atoms, an acyloxy group having 2 to 4 carbon atoms and the like.

Examples of the halogen atom include a fluorine atom, a chlorine atom, a bromine atom and an iodine atom, and the fluorine atom is preferable.

Examples of the alkoxy group having 1 to 12 carbon atoms include a methoxy group, an ethoxy group, a propoxy group, a butoxy group and the like.

Examples of the acyl group having 2 to 4 carbon atoms include an acetyl group, a propionyl group, a butyryl group and the like.

Examples of the acyloxy group having 2 to 4 carbon atoms include an acetyloxy group, a propionyloxy group, a butyryloxy group and the like.

Specific examples of the compound (II) include compounds represented by formulas (II-1) to (II-3).

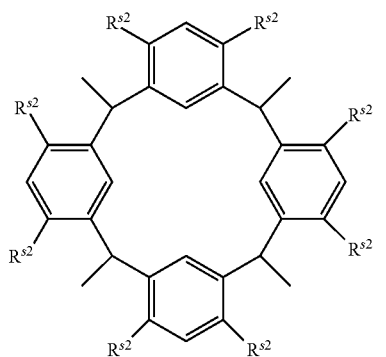

(II-1)

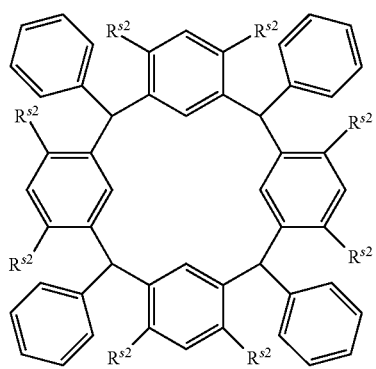

(II-2)

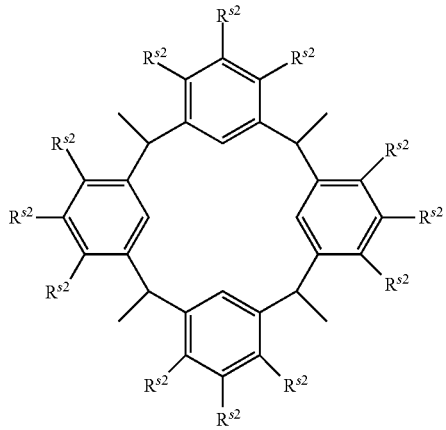

(II-3)

Here, $R^{s2}$ each independently represent the above-mentioned group represented by formula (a), group represented by formula (b), group represented by formula (c) or hydroxy group. At least one of $R^{s2}$ in each compound is a group represented by formula (a), a group represented by formula (b) or a group represented by formula (c).

Specific examples of the compound (III) include compounds represented by formulas (III-1-1) to (III-3-8).

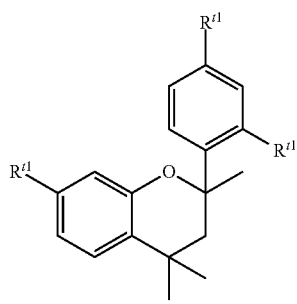

(III-1-1)

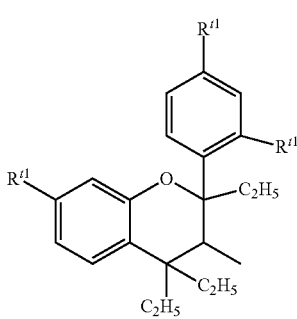

(III-1-2)

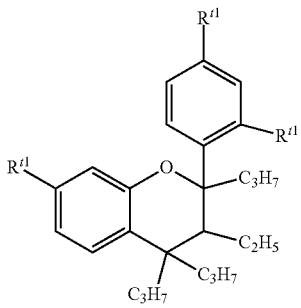

(III-1-3)

-continued
(III-1-4)
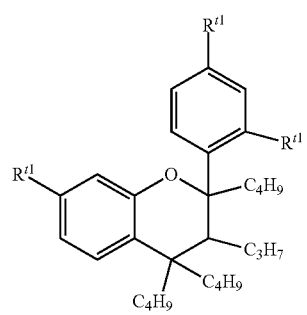
(III-1-5)
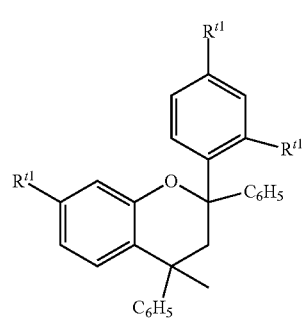
(III-1-6)
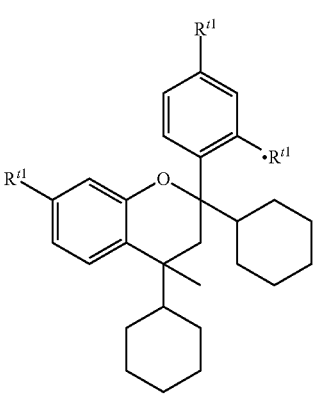
(III-1-7)
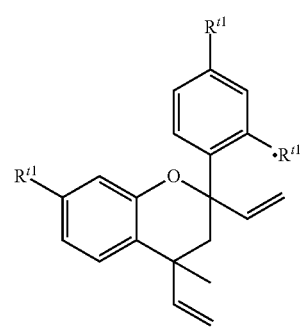
-continued
(III-1-8)
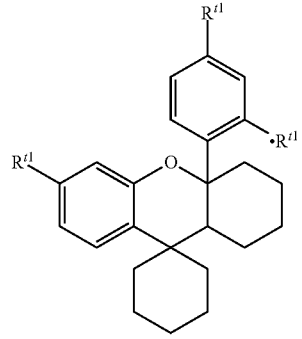
(III-1-9)
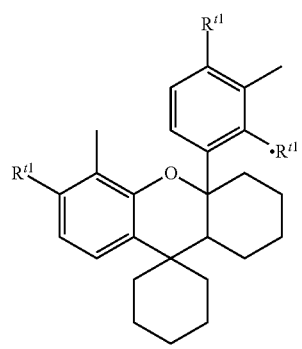
(III-1-10)
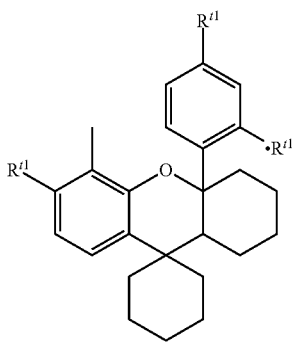
(III-2-1)
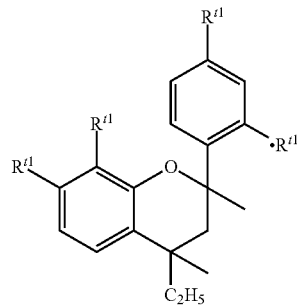
(III-3-1)
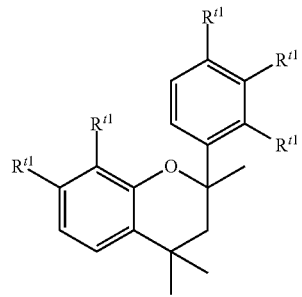

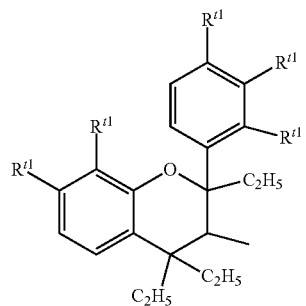
(III-3-2)

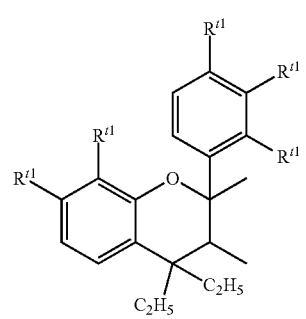
(III-3-3)

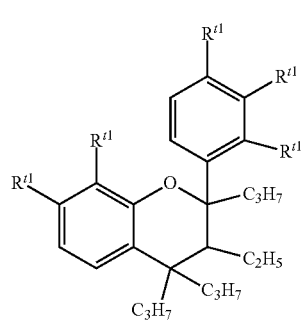
(III-3-4)

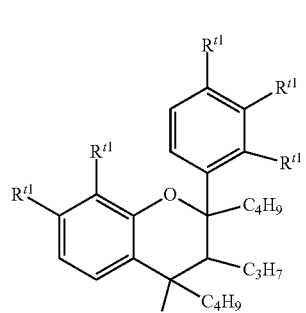
(III-3-5)

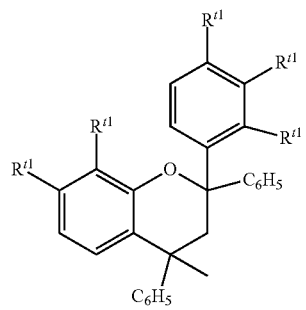
(III-3-6)

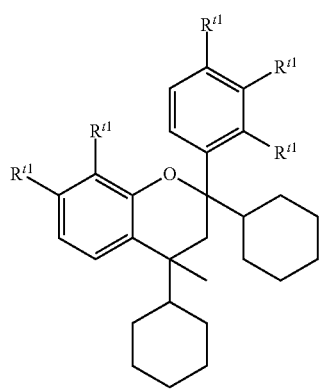
(III-3-7)

(III-3-8)

Here, $R^{t1}$ each independently represent the above-mentioned group represented by formula (a), group represented by formula (b), group represented by formula (c) or hydroxy group. At least one of $R^{t1}$ in each compound is a group represented by formula (a), a group represented by formula (b) or a group represented by formula (c).

Specific examples of the compound (IV) include compounds represented by formulas (IV-1-1) to (IV-5-2).

(IV-1-1)
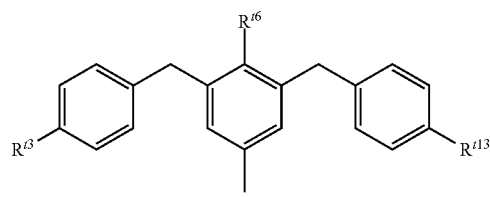
(IV-1-2)
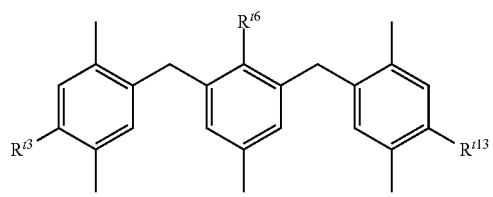
(IV-1-3)
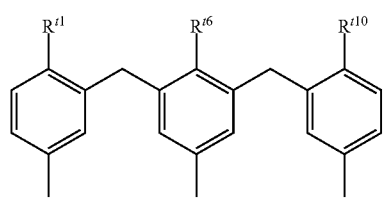
(IV-2-1)
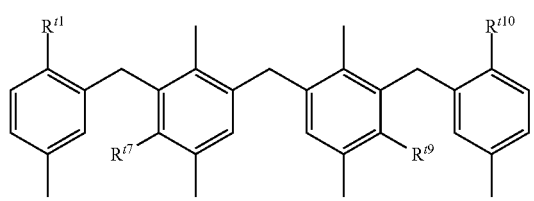
(IV-2-2)
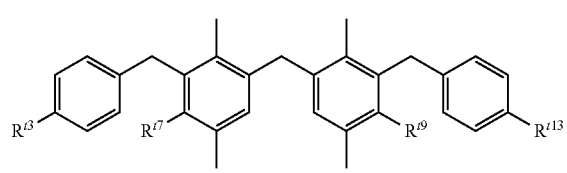
(IV-3-1)
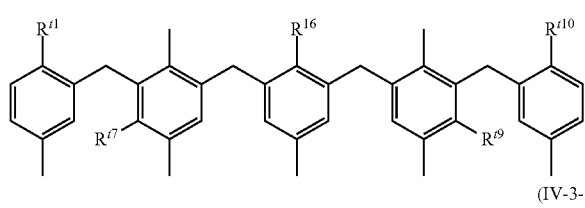
(IV-3-2)
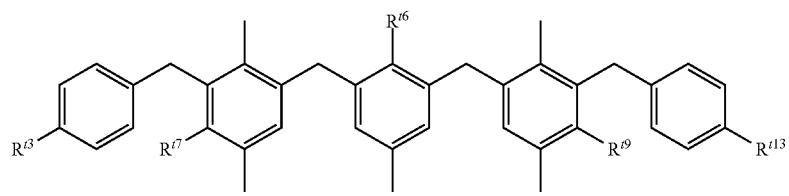
(IV-4-1)
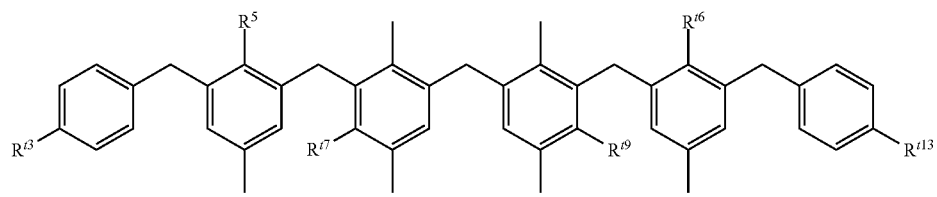
(IV-4-2)
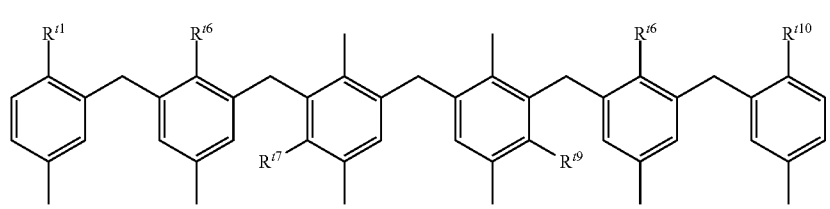
(IV-5-1)
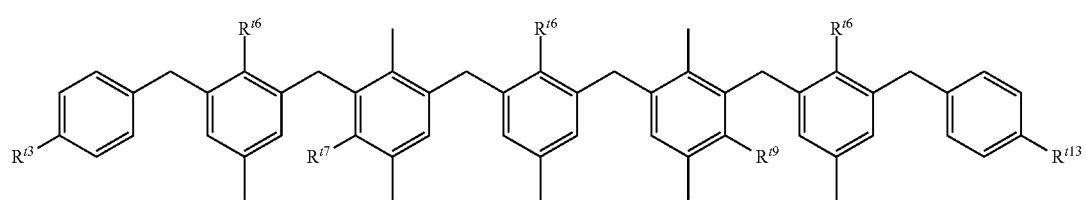
(IV-5-2)
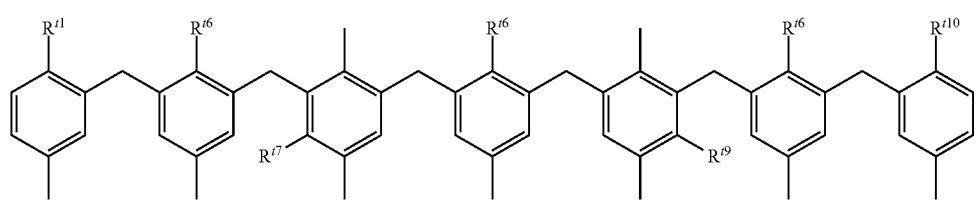

Here, $R^{t1}$, $R^{t3}$, $R^{t6}$, $R^{t7}$, $R^{t9}$, $R^{t10}$ and $R^{t13}$ each independently represent the above-mentioned group represented by formula (a), group represented by formula (b), group represented by formula (c) or hydroxy group. At least one of $R^{t1}$, $R^{t3}$, $R^{t6}$, $R^{t7}$, $R^{t9}$, $R^{t10}$ and $R^{t13}$ in each compound is a group represented by formula (a), a group represented by formula (b) or a group represented by formula (c).

Specific examples of the compound (V) include compounds represented by formulas (V-1-1) to (V-3-1).

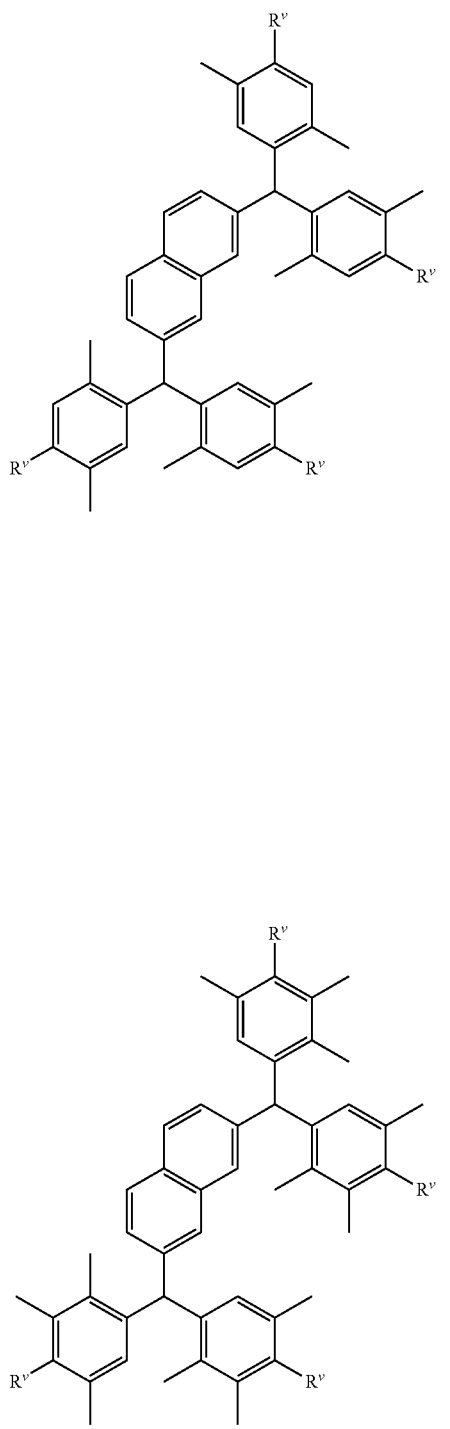

(V-1-1)

(V-1-2)

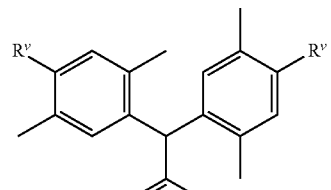

(V-2-1)

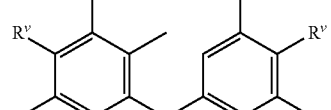

(V-2-2)

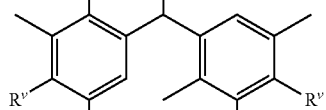

(V-3-1)

Here, $R^{v}$ each independently represent the above-mentioned group represented by formula (a), group represented by formula (b), group represented by formula (c) or hydroxy group. At least one of $R^{v}$ in each compound is a group represented by formula (a), a group represented by formula (b) or a group represented by formula (c).

The compound (I) can be produced in accordance with the descriptions of, for example, JP 2-84650 A, JP 3-185447 A, JP 3-191351 A, JP 5-323597 A, JP 8-245461 A, JP 9-110762 A and the like. The compound (I) can be produced, for example, by reacting an aromatic compound having a phenolic hydroxyl group (e.g., a compound in which all the quinone diazide sulfonyl groups in the molecule of the above-mentioned compounds (II) to (V) with hydrogen atoms, etc.) with a quinone diazide sulfonyl halide (e.g., quinone diazide sulfonyl chloride such as 1,2-naphthoquinone diazide sulfonyl chloride or 1,2-benzoquinone diazide sulfonyl chloride, or quinone diazide sulfonyl bromide such as 1,2-naphthoquinone diazide sulfonyl bromide or 1,2-benzoquinone diazide sulfonyl bromide) in the presence of weak alkali, leading to complete or partial esterification.

The aromatic compound having a phenolic hydroxyl group is easily available on the market, or can be produced by a known method.

The content of the compound (I) is preferably 0.05% by mass or more and 25% by mass or less, more preferably 0.1% by mass or more and 20% by mass or less, still more preferably 0.5% by mass or more and 15% by mass or less, and yet more preferably 1% by mass or more and 10% by mass or less, in the solid of the resist composition.

The content of the compound (I) in the resist composition can be measured, for example, by known analytical means such as liquid chromatography or gas chromatography.

The compound (I) is preferably a compound (III) and a compound (IV), and more preferably a compound (III).

<Resin (A1)>

The resin (A1) comprises a structural unit having an acid-labile group (hereinafter sometimes referred to as "structural unit (a1)").

The "acid-labile group" means a group having a leaving group (sometimes referred to as leaving group) which can be eliminated by contact with an acid. When the resin (A1) is in contact with an acid, the leaving group is eliminated from an acid-labile group to form a hydrophilic group (e.g., a hydroxy group (a phenolic hydroxyl group, etc.) or a carboxy group). The solubility in an aqueous alkali solution increases by contacting the resin (A1) with an acid. In other words, it is preferable that the resin (A1) is insoluble or slightly soluble in the aqueous alkali solution before contacting with the acid, and becomes soluble in the aqueous alkali solution after contacting with the acid.

The resin (A1) may comprise, in addition to the structural unit having an acid-labile group, a structural unit known in the art such as a structural unit having no acid-labile group (hereinafter sometimes referred to as "structural unit (a2)") as long as it has the above-mentioned properties.

Examples of the acid which eliminates a leaving group contained in the acid-labile group include carboxylic acid, sulfonic acid and the like. In the composition of the present invention, examples of the acid include carboxylic acid compound, sulfonic acid compound and the like produced by light irradiation (exposure) of the below-mentioned acid generator (B) in the photolithography step.

Examples of the acid-labile group include a group represented by formula (10), a group represented by formula (20) and the like:

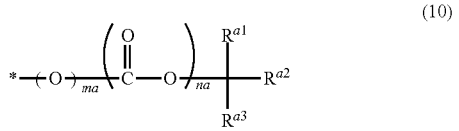

(10)

wherein, in formula (10), $R^{a1}$, $R^{a2}$ and $R^{a3}$ each independently represent an alkyl group having 1 to 8 carbon atoms or an alicyclic hydrocarbon group having 3 to 20 carbon atoms, or $R^{a1}$ and $R^{a2}$ are bonded to each other to form a ring having 3 to 20 carbon atoms together with carbon atoms to which $R^{a1}$ and $R^{a2}$ are bonded, and $R^{a3}$ represents an alkyl group having 1 to 8 carbon atoms or an alicyclic hydrocarbon group having 3 to 20 carbon atoms, ma and na each independently represent 0 or 1, at least one of ma and na represents 1, and * represents a bond:

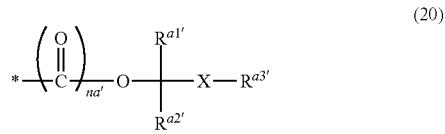

(20)

wherein, in formula (20), $R^{a1'}$ and $R^{a2'}$ each independently represent a hydrogen atom or a hydrocarbon group having 1 to 20 carbon atoms, $R^{a3'}$ represents a hydrocarbon group having 1 to 20 carbon atoms, or $R^{a1'}$ represents a hydrogen atom or a hydrocarbon group having 1 to 20 carbon atoms, and $R^{a2'}$ and $R^{a3'}$ are bonded to each other to form an heterocyclic ring having 3 to 20 carbon atoms together with carbon atoms and X to which $R^{a2'}$ and $R^{a3'}$ are bonded, a methylene group included in the hydrocarbon group having 1 to 20 carbon atoms and the heterocyclic ring having 3 to 20 carbon atoms may be replaced by an oxygen atom or a sulfur atom, X represents an oxygen atom or a sulfur atom, na' represents 0 or 1, and * represents a bond.

The alkyl group having 1 to 8 carbon atoms represented by formula (10) as for $R^{a1}$ to $R^{a3}$ may be either linear or branched, and examples thereof include a methyl group, an ethyl group, a propyl group, a butyl group, a pentyl group, a hexyl group, a heptyl group, an octyl group and the like. The alkyl group having 1 to 8 carbon atoms as for $R^{a1}$ to $R^{a3}$ preferably has 1 to 6 carbon atoms, and more preferably 1 to 4 carbon atoms.

The alicyclic hydrocarbon group having 3 to 20 carbon atoms as for $R^{a1}$ to $R^{a3}$ may be either monocyclic or polycyclic. Examples of the monocyclic alicyclic hydrocarbon group include cycloalkyl groups such as a cyclopentyl group, a cyclohexyl group, a cycloheptyl group and a cyclooctyl group. Examples of the polycyclic alicyclic hydrocarbon group include a decahydronaphthyl group, an adamantyl group, a norbornyl group, the following groups (* represents a bond) and the like.

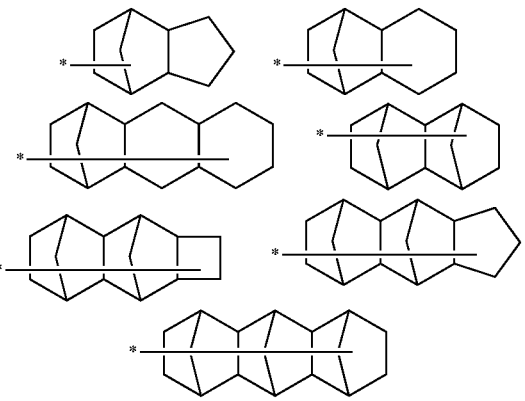

The alicyclic hydrocarbon group having 3 to 20 carbon atoms as for $R^{a1}$ to $R^{a3}$ preferably has 3 to 18 carbon atoms, more preferably 3 to 16 carbon atoms, and still more preferably 3 to 12 carbon atoms.

When $R^{a1}$ and $R^{a2}$ are bonded to each other to form a ring having 3 to 20 carbon atoms together with carbon atoms to which $R^{a1}$ and $R^{a2}$ are bonded, examples of —C($R^{a1}$)($R^{a2}$)($R^{a3}$) include the following groups. The ring having 3 to 20 carbon atoms preferably has 3 to 18 carbon atoms, more preferably 3 to 16 carbon atoms, and still more preferably 3 to 12 carbon atoms. * represents a bond to —O—.

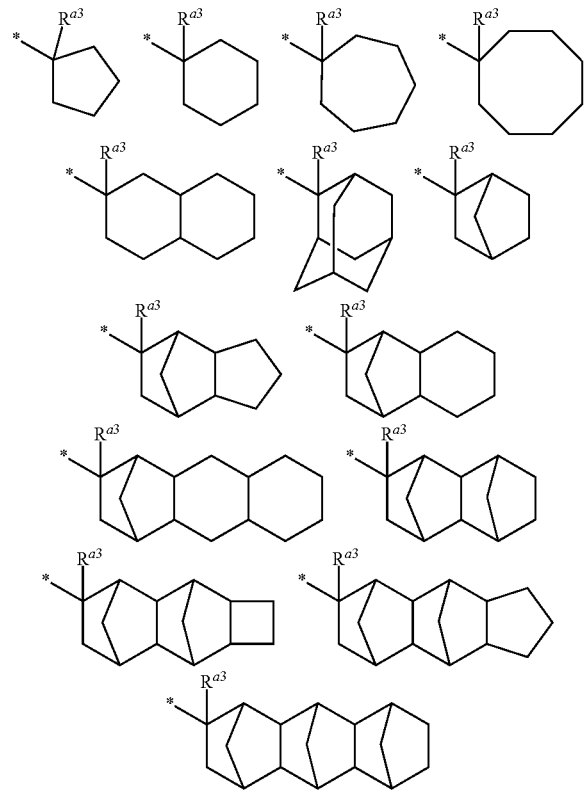

$R^{a1}$ is preferably an alkyl group having 1 to 6 carbon atoms or an alicyclic hydrocarbon group having 3 to 18 carbon atoms, or bonded with $R^{a2}$ to form a ring having 3 to 18 carbon atoms together with carbon atoms to which $R^{a1}$ and $R^{a2}$ are bonded, and $R^{a1}$ is more preferably an alkyl group having 1 to 4 carbon atoms or an alicyclic hydrocarbon group having 3 to 12 carbon atoms, or bonded with $R^{a2}$ to form a ring having 3 to 12 carbon atoms together with carbon atoms to which $R^{a1}$ and $R^{a2}$ are bonded.

$R^{a2}$ is preferably an alkyl group having 1 to 6 carbon atoms or an alicyclic hydrocarbon group having 3 to 18 carbon atoms, or bonded with $R^{a1}$ to form a ring having 3 to 18 carbon atoms together with carbon atoms to which $R^{a2}$ and $R^{a1}$ are bonded, and $R^{a2}$ is more preferably an alkyl group having 1 to 4 carbon atoms or an alicyclic hydrocarbon group having 3 to 12 carbon atoms, or bonded with $R^{a1}$ to form a ring having 3 to 12 carbon atoms together with carbon atoms to which $R^{a2}$ and $R^{a1}$ are bonded.

$R^{a3}$ is preferably an alkyl group having 1 to 6 carbon atoms or an alicyclic hydrocarbon group having 3 to 18 carbon atoms, and more preferably an alkyl group having 1 to 4 carbon atoms or an alicyclic hydrocarbon group having 3 to 12 carbon atoms.

ma is preferably 0. na is preferably 1.

Examples of the group represented by formula (10) include a group (preferably a tert-butoxycarbonyl group) in which $R^{a1}$, $R^{a2}$ and $R^{a3}$ each independently represent an alkyl group having 1 to 3 carbon atoms; a group in which $R^{a1}$ and $R^{a2}$ each independently represent an alkyl group having 1 to 3 carbon atoms, and $R^{a3}$ is a cyclopentyl group or a cyclohexyl group; a group in which $R^{a1}$ and $R^{a2}$ are bonded to each other to form a cyclopentane ring or a cyclohexane ring together with carbon atoms to which $R^{a1}$ and $R^{a2}$ are bonded, and $R^{a3}$ is an alkyl group having 1 to 3 carbon atoms; and the like.

Specific examples of the group represented by formula (10) include the following groups.

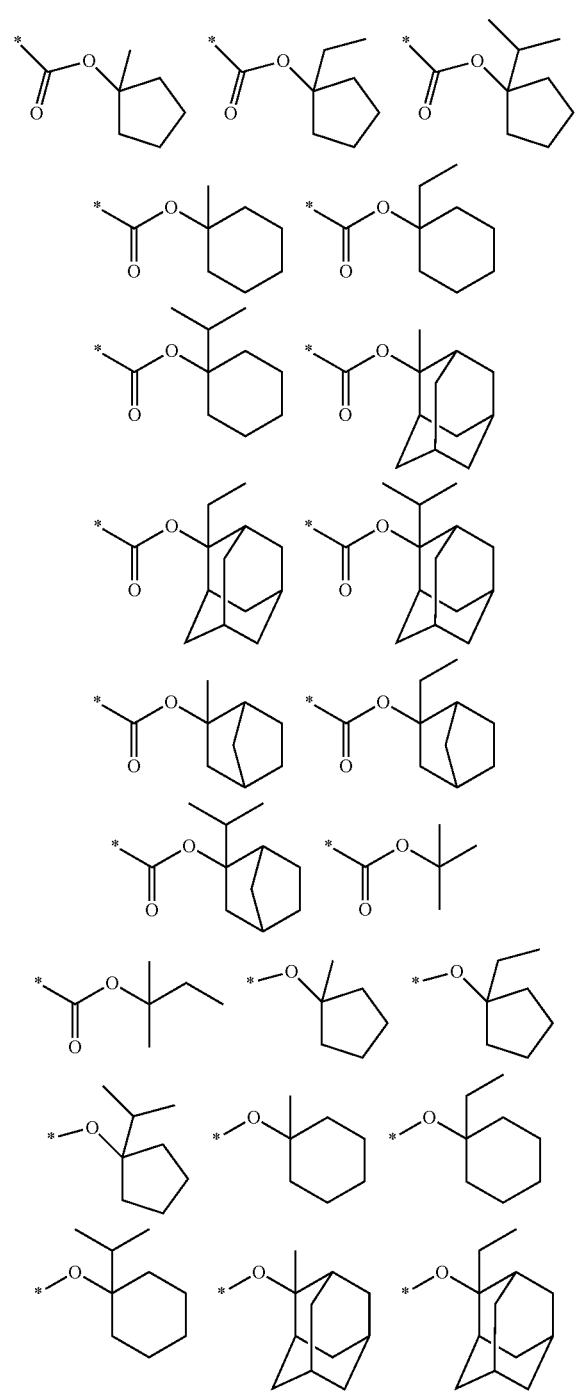

-continued

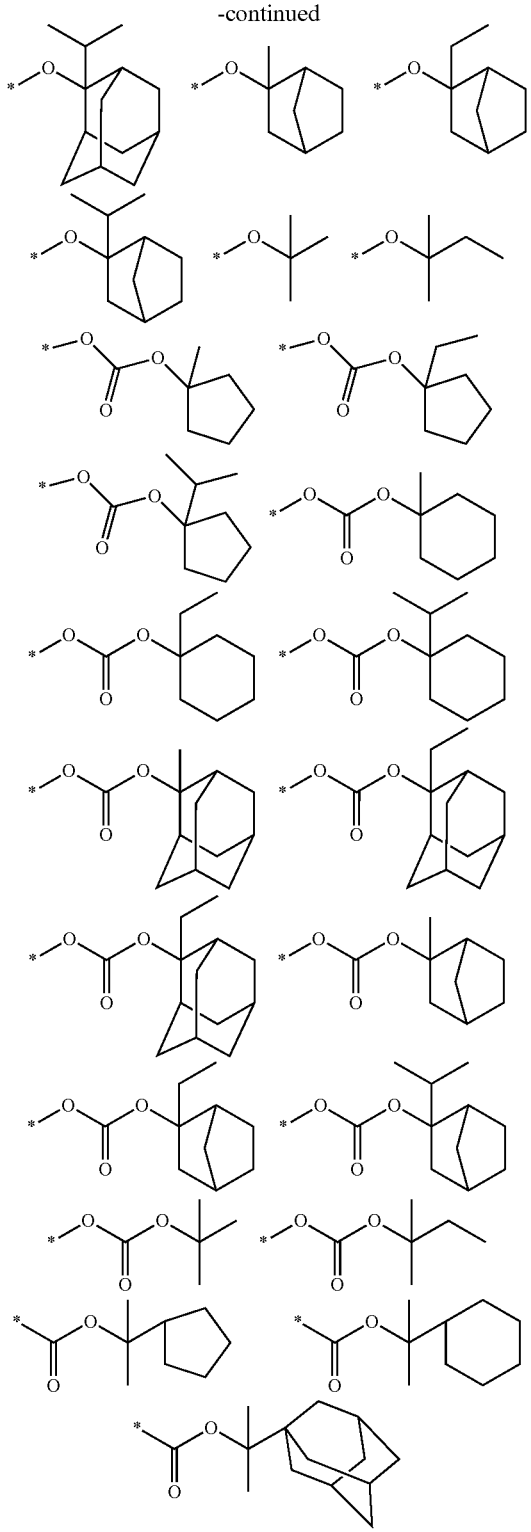

Examples of the hydrocarbon group having 1 to 20 carbon atoms as for $R^{a1'}$ to $R^{a3'}$ of the group represented by formula (20) include a chain hydrocarbon group having 1 to 20 carbon atoms (an alkyl group, an alkenyl group and an alkynyl group, etc.), an alicyclic hydrocarbon group having 3 to 20 carbon atoms and an aromatic hydrocarbon group having 6 to 20 carbon atoms, and a group having 4 to 20 carbon atoms obtained by combining these groups.

Examples of the alkyl group having 1 to 20 carbon atoms include a methyl group, an ethyl group, a propyl group, a butyl group, a pentyl group, a hexyl group, a heptyl group, an octyl group, a decyl group, a dodecyl group and the like.

Examples of the alkenyl group having 2 to 20 carbon atoms include an ethenyl group, a propenyl group, an isopropenyl group, a butenyl group, an isobutenyl group, a tert-butenyl group, a pentenyl group, a hexenyl group, a heptenyl group, an octenyl group, an isooctenyl group, a nonenyl group and the like.

Examples of the alkynyl group having 2 to 20 carbon atoms include an ethynyl group, a propynyl group, an isopropynyl group, a butynyl group, an isobutynyl group, a tert-butynyl group, a pentynyl group, a hexynyl group, an octynyl group, a nonynyl group and the like.

The chain hydrocarbon group having 1 to 20 carbon atoms preferably has 1 to 18 carbon atoms, more preferably 1 to 16 carbon atoms, still more preferably 1 to 12 carbon atoms, yet more preferably 1 to 8 carbon atoms, and further preferably 1 to 6 carbon atoms.

Examples of the alicyclic hydrocarbon group having 3 to 20 carbon atoms include monocyclic alicyclic hydrocarbon groups, for example, cycloalkyl groups such as a cyclopentyl group, a cyclohexyl group, a cycloheptyl group and a cyclooctyl group; polycyclic alicyclic hydrocarbon groups such as a decahydronaphthyl group, an adamantyl group and a norbornyl group; and the like. The alicyclic hydrocarbon group having 3 to 20 carbon atoms preferably has 3 to 18 carbon atoms, more preferably 3 to 16 carbon atoms, and still more preferably 3 to 12 carbon atoms.

Examples of the aromatic hydrocarbon group having 6 to 20 carbon atoms include aryl groups such as a phenyl group, a naphthyl group, an anthryl group, a biphenyl group and a phenanthryl group. The aromatic hydrocarbon group may further have a substituent, and examples of the substituent include an aryloxy group having 6 to 10 carbon atoms. The aromatic hydrocarbon group having 6 to 20 carbon atoms preferably has 6 to 18 carbon atoms, more preferably 6 to 14 carbon atoms, and still more preferably 6 to 10 carbon atoms.

Examples of the group obtained by combining an alkyl group with an alicyclic hydrocarbon group (the group having 4 to 20 carbon atoms) among the group having 4 to 20 carbon atoms obtained by combining the above groups include a methylcyclohexyl group, a dimethylcyclohexyl group, a methylnorbornyl group, an isobornyl group, a 2-alkyladamantan-2-yl group, a 1-(adamantan-1-yl)alkan-1-yl group and the like.

The group obtained by combining an alkyl group with an aromatic hydrocarbon group (a group having 7 to 20 carbon atoms) is, for example, an aralkyl group and an aromatic hydrocarbon group having an alkyl group, and specific examples thereof include a benzyl group, a phenethyl group, a phenylpropyl group, a trityl group, a naphthylmethyl group, a naphthylethyl group, a p-methylphenyl group, a p-tert-butylphenyl group, a tolyl group, a xylyl group, a cumenyl group, a mesityl group, a 2,6-diethylphenyl group, a 2-methyl-6-ethylphenyl group and the like.

The group obtained by combining an alicyclic hydrocarbon group with an aromatic hydrocarbon group (a group having 9 to 20 carbon atoms) is, for example, an aromatic hydrocarbon group having an alicyclic hydrocarbon group and an alicyclic hydrocarbon group having an aromatic hydrocarbon group, and specific examples thereof include a p-cyclohexylphenyl group, a p-adamantylphenyl group, a phenylcyclohexyl group and the like.

When $R^{a2'}$ and $R^{a3'}$ are bonded to each other to form an heterocyclic ring having 3 to 20 carbon atoms together with carbon atoms and X to which $R^{a2'}$ and $R^{a3'}$ are bonded, examples of $-C(R^{a1'})(R^{a2'})-X-R^{a3'}$ include the following groups. The heterocyclic ring having 3 to 20 carbon atoms preferably has 3 to 18 carbon atoms, more preferably 3 to 16 carbon atoms, and still more preferably 3 to 12 carbon atoms. * represents a bond.

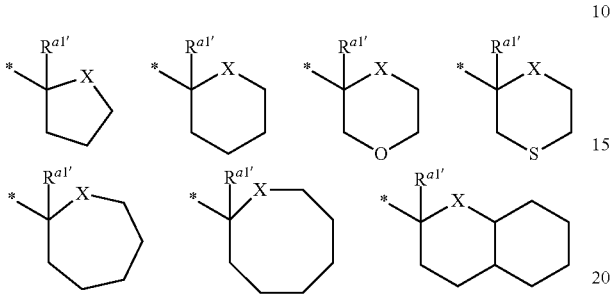

$R^{a1'}$ is preferably a hydrogen atom or a hydrocarbon group having 1 to 18 carbon atoms, more preferably a hydrogen atom or a hydrocarbon group having 1 to 12 carbon atoms, and still more preferably a hydrogen atom.

$R^{a2'}$ is preferably a hydrogen atom or a hydrocarbon group having 1 to 18 carbon atoms, or bonded with $R^{a3'}$ to form an heterocyclic ring having 3 to 18 carbon atoms together with carbon atoms and X to which $R^{a2'}$ and $R^{a3'}$ are bonded, $R^{a2'}$ is more preferably a hydrogen atom or a hydrocarbon group having 1 to 12 carbon atoms, or bonded with $R^{a3'}$ to form an heterocyclic ring having 3 to 12 carbon atoms together with carbon atoms and X to which $R^{a2'}$ and $R^{a3'}$ are bonded, $R^{a2'}$ is still more preferably a hydrocarbon group having 1 to 12 carbon atoms, and $R^{a2'}$ is yet more preferably a methyl group or an ethyl group.

$R^{a3'}$ is preferably a hydrocarbon group having 1 to 18 carbon atoms or bonded with $R^{a2'}$ to form an heterocyclic ring having 3 to 18 carbon atoms together with carbon atoms and X to which $R^{a3'}$ and $R^{a2'}$ are bonded, and $R^{a3'}$ is more preferably a hydrocarbon group having 1 to 12 carbon atoms or bonded with $R^{a2'}$ to form an heterocyclic ring having 3 to 12 carbon atoms together with carbon atoms and X to which $R^{a3'}$ and $R^{a2'}$ are bonded.

Examples of the hydrocarbon group include an alkyl group having 1 to 18 carbon atoms, an alicyclic hydrocarbon group having 3 to 18 carbon atoms, an aromatic hydrocarbon group having 6 to 18 carbon atoms, or a group having 4 to 18 carbon atoms obtained by combining these groups. These groups can be optionally selected from those listed above.

X is preferably an oxygen atom.

na' is preferably 0.

Specific examples of the group represented by formula (20) include the following groups.

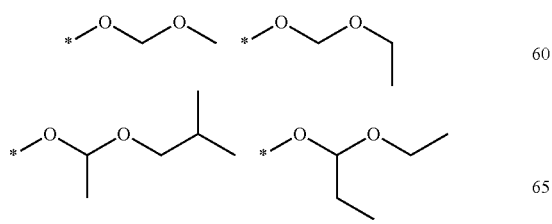

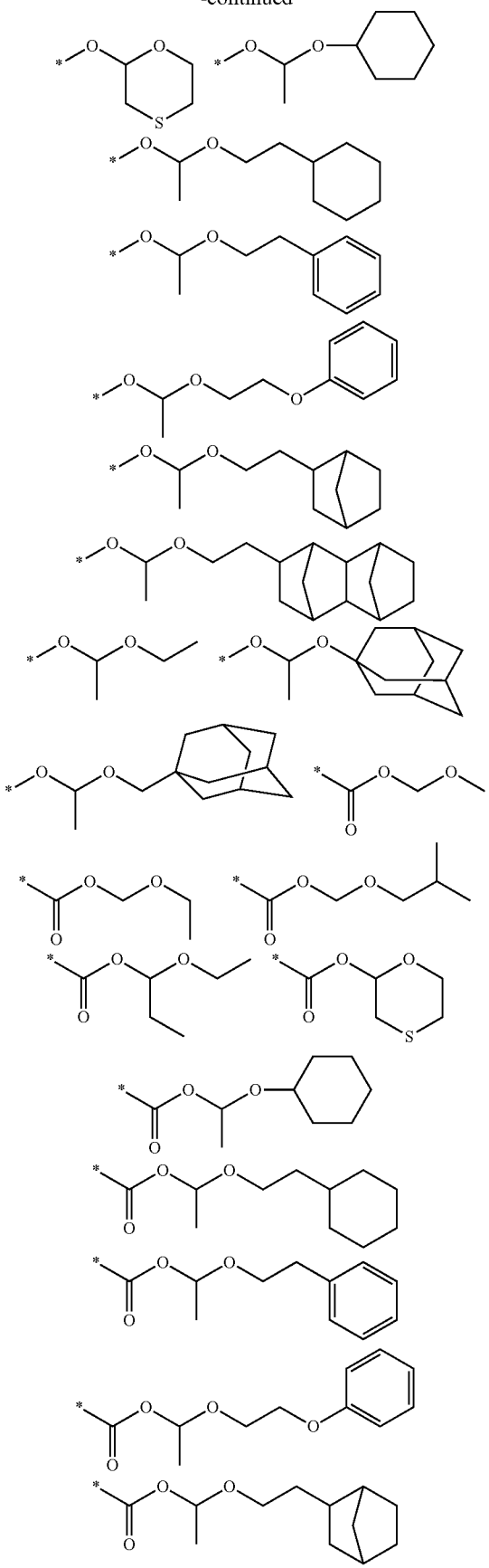

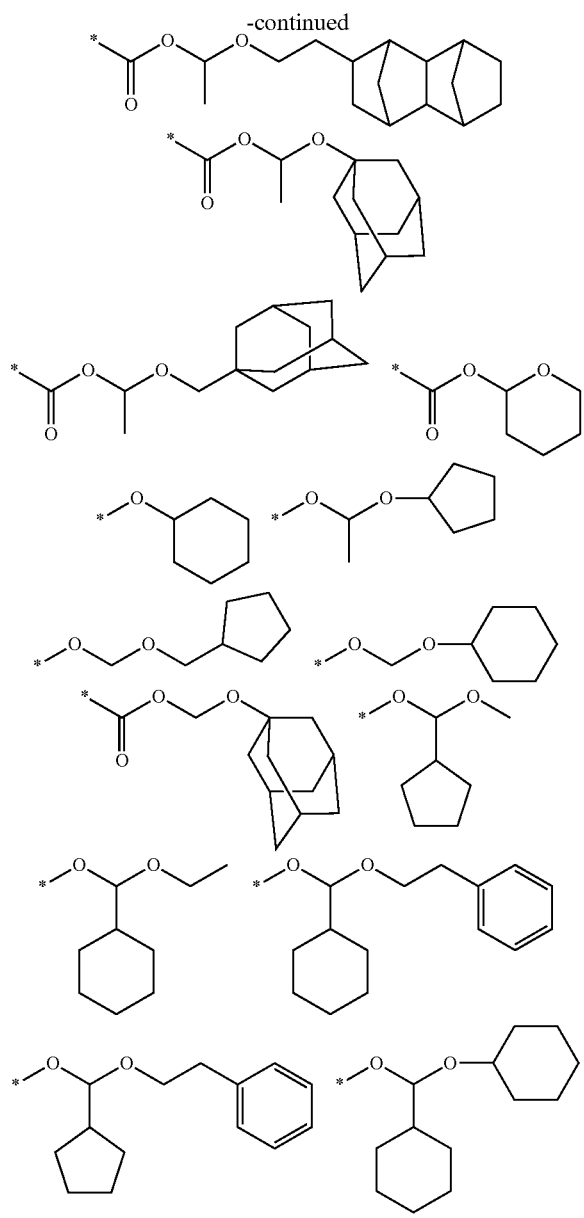

Specific examples of the group represented by formula (10) include a group represented by formula (1) and a group represented by formula (1'):

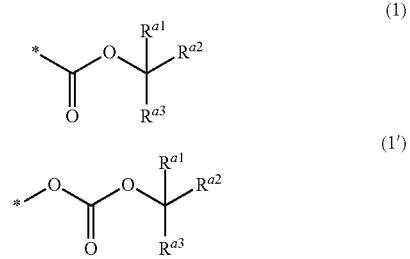

wherein, in formula (1) and formula (1'), $R^{a1}$, $R^{a2}$ and $R^{a3}$ each independently represent an alkyl group having 1 to 8 carbon atoms or an alicyclic hydrocarbon group having 3 to 20 carbon atoms, or $R^{a1}$ and $R^{a2}$ are bonded to each other to form a ring having 3 to 20 carbon atoms together with carbon atoms to which $R^{a1}$ and $R^{a2}$ are bonded, and $R^{a3}$ represents an alkyl group having 1 to 8 carbon atoms or an alicyclic hydrocarbon group having 3 to 20 carbon atoms, and * represents a bond.

Specific examples of the group represented by formula (20) include a group represented by formula (2) and a group represented by formula (2'):

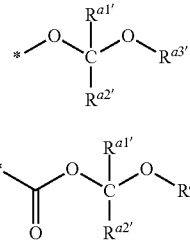

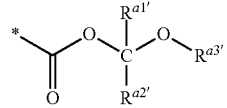

Wherein, in formula (2) and formula (2'), $R^{a1'}$ and $R^{a2'}$ each independently represent a hydrogen atom or a hydrocarbon group having 1 to 20 carbon atoms, $R^{a3'}$ represents a hydrocarbon group having 1 to 20 carbon atoms, or $R^{a1'}$ represents a hydrogen atom or a hydrocarbon group having 1 to 20 carbon atoms, and $R^{a2'}$ and $R^{a3'}$ are bonded to each other to form an heterocyclic ring having 3 to 20 carbon atoms together with carbon atoms and oxygen atoms to which $R^{a2'}$ and $R^{a3'}$ are bonded, a methylene group included in the hydrocarbon group having 1 to 20 carbon atoms and the heterocyclic ring having 3 to 20 carbon atoms may be replaced by an oxygen atom or a sulfur atom, and * represents a bond.

<Structural Unit Having Acid-Labile Group (a1)>

The resin (A1) including a structural unit having an acid-labile group (a1) can be produced, for example, by polymerizing a monomer component including an ethylenically unsaturated compound from which a structural unit (a1) is derived. The acid-labile group included in the structural unit (a1) is preferably the group represented by formula (10) and/or the group represented by formula (20).

The resin (A1) may include the structural unit (a1) alone, or a plurality thereof.

The structural unit (a1) is preferably a structural unit represented by formula (a1-1) (hereinafter sometimes referred to as "structural unit (a1-1)") and a structural unit represented by formula (a1-2) (hereinafter sometimes referred to as "structural unit (a1-2)"):

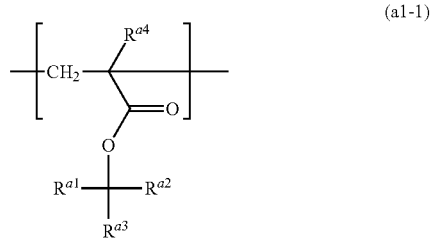

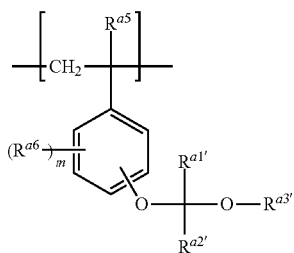

(a1-2)

wherein, in formula (a1-1) and formula (a1-2), $R^{a1}$, $R^{a2}$ and $R^{a3}$ each independently represent an alkyl group having 1 to 8 carbon atoms or an alicyclic hydrocarbon group having 3 to 20 carbon atoms, or $R^{a1}$ and $R^{a2}$ are bonded to each other to form a ring having 3 to 20 carbon atoms together with carbon atoms to which $R^{a1}$ and $R^{a2}$ are bonded, and $R^{a3}$ represents an alkyl group having 1 to 8 carbon atoms or an alicyclic hydrocarbon group having 3 to 20 carbon atoms, $R^{a1'}$ and $R^{a2'}$ each independently represent a hydrogen atom or a hydrocarbon group having 1 to 20 carbon atoms, $R^{a3'}$ represents a hydrocarbon group having 1 to 20 carbon atoms, or $R^{a1'}$ represents a hydrogen atom or a hydrocarbon group having 1 to 20 carbon atoms, and $R^{a2'}$ and $R^{a3'}$ are bonded to each other to form an heterocyclic ring having 3 to 20 carbon atoms together with carbon atoms and oxygen atoms to which $R^{a2'}$ and $R^{a3'}$ are bonded, and a methylene group included in the hydrocarbon group having 1 to 20 carbon atoms and the heterocyclic ring having 3 to 20 carbon atoms may be replaced by an oxygen atom or a sulfur atom, $R^{a4}$ and $R^{a5}$ each independently represent a hydrogen atom or a methyl group, $R^{a6}$ represents an alkyl group having 1 to 6 carbon atoms or an alkoxy group having 1 to 6 carbon atoms, and m represents an integer of 0 to 4, and when m is 2 or more, a plurality of $R^{a6}$ may be the same or different from each other.

In formula (a1-1), $R^{a4}$ is preferably a methyl group. $R^{a1}$ is preferably an alkyl group having 1 to 6 carbon atoms or an alicyclic hydrocarbon group having 3 to 18 carbon atoms, or bonded with $R^{a2}$ to form a ring having 3 to 18 carbon atoms together with carbon atoms to which $R^{a1}$ and $R^{a2}$ are bonded, and $R^{a1}$ is more preferably an alkyl group having 1 to 4 carbon atoms or an alicyclic hydrocarbon group having 3 to 12 carbon atoms, or bonded with $R^{a2}$ to form a ring having 3 to 12 carbon atoms together with carbon atoms to which $R^{a1}$ and $R^{a2}$ are bonded.

$R^{a2}$ is preferably an alkyl group having 1 to 6 carbon atoms or an alicyclic hydrocarbon group having 3 to 18 carbon atoms, or bonded with $R^{a1}$ to form a ring having 3 to 18 carbon atoms together with carbon atoms to which $R^{a2}$ and $R^{a1}$ are bonded, and $R^{a2}$ is more preferably an alkyl group having 1 to 4 carbon atoms or an alicyclic hydrocarbon group having 3 to 12 carbon atoms, or bonded with $R^{a1}$ to form a ring having 3 to 12 carbon atoms together with carbon atoms to which $R^{a2}$ and $R^{a1}$ are bonded.

$R^{a3}$ is preferably an alkyl group having 1 to 6 carbon atoms or an alicyclic hydrocarbon group having 3 to 18 carbon atoms, and more preferably an alkyl group having 1 to 4 carbon atoms or an alicyclic hydrocarbon group having 3 to 12 carbon atoms.

In formula (a1-2), $R^{a5}$ is preferably a hydrogen atom. $R^{a1'}$ is preferably a hydrogen atom or a hydrocarbon group having 1 to 18 carbon atoms, more preferably a hydrogen atom or a hydrocarbon group having 1 to 12 carbon atoms, and still more preferably a hydrogen atom.

$R^{a2'}$ is preferably a hydrogen atom or a hydrocarbon group having 1 to 18 carbon atoms, or bonded with $R^{a3'}$ to form an heterocyclic ring having 3 to 18 carbon atoms together with carbon atoms and oxygen atoms to which $R^{a2'}$ and $R^{a3'}$ are bonded, $R^{a2'}$ is more preferably a hydrogen atom or a hydrocarbon group having 1 to 12 carbon atoms, or bonded with $R^{a3'}$ to form an heterocyclic ring having 3 to 12 carbon atoms together with carbon atoms and oxygen atoms to which $R^{a2'}$ and $R^{a3'}$ are bonded, and $R^{a2'}$ is still more preferably a hydrocarbon group having 1 to 12 carbon atoms, and further preferably a methyl group or an ethyl group.

$R^{a3'}$ is preferably a hydrocarbon group having 1 to 18 carbon atoms or bonded with $R^{a2'}$ to form an heterocyclic ring having 3 to 18 carbon atoms together with carbon atoms and oxygen atoms to which $R^{a3'}$ and $R^{a2'}$ are bonded, and $R^{a3'}$ is more preferably a hydrocarbon group having 1 to 12 carbon atoms or bonded with $R^{a2'}$ to form an heterocyclic ring having 3 to 12 carbon atoms together with carbon atoms and oxygen atoms to which $R^{a3'}$ and $R^{a2'}$ are bonded.

Examples of the hydrocarbon group include an alkyl group having 1 to 18 carbon atoms, an alicyclic hydrocarbon group having 3 to 18 carbon atoms, an aromatic hydrocarbon group having 6 to 18 carbon atoms, or a group having 4 to 18 carbon atoms obtained by combining these groups. These groups can be optionally selected from those listed above. The hydrocarbon group is preferably an alkyl group having 1 to 18 carbon atoms, an alicyclic hydrocarbon group having 3 to 18 carbon atoms or an aralkyl group having 7 to 18 carbon atoms. The alkyl group and the alicyclic hydrocarbon group are preferably unsubstituted. When the aromatic hydrocarbon group has a substituent, the substituent is preferably an aryloxy group having 6 to 10 carbon atoms.

Examples of the alkyl group having 1 to 6 carbon atoms as for $R^{a6}$ include a methyl group, an ethyl group, a propyl group, a butyl group, a pentyl group, a hexyl group and the like. The alkyl group having 1 to 6 carbon atoms is preferably an alkyl group having 1 to 4 carbon atoms, and more preferably an alkyl group having 1 to 3 carbon atoms.

Examples of the alkoxy group having 1 to 6 carbon atoms as for $R^{a6}$ include a methoxy group, an ethoxy group, a propoxy group, a butoxy group, a pentyloxy group, a hexyloxy group and the like. The alkoxy group having 1 to 6 carbon atoms is preferably an alkoxy group having 1 to 4 carbon atoms, and more preferably an alkoxy group having 1 to 3 carbon atoms.

$R^{a6}$ is preferably an alkyl group having 1 to 4 carbon atoms or an alkoxy group having 1 to 4 carbon atoms, more preferably an alkyl group having 1 to 3 carbon atoms or an alkoxy group having 1 to 3 carbon atoms, still more preferably a methyl group, an ethyl group, a methoxy group or an ethoxy group, and yet more preferably a methyl group or a methoxy group.

m is preferably 0 to 2, more preferably 0 or 1, and still more preferably 0.

In formula (a1-2), the group represented by —O—C($R^{a1'}$)($R^{a2'}$)—O—$R^{a3'}$ is preferably bonded to the 3-position or the 4-position of the benzene ring (m-position or p-position with respect to the main chain bonded to the benzene ring), and more preferably the 4-position of the benzene ring (p-position).

Examples of the structural unit (a1-1) include a structural unit represented by any one of formula (a1-1-1) to
(a1-1-1)
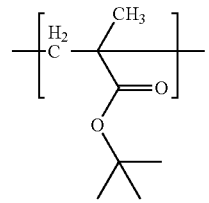
(a1-1-2)
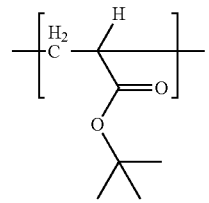
(a1-1-3)
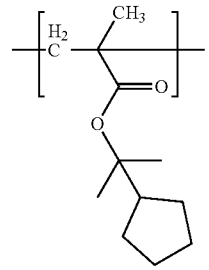
(a1-1-4)
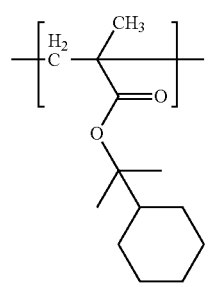
(a1-1-5)
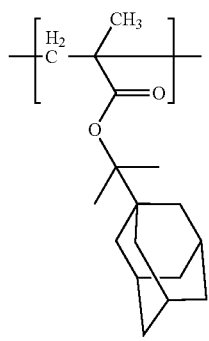
(a1-1-6)
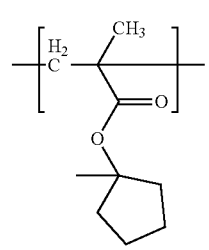
-continued
(a1-1-7)
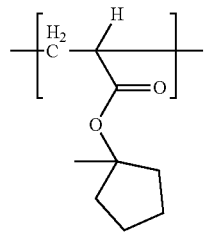
(a1-1-8)
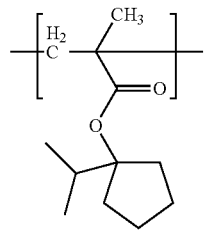
(a1-1-9)
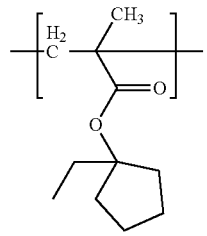
(a1-1-10)
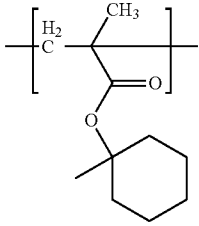
(a1-1-11)
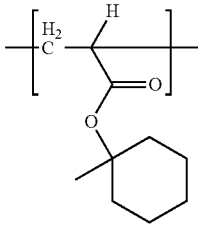
(a1-1-12)
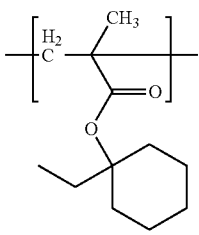

(a1-1-13) 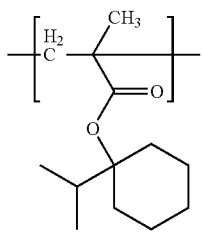
(a1-1-14) 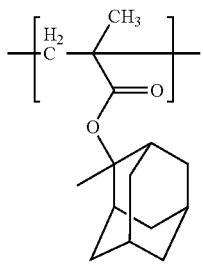
(a1-1-15) 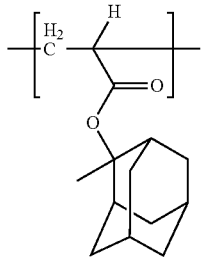
(a1-1-16) 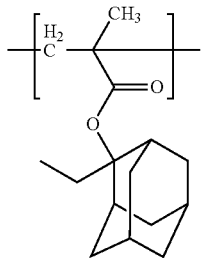
(a1-1-17) 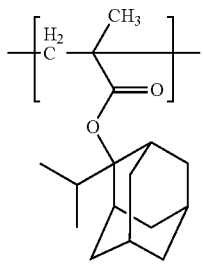
Examples of the structural unit (a1-2) include a structural unit represented by any one of formula (a1-2-1) to formula (a1-2-14).
(a1-2-1) 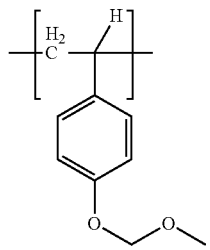
(a1-2-2) 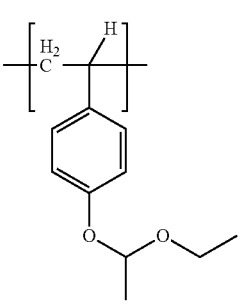
(a1-2-3) 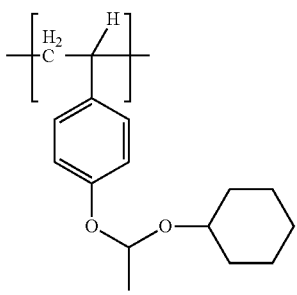
(a1-2-4) 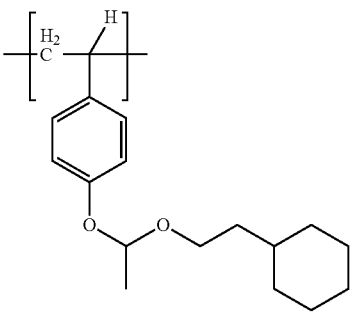
(a1-2-5) 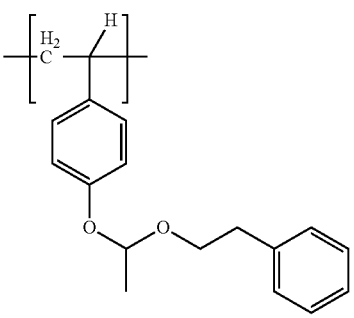

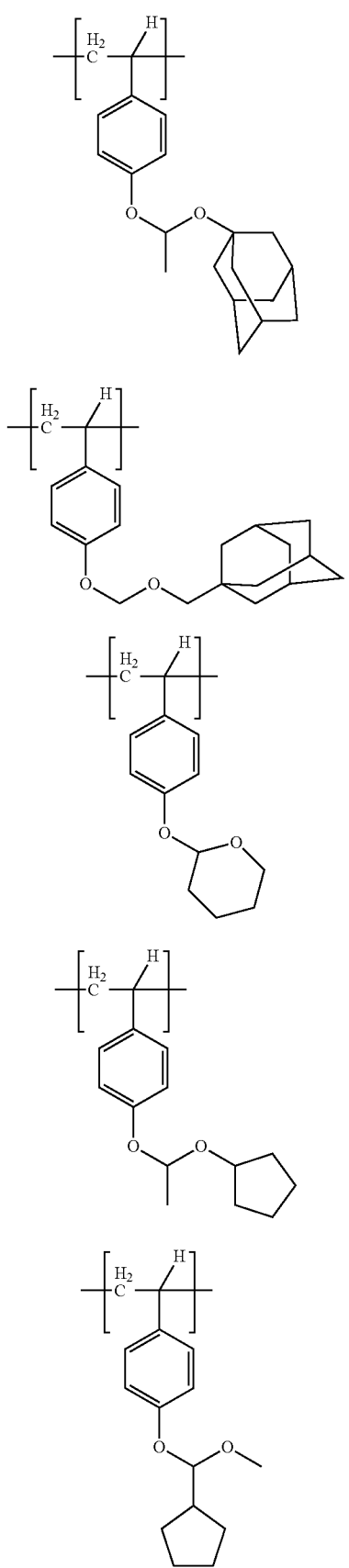
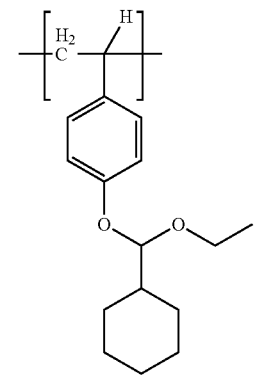
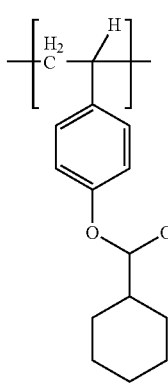
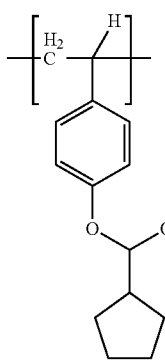
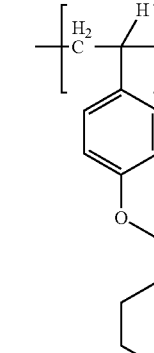
In the above-mentioned structural unit, it is also possible to exemplify, as specific examples of the structural unit (a1-2), a structural unit in which a hydrogen atom corresponding to $R^{a5}$ is substituted with a methyl group.
The structural unit (a1-2) is preferably a structural unit represented by formula (a1-2-2), formula (a1-2-3), formula (a1-2-4), formula (a1-2-9) or formula (a1-2-14), and more preferably a structural unit represented by formula (a1-2-2), formula (a1-2-3), formula (a1-2-4) or formula (a1-2-9).

The resin comprising a structural unit having an acid-labile group (A1) is preferably a resin comprising a structural unit (a1-2).

When the resin (A1) comprises a structural unit (a1-1) and/or a structural unit (a1-2), the total content of these structural unit is preferably 3 to 80 mol %, more preferably 5 to 60 mol %, still more preferably 10 to 55 mol %, yet more preferably 15 to 50 mol %, and further preferably 20 to 45 mol %, based on all structural units of the resin (A1).

<Structural Unit Having No Acid-Labile Group (a2)>

The resin (A1) may comprise a structural unit having an acid-labile group (a1) and, if necessary, a structural unit having no acid-labile group (a2). The resin (A1) comprising a structural unit (a1) and a structural unit (a2) can be produced, for example, by polymerizing a monomer component including an ethylenically unsaturated compound from which the structural unit (a1) is derived with an ethylenically unsaturated compound from which the structural unit (a2) is derived. The acid-labile group included in the structural unit (a1) is preferably the group represented by formula (10) and/or the group represented by formula (20).

The resin (A1) may comprise the structural unit having no acid-labile group (a2) alone, or a plurality thereof.

Examples of the structural unit (a2) include a structural unit represented by any one of formula (a2-1) to formula (a2-3) (hereinafter sometimes referred to as "structural unit (a2-1)" according to the number of formula):

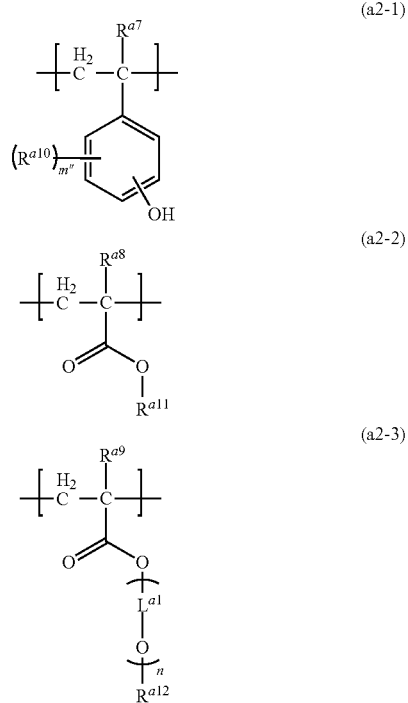

wherein, in formula (a2-1), formula (a2-2) and formula (a2-3), $R^{a7}$, $R^{a8}$ and $R^{a9}$ each independently represent a hydrogen atom or a methyl group, $R^{a10}$ represents an alkyl group having 1 to 6 carbon atoms or an alkoxy group having 1 to 6 carbon atoms, m' represents an integer of 0 to 4, and when m' is 2 or more, a plurality of $R^{a10}$ may be the same or different from each other, $R^{a11}$ represents a hydrogen atom or a hydrocarbon group having 1 to 12 carbon atoms, excluding a group in which a carbon atom bonded to an oxygen atom is a tertiary carbon atom, $R^{a12}$ represents an alkyl group having 1 to 6 carbon atoms, excluding a group in which a carbon atom bonded to an oxygen atom is a tertiary carbon atom, $L^{a1}$ represents an alkanediyl group having 2 to 6 carbon atoms, excluding a group in which a carbon atom bonded to an oxygen atom is a tertiary carbon atom, and n represents an integer of 1 to 30, and when n is 2 or more, a plurality of $L^{a1}$ may be the same or different from each other.

Examples of the alkyl group having 1 to 6 carbon atoms represented by $R^{a10}$ include a methyl group, an ethyl group, a propyl group, a butyl group, a pentyl group, a hexyl group and the like. The alkyl group having 1 to 6 carbon atoms preferably has 1 to 4 carbon atoms, and more preferably 1 to 3 carbon atoms.

Examples of the alkoxy group having 1 to 6 carbon atoms represented by $R^{a10}$ include a methoxy group, an ethoxy group, a propoxy group, a butoxy group, a pentyloxy group, a hexyloxy group and the like. The alkoxy group having 1 to 6 carbon atoms preferably has 1 to 4 carbon atoms, and more preferably 1 to 3 carbon atoms.

Examples of the hydrocarbon group having 1 to 12 carbon atoms represented by $R^{a11}$ include a chain hydrocarbon group having 1 to 12 carbon atoms (an alkyl group, an alkenyl group and an alkynyl group), an alicyclic hydrocarbon group having 3 to 12 carbon atoms, an aromatic hydrocarbon group having 6 to 12 carbon atoms, and a group having 4 to 12 carbon atoms formed by combining these groups.

Examples of the alkyl group having 1 to 12 carbon atoms include a methyl group, an ethyl group, an n-propyl group, an isopropyl group, an n-butyl group, a sec-butyl group, an isobutyl group, an n-pentyl group, an n-hexyl group, an n-heptyl group, an n-octyl group, an n-nonyl group, an n-decyl group and the like.

Examples of the alkenyl group having 2 to 12 carbon atoms include an ethenyl group, a propenyl group, an isopropenyl group, a butenyl group, an isobutenyl group, a tert-butenyl group, a pentenyl group, a hexenyl group, a heptenyl group, an octenyl group, an isooctenyl group, a nonenyl group and the like.

Examples of the alkynyl group having 2 to 12 carbon atoms include an ethynyl group, a propynyl group, an isopropynyl group, a butynyl group, an isobutynyl group, a tert-butynyl group, a pentynyl group, a hexynyl group, an octynyl group, a nonynyl group and the like.

The chain hydrocarbon group having 1 to 12 carbon atoms preferably has 1 to 10 carbon atoms, more preferably 1 to 8 carbon atoms, and still more preferably 1 to 6 carbon atoms.

The alicyclic hydrocarbon group having 3 to 12 carbon atoms may be either monocyclic or polycyclic. Examples of the monocyclic alicyclic hydrocarbon group include cycloalkyl groups such as a cyclopentyl group, a cyclohexyl group, a cycloheptyl group and a cyclooctyl group. Examples of the polycyclic alicyclic hydrocarbon group include a decahydronaphthyl group, an adamantyl group, a norbornyl group, and the following groups (* represents a bond).

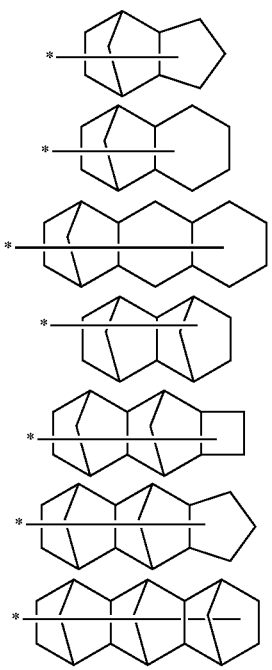

The alicyclic hydrocarbon group having 3 to 12 carbon atoms preferably has 3 to 10 carbon atoms, and more preferably 3 to 8 carbon atoms.

Examples of the aromatic hydrocarbon group having 6 to 12 carbon atoms include a phenyl group, a naphthyl group and the like. The aromatic hydrocarbon group having 6 to 12 carbon atoms preferably has 6 to 10 carbon atoms.

Regarding the group having 4 to 12 carbon atoms formed by combining the above groups, examples of the group obtained by combining an alkyl group with an alicyclic hydrocarbon group (a group having 4 to 12 carbon atoms) include a methylcyclohexyl group, a dimethylcyclohexyl group, a methylnorbornyl group, a cyclohexylmethyl group, an adamantylmethyl group, a norbornylethyl group and the like.

The group obtained by combining an alkyl group with an aromatic hydrocarbon group (a group having 7 to 12 carbon atoms) is, for example, an aralkyl group and an aromatic hydrocarbon group having an alkyl group, and specific examples thereof include a benzyl group, a phenethyl group, a phenylpropyl group, a trityl group, a naphthylmethyl group, a naphthylethyl group, a p-methylphenyl group, a p-tert-butylphenyl group, a tolyl group, a xylyl group, a cumenyl group, a mesityl group, a 2,6-diethylphenyl group, a 2-methyl-6-ethylphenyl group and the like.

The group obtained by combining an alicyclic hydrocarbon group with an aromatic hydrocarbon group (a group having 9 to 12 carbon atoms) is, for example, an aromatic hydrocarbon group having an alicyclic hydrocarbon group and an alicyclic hydrocarbon group having an aromatic hydrocarbon group, and specific examples thereof include a p-cyclohexylphenyl group, a phenylcyclohexyl group and the like.

Examples of the alkyl group having 1 to 6 carbon atoms represented by $R^{a12}$ include a methyl group, an ethyl group, an n-propyl group, an isopropyl group, an n-butyl group, a sec-butyl group, an isobutyl group, an n-pentyl group, an n-hexyl group and the like. The alkyl group having 1 to 6 carbon atoms preferably has 1 to 4 carbon atoms, and more preferably 1 to 3 carbon atoms.

The alkanediyl group having 2 to 6 carbon atoms as for $L^{a1}$ may be either linear or branched, and examples thereof include an ethylene group, a propane-1,3-diyl group, a propane-1,2-diyl group, a butane-1,4-diyl group, a pentane-1,5-diyl group, a hexane-1,6-diyl group, an ethane-1,1-diyl group, a propane-1,1-diyl group, a propane-2,2-diyl group, a propane-1,2-diyl group, a pentane-2,4-diyl group, a 2-methylpropane-1,3-diyl group, a pentane-1,4-diyl group, a 2-methylbutane-1,4-diyl group and the like. The alkanediyl group having 2 to 6 carbon atoms preferably has 2 to 4 carbon atoms, and more preferably 2 to 3 carbon atoms.

$R^{a7}$ is preferably a hydrogen atom.

It is preferable that $R^{a8}$ and $R^{a9}$ each independently represent a methyl group.

$R^{a10}$ is preferably an alkyl group having 1 to 4 carbon atoms or an alkoxy group having 1 to 4 carbon atoms, more preferably an alkyl group having 1 to 3 carbon atoms or an alkoxy group having 1 to 3 carbon atoms and, for example, it is still more preferably a methyl group, an ethyl group, a methoxy group or an ethoxy group, and further more preferably a methyl group or a methoxy group.

m' is preferably 0 to 2, more preferably 0 or 1, and still more preferably 0.

$R^{a11}$ preferably a hydrogen atom or a hydrocarbon group having 1 to 10 carbon atoms, more preferably a hydrogen atom, an alkyl group having 1 to 8 carbon atoms or an alicyclic hydrocarbon group having 3 to 10 carbon atoms, and still more preferably a hydrogen atom, an alkyl group having 1 to 6 carbon atoms or an alicyclic hydrocarbon group having 3 to 8 carbon atoms, excluding a group in which a carbon atom bonded to an oxygen atom is a tertiary carbon atom.

$L^{a1}$ is preferably an alkanediyl group having 2 to 4 carbon atoms (e.g., an ethane-1,2-diyl group, a propane-1,3-diyl group, a propane-1,2-diyl group, a butane-1,4-diyl group), more preferably an alkanediyl group having 2 to 3 carbon atoms (e.g., an ethane-1,2-diyl group, a propane-1,3-diyl group, a propane-1,2-diyl group), and still more preferably an ethane-1,2-diyl group.

n is preferably an integer of 1 to 20, more preferably an integer of 1 to 16, still more preferably an integer of 1 to 14, yet more preferably an integer of 1 to 10, and further preferably an integer of 1 to 6.

$R^{a12}$ is preferably an alkyl group having 1 to 4 carbon atoms, and more preferably an alkyl group having 1 to 3 carbon atoms, excluding a group in which a carbon atom bonded to an oxygen atom is a tertiary carbon atom.

The structural unit (a2-1) is preferably a structural unit represented by formula (a2-1-1), formula (a2-1-2), formula (a2-1-3) or formula (a2-1-4). The monomer from which the structural unit (a2-1) is derived is mentioned, for example, in JP 2010-204634 A.

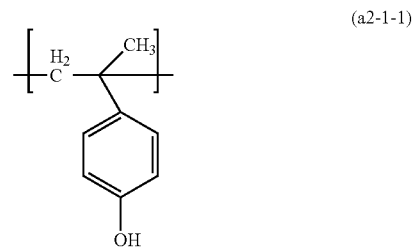

(a2-1-1)

(a2-1-2)

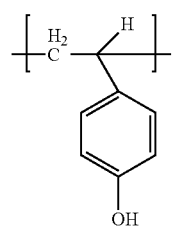

(a2-1-3)

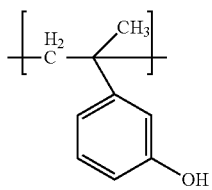

(a2-1-4)

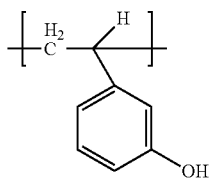

Examples of the monomer from which the structural unit (a2-2) is derived include (meth)acrylic acid alkyl esters such as methyl (meth)acrylate, ethyl (meth)acrylate, propyl (meth)acrylate, butyl (meth)acrylate and hexyl (meth) acrylate;

monocyclic (meth)acrylic acid esters, for example, (meth) acrylic acid cycloalkyl esters such as cyclopentyl (meth) acrylate and cyclohexyl (meth)acrylate;

polycyclic (meth)acrylic acid esters such as adamantyl (meth)acrylate and norbornyl (meth)acrylate; and (meth)acrylic acid aryl esters such as phenyl (meth) acrylate and benzyl (meth)acrylate.

Examples of the monomer from which the structural unit (a2-3) is derived include (meth)acrylic acid esters, for example, (poly)ethylene glycol monomethyl ether (meth) acrylates ((poly)alkylene glycol monoalkyl ether (meth) acrylates) such as ethylene glycol monomethyl ether (meth) acrylate, ethylene glycol monoethyl ether (meth)acrylate, ethylene glycol monopropyl ether (meth)acrylate, ethylene glycol monobutyl ether (meth)acrylate, diethylene glycol monomethyl ether (meth)acrylate, triethylene glycol monomethyl ether (meth)acrylate, tetraethylene glycol monomethyl ether (meth)acrylate, pentaethylene glycol monomethyl ether (meth)acrylate, hexaethylene glycol monomethyl ether (meth)acrylate, heptaethylene glycol monomethyl ether (meth)acrylate, nonaethylene glycol monomethyl ether (meth)acrylate and octaethylene glycol monomethyl ether (meth) acrylate.

Examples of the monomer from which the structural unit (a2) is derived include carboxylic acids such as acrylic acid, methacrylic acid, crotonic acid, maleic acid, fumaric acid, citraconic acid, mesaconic acid and itaconic acid; (meth) acrylic acid hydroxyalkyl esters such as 2-hydroxyethyl (meth)acrylate and 2-hydroxypropyl (meth)acrylate; and styrenes such as styrene, α-methylstyrene, 4-methylstyrene, 2-methylstyrene, 3-methylstyrene, 4-methoxystyrene and 4-isopropoxystyrene.

The structural unit (a2) may be, for example, a structural unit represented by formula (a2-4):

(a2-4)

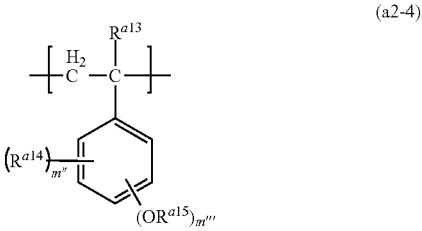

wherein, in formula (a2-4), $R^{a13}$ represents a hydrogen atom or a methyl group, $R^{a14}$ represents an alkyl group having 1 to 6 carbon atoms or an alkoxy group having 1 to 6 carbon atoms, $R^{a15}$ represents a hydrocarbon group having 1 to 12 carbon atoms, excluding a group in which a carbon atom bonded to an oxygen atom is a tertiary carbon atom, and a methylene group included in the hydrocarbon group having 1 to 12 carbon atoms may be replaced by an oxygen atom or a carbonyl group, in which a methylene group bonded to an oxygen atom and a methylene group bonded to the methylene group are not replaced by an oxygen atom, m" represents an integer of 0 to 4, and when m" is 2 or more, a plurality of $R^{a14}$ may be the same or different from each other, and m'" represents an integer of 0 to 4, and when m'" is 2 or more, a plurality of $R^{a15}$ may be the same or different from each other, in which the total of m" and m'" is 5 or less.

The hydrocarbon group in $R^{a15}$ is a group in which a bond to an oxygen atom is not a tertiary carbon atom, i.e., a group in which one or more atoms other than a carbon atom such as a hydrogen atom are bonded to the bonded carbon. The hydrocarbon group in $R^{a15}$ is a group in which a methylene group bonded to an oxygen atom and a methylene group bonded to the methylene group are not replaced by an oxygen atom, i.e., a group including no acetal structure.

Therefore, the structural unit represented by formula (a2-4) includes no structural unit (a1-2).

Examples of the alkyl group having 1 to 6 carbon atoms and the alkoxy group having 1 to 6 carbon atoms as for $R^{a14}$ include the same groups as for $R^{a10}$.

Examples of the hydrocarbon group having 1 to 12 carbon atoms as for $R^{a15}$ include the same groups as for $R^{a11}$.

$R^{a13}$ is preferably a hydrogen atom.

$R^{a14}$ is preferably an alkyl group having 1 to 4 carbon atoms or an alkoxy group having 1 to 4 carbon atoms, more preferably an alkyl group having 1 to 3 carbon atoms or an alkoxy group having 1 to 3 carbon atoms and, for example, it is still more preferably a methyl group, an ethyl group, a methoxy group or an ethoxy group, and further preferably a methyl group or a methoxy group.

Particularly, $R^{a15}$ is preferably a hydrocarbon group having 1 to 10 carbon atoms, or a group in which a methylene group included in the hydrocarbon group is replaced by an oxygen atom or a carbonyl group, more preferably a linear or branched alkyl group having 1 to 8 carbon atoms, an alicyclic hydrocarbon group having 3 to 10 carbon atoms, an aromatic hydrocarbon group having 6 to 10 carbon atoms or a group having 6 to 10 carbon atoms formed by combining these groups, or a group in which a methylene group included in these groups is replaced by an oxygen atom or a carbonyl group, and still more preferably a linear or branched alkyl group having 1 to 5 carbon atoms, an alicyclic hydrocarbon group having 5 to 10 carbon atoms, a phenyl group or a group having 6 to 10 carbon atoms formed by combining these groups, or a group in which a methylene group adjacent to an oxygen atom of these groups is replaced by a carbonyl group.

m″ is preferably 0 to 2, more preferably 0 or 1, and still more preferably 0.

m‴ is preferably 0 to 3, more preferably 0 to 2, and still more preferably 0 or 1, in which the total of m″ and m‴ is 5 or less.

Examples of the structural unit (a2-4) include structural units represented by formula (a2-4-1) to formula (a2-4-10).

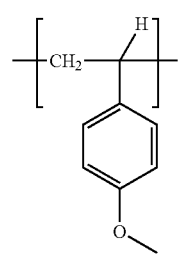

(a2-4-1)

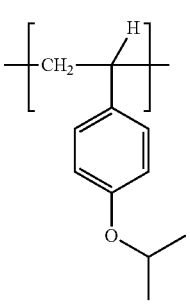

(a2-4-2)

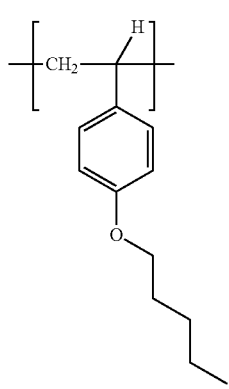

(a2-4-3)

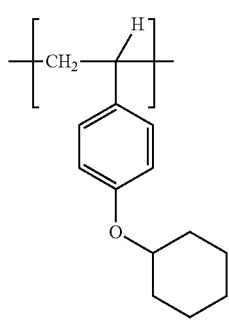

(a2-4-4)

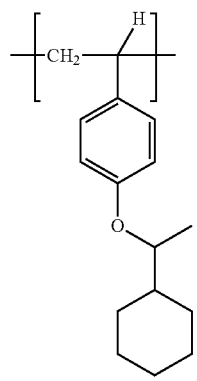

(a2-4-5)

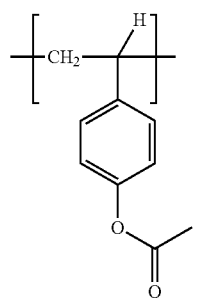

(a2-4-6)

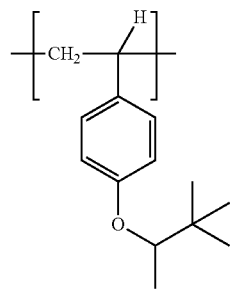

(a2-4-7)

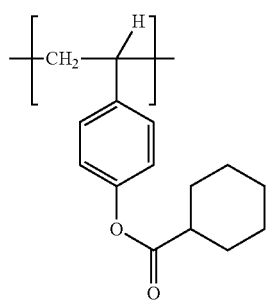

(a2-4-8)

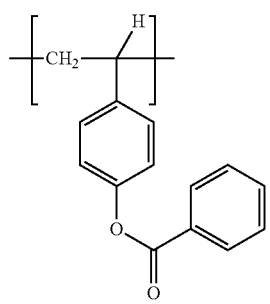

(a2-4-9)

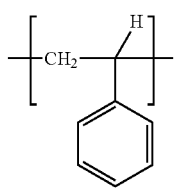
(a2-4-10)

In the structural units represented by formula (a2-4-1) to formula (a2-4-10), it is also possible to exemplify, as specific examples of the structural unit (a2-4), a structural unit in which a hydrogen atom corresponding to $R^{a13}$ is substituted with a methyl group.

When the resin (A1) comprises a structural unit (a2-1), a structural unit (a2-2), a structural unit (a2-3) and a structural unit (a2-4), the total content of these structural units is preferably 1 to 90 mol %, more preferably 1 to 85 mol %, still more preferably 5 to 80 mol %, and particularly preferably 5 to 75 mol %, based on all structural units of the resin (A1).

When the resin (A1) comprises the structural unit (a2), a content ratio of the structural unit (a1) to the structural unit (a2) [structural unit (a1):structural unit (a2)] is preferably 10:90 to 80:20, more preferably 15:85 to 60:40, and still more preferably 15:85 to 45:55, on a molar basis.

Examples of the combination of structural units included in the resin (A1) include those represented by formula (A1-1) to formula (A1-46).

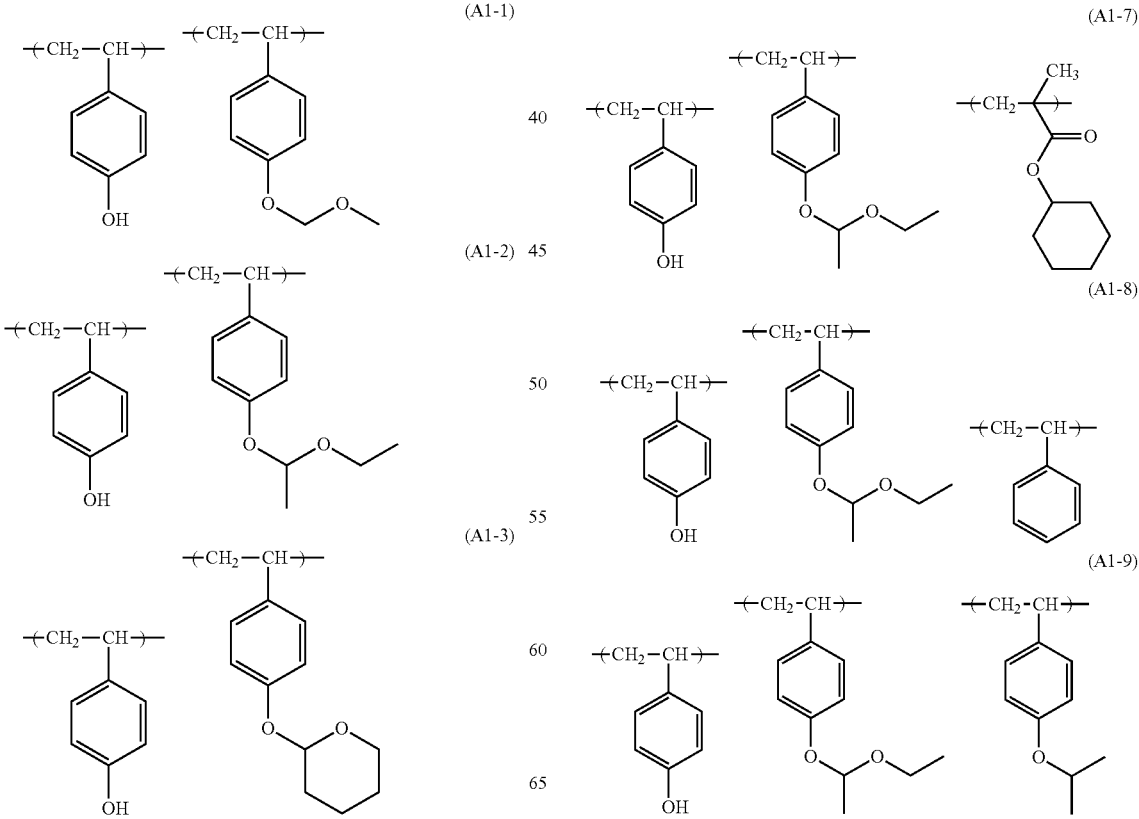

(A1-10)
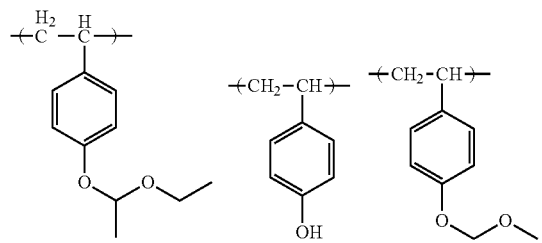
(A1-11)
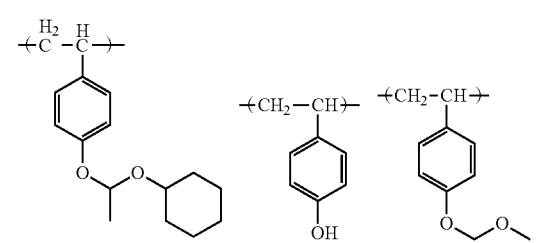
(A1-12)
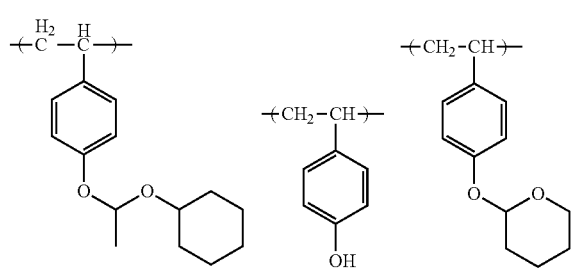
(A1-13)
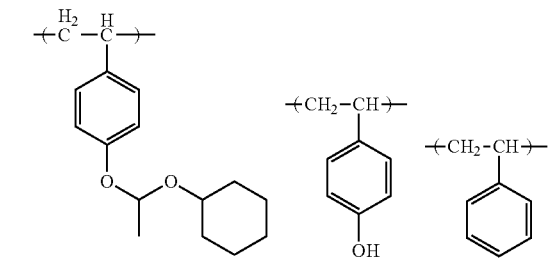
(A1-14)
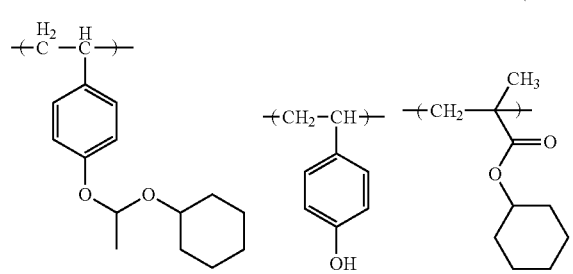
(A1-15)
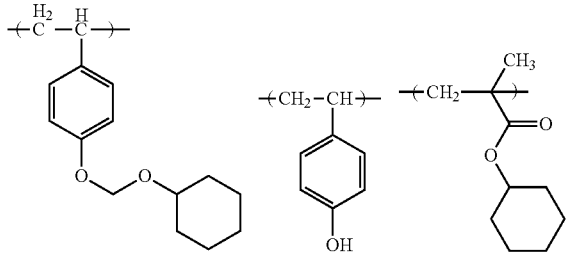
(A1-16)
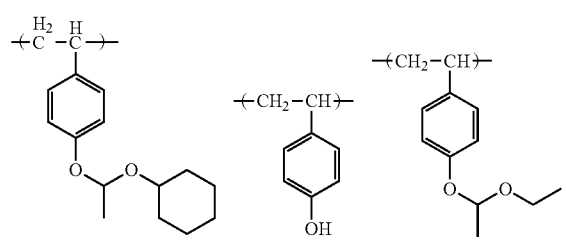
(A1-17)
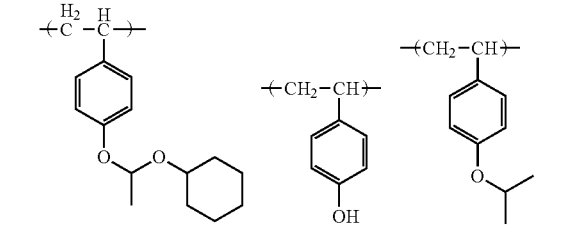
(A1-18)
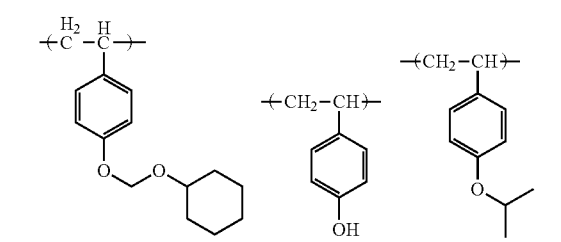
(A1-19)
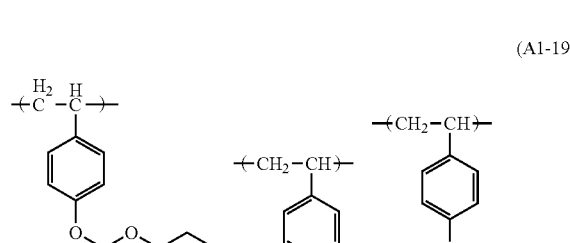
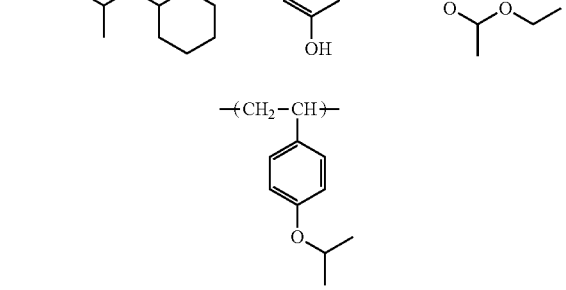

(A1-20) 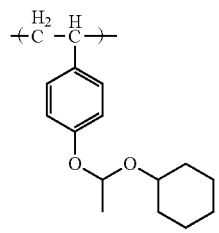 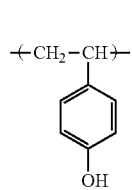 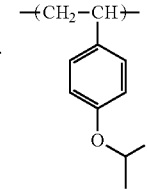 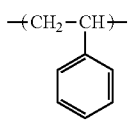
(A1-21) 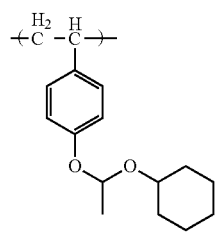 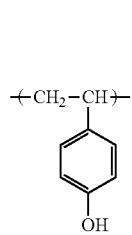 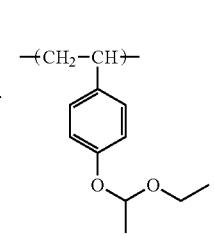 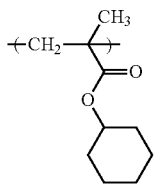
(A1-22) 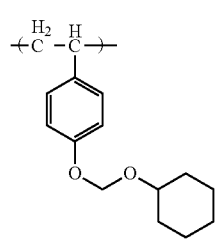 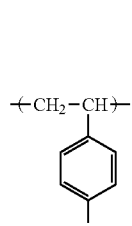 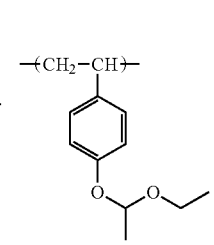 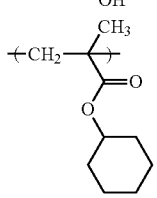
(A1-23) 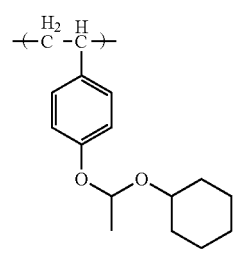 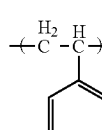 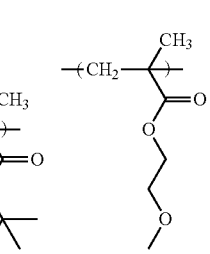
(A1-24) 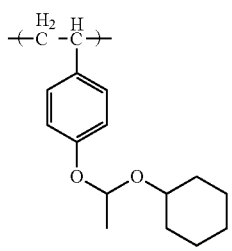 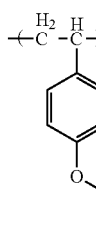 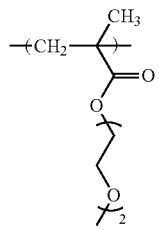
(A1-25) 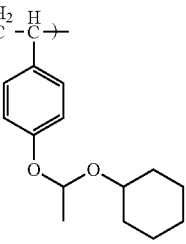 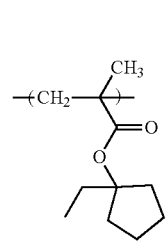 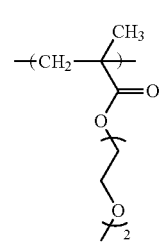 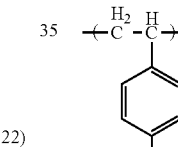 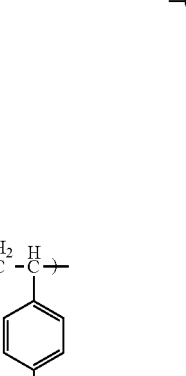
(A1-26) 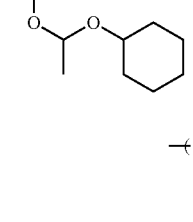 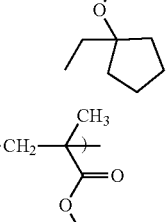 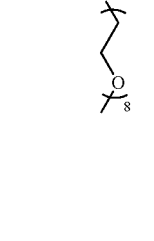 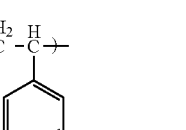
(A1-27) 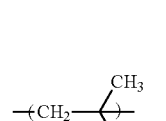 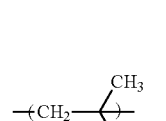 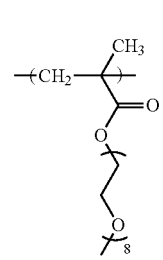 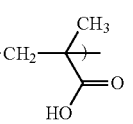

-continued
(A1-28)
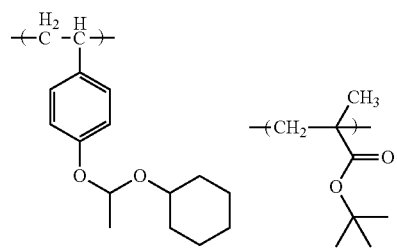
(A1-29)
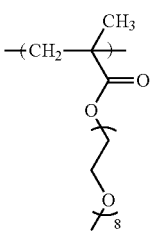
(A1-30)
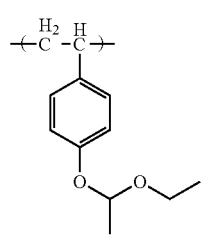 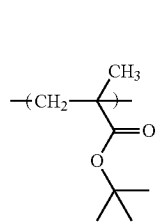 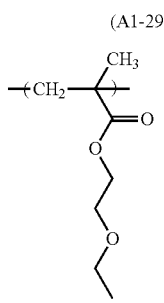
(A1-31)
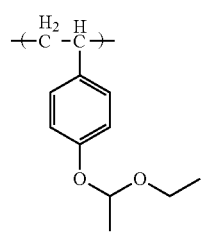 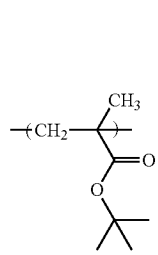 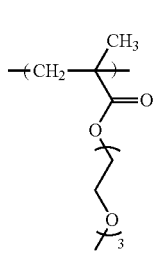
(A1-32)
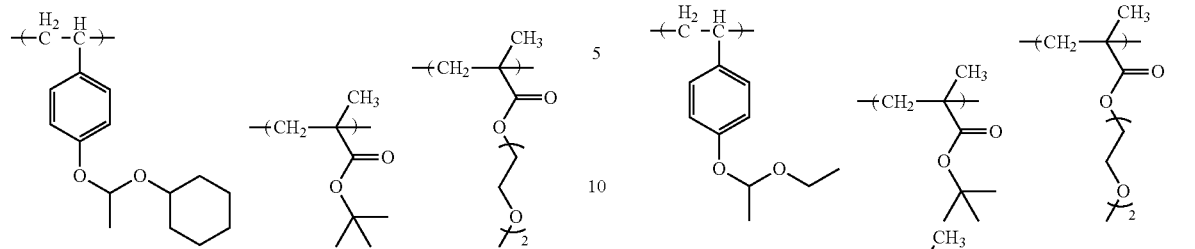
(A1-33)
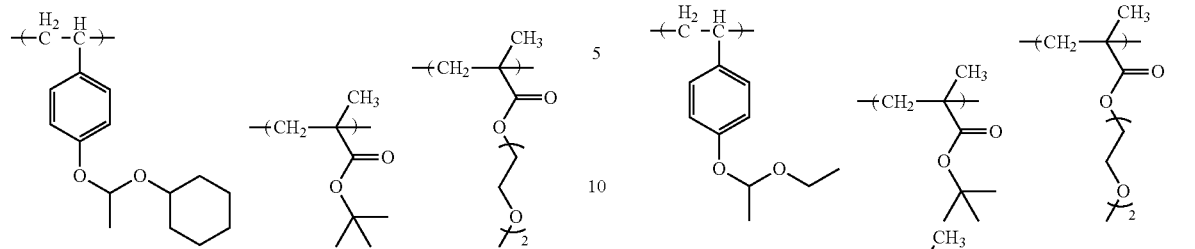
(A1-34)
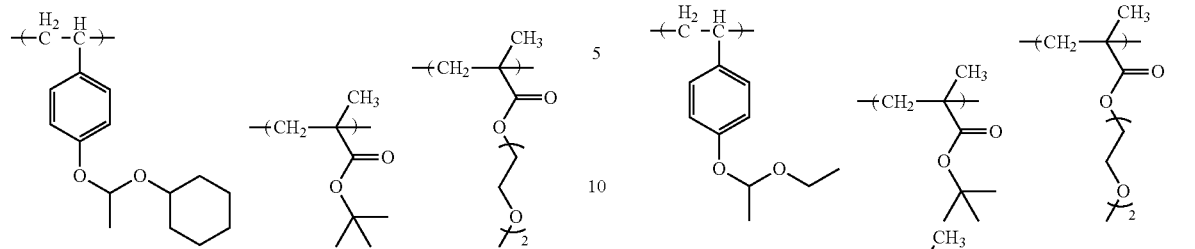
(A1-35)

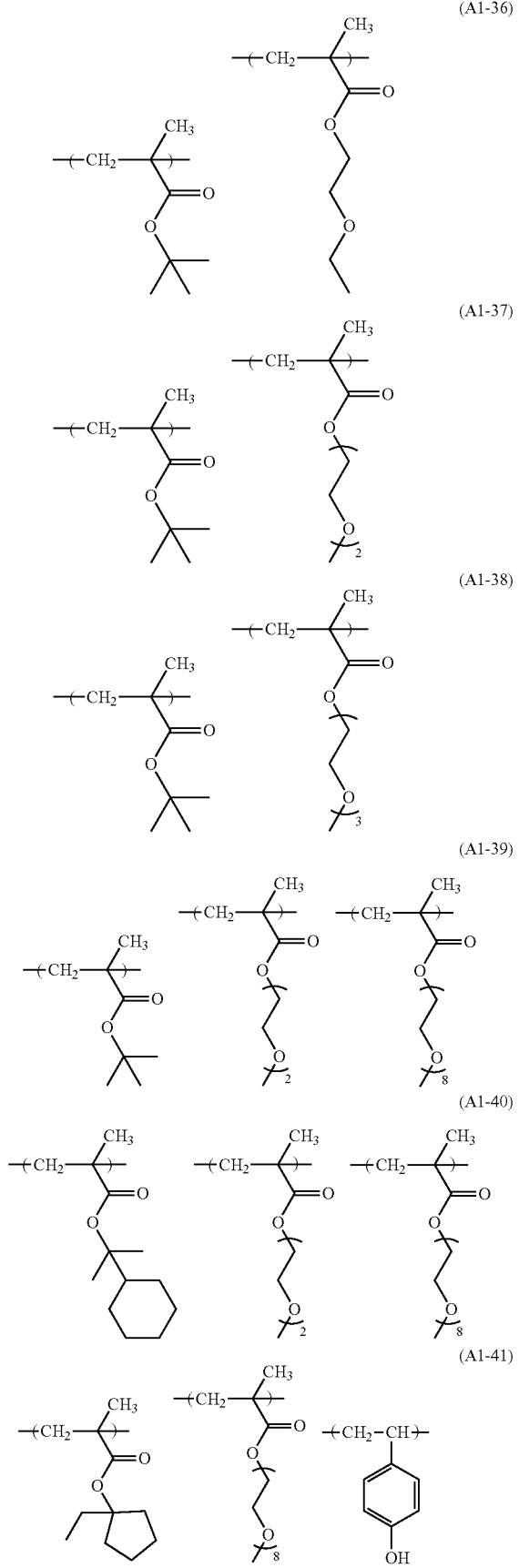
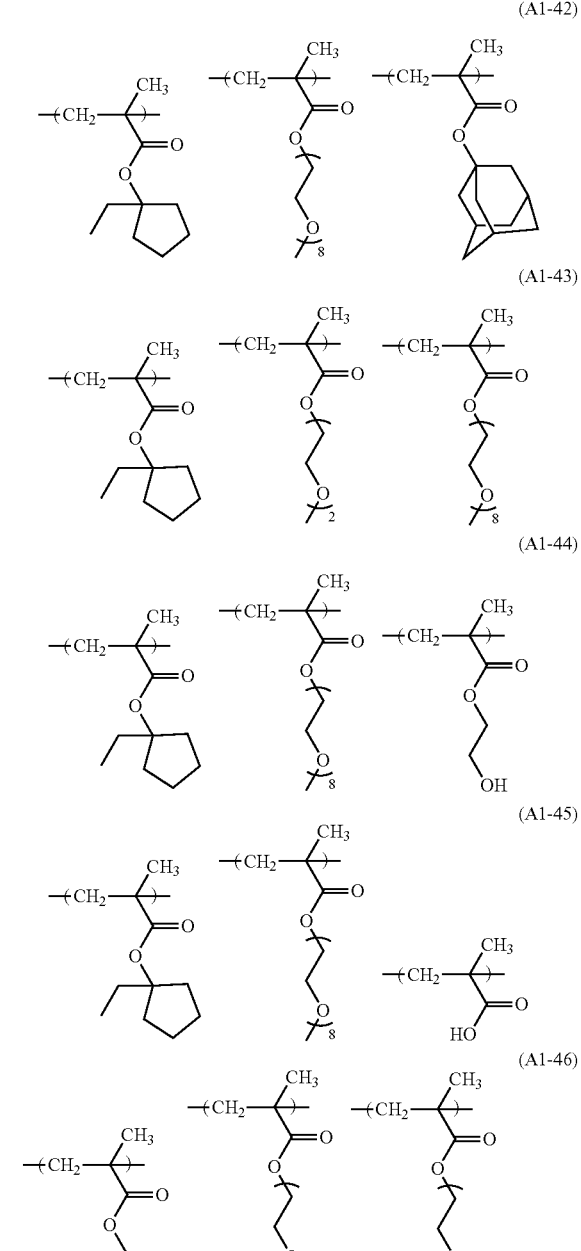

In the above structural formulas, it is also exemplify, as specific examples of the above structural unit, a structural unit in which a hydrogen atom corresponding to $R^{a5}$ is substituted with a methyl group or the methyl group is substituted with the hydrogen atom. In one resin, a structural unit having a hydrogen atom and a methyl group may coexist.

The resin (A1) is preferably a resin comprising a structural unit (a1) and a structural unit (a2), and more preferably a resin comprising a structural unit (a1-1) and/or a structural unit (a1-2) and a structural unit (a2).

The resin (A1) may be a resin (hereinafter sometimes referred to as "resin (A1b)") obtained by reacting a resin having at least one selected from a carboxy group and a phenolic hydroxyl group in the side chain with a compound having at least two or more vinyloxy groups in a molecule.

The resin (A1b) is preferably a resin obtained by reacting a resin having a phenolic hydroxyl group with a compound having two or more vinyloxy groups in a molecule. Such a resin can be obtained, for example, by reacting a resin including a structural unit (a2-1) with a compound having two or more vinyloxy groups in a molecule. The resin having a phenolic hydroxyl group may be a resin obtained by using the below-mentioned novolak resin and reacting this novolak resin with the above-mentioned vinyloxy group-containing compound. Furthermore, it may be a resin obtained by mixing a resin including a structural unit (a2-1) with a novolak resin and reacting the resin mixture thus obtained with the above-mentioned vinyloxy group-containing compound. It is also possible to use a resin obtained by reacting a resin including a structural unit (a2-1) with the above-mentioned vinyloxy group-containing compound in combination with a resin obtained by reacting a novolak resin with the above-mentioned vinyloxy group-containing compound.

In the synthesis of the resin (A1b), a use amount ratio of the compound having at least two or more vinyloxy groups in a molecule relative to the carboxy group and the phenolic hydroxyl group [carboxy group and phenolic hydroxyl group:vinyloxy group] is preferably 60:40 to 99:1, and more preferably 70:30 to 95:5, on a molar basis.

Examples of the resin (A1b) include resins mentioned in JP 2008-134515 A and JP 2008-46594 A.

Examples of the compound having at least two or more vinyloxy groups in a molecule include 1,4-cyclohexane dimethanol divinyl ether, ethylene glycol divinyl ether and the like.

When the resin (A1b) is a resin obtained by mixing a resin including a structural unit (a2-1) with a novolak resin and reacting the resin mixture thus obtained with a vinyloxy group-containing compound, the content of the novolak resin is 30 to 70% by mass based on the total amount of the resin (A1b).

The resin (A1) can be produced by polymerizing a monomer component including an ethylenically unsaturated compound corresponding to the above-mentioned structural unit (a1) and, if necessary, an ethylenically unsaturated compound corresponding to the structural unit (a2) using a known polymerization method (e.g., a radical polymerization method).

The weight-average molecular weight of the resin (A1) is preferably 3,000 or more, more preferably 4,000 or more, preferably 600,000 or less, and more preferably 500,000 or less. The weight-average molecular weight is a value determined by gel permeation chromatography using polystyrene as the standard product. The detailed conditions of this analysis are mentioned in Examples of the present application.

The content of the resin (A1) is preferably 10% by mass or more, more preferably 15% by mass or more, still more preferably 30% by mass or more, preferably 95% by mass or less, more preferably 85% by mass or less, and still more preferably 70% by mass or less, based on the total amount of the resin included in the resist composition.

The resin (A1) may be a novolak resin in which an acid-labile group having a group capable of being cleaved by the action of an acid is introduced (hereinafter sometimes referred to as "resin (A1c)"). This resin refers to a resin in which a part or all of phenolic hydroxyl groups of the below-mentioned novolak resin are protected with a group capable of being cleaved by the action or an acid, or a resin in which a part or all of phenolic hydroxyl groups of the below-mentioned novolak resin are substituted with a group capable of being cleaved by the action of an acid. This resin also refers to a novolak resin having an acid-labile group (a group including a group capable of being eliminated by contact with an acid).

The novolak resin is, for example, a resin obtained by addition condensation of an aromatic compound having a phenolic hydroxyl group (hereinafter simply referred to as "phenol compound") with aldehyde in the presence of an acid catalyst.

Examples of the phenol compound include phenol, o-cresol, m-cresol, p-cresol, o-ethylphenol, m-ethylphenol, p-ethylphenol, o-butylphenol, m-butylphenol, p-butylphenol, 2,5-diethylphenol, 3,5-diethylphenol, 2,3,5-triethylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, 2-methylresorcinol, 4-methylresorcinol, 5-methylresorcinol, 2-methoxyphenol, 3-methoxyphenol, 4-methoxyphenol, 2,3-dimethoxyphenol, 2,5-dimethoxyphenol, 3,5-dimethoxyphenol, 2-methoxyresorcinol, hydroquinone, 4-tert-butylcatechol, hydroquinonemonomethyl ether, pyrogallol, phloroglucinol, hydroxydiphenyl, bisphenol A, gallic acid, gallic acid ester, α-naphthol, β-naphthol, 1,3-dihydroxynaphthalene, 1,5-dihydroxynaphthalene, 1,7-dihydroxynaphthalene, polyhydroxytriphenylmethane-based compounds obtained by condensation of xylenol with hydroxybenzaldehyde and the like. These phenol compounds may be used alone, or a combination of two or more thereof may be used.

Of these, the phenol compound is preferably, for example, o-cresol, m-cresol, p-cresol, 2,3-xylenol, 2,5-xylenol, 3,4-xylenol, 3,5-xylenol, 2,3,5-trimethylphenol, 2-tert-butylphenol, 3-tert-butylphenol, 4-tert-butylphenol, 2-tert-butyl-4-methylphenol or 2-tert-butyl-5-methylphenol.

Examples of the aldehyde include aliphatic aldehydes such as formaldehyde, acetaldehyde, propionaldehyde, n-butylaldehyde, isobutylaldehyde, acrolein and crotonaldehyde; alicyclic aldehydes such as cyclohexanealdehyde, cyclopentanealdehyde or furylacrolein; aromatic aldehydes such as furfural, benzaldehyde, o-, m- or p-methylbenzaldehyde, p-ethylbenzaldehyde, 2,4-, 2,5-, 3,4- or 3,5-dimethylbenzaldehyde, o-, m- or p-hydroxybenzaldehyde, or o-, m- or p-nitrobenzaldehyde; and araliphatic aldehydes such as phenylacetaldehyde or cinnamaldehyde. These aldehydes may be used alone, or two or more thereof may be used in combination. Because of being industrially easily available, formaldehyde is preferable.

Examples of the catalyst during addition condensation include inorganic acids such as hydrochloric acid, sulfuric acid, perchloric acid and phosphoric acid; organic acids such as formic acid, acetic acid, oxalic acid, trichloroacetic acid and p-toluenesulfonic acid; and divalent metal salts such as zinc acetate, zinc chloride and acetic acid magnesium. These catalysts may be used alone, or two or more thereof may be used in combination. The amount of the catalyst used is usually 0.01 to 1 mol based on 1 mol of the aldehyde.

The condensation reaction can be performed according to a conventional method. For example, the condensation reaction is performed at a temperature in a range of 60 to 150° C. for about 2 to 30 hours. The condensation reaction may be performed in the presence of a solvent. Examples of the solvent include ethyl cellosolve, methyl ethyl ketone, methyl isobutyl ketone, acetone and the like. After completion of the reaction, for example, the novolak resin can be isolated by optionally adding a solvent insoluble in water to the reaction mixture and washing the reaction mixture with water, followed by concentration. After completion of the reaction, a basic compound may be added to remove the acid catalyst, followed by neutralization and further removal of the neutralized slat with water washing.

In the novolak resin, the weight-average molecular weight is preferably 3,000 or more, more preferably 4,000 or more, still more preferably 5,000 or more, and is preferably 100,000 or less, more preferably 50,000 or less, still more preferably 10,000 or less, yet more preferably 9,000 or less, and further preferably 8,000 or less.

In the present specification, the weight-average molecular weight is a value determined by gel permeation chromatography using polystyrene as the standard product. The detailed conditions of this analysis are mentioned in Examples of the present application.

The acid-labile group introduced into the novolak resin is not particularly limited as long as it has a group capable of being cleaved by the action or an acid, and examples thereof include those known as the acid-labile group. The acid-labile group is introduced into a part or all of phenolic hydroxyl groups in the novolak resin obtained by condensation as mentioned above.

Examples of the acid-labile group introduced into the phenolic hydroxyl group of the novolak resin include the above-mentioned group represented by formula (10) or group represented by formula (20). The acid-labile group is preferably a group represented by formula (1') or a group represented by formula (2').

Specific examples of the acid-labile group include a tert-butoxycarbonyloxy group, a 1-methylcyclopentan-1-yloxycarbonyloxy group, a 1-(cyclopentan-1-yl)-1-methyl-alkoxycarbonyloxy group, a butyloxyethoxy group, an ethoxypropyloxy group, an ethoxybutyloxy group, a tetrahydro-2-pyranyloxy group, a tetrahydro-2-furyloxy group, a methoxyethoxy group, a 1-ethoxyethoxy group, a propyloxyethoxy group, a cyclohexyloxyethoxy group, a 1-(2-methylpropoxy)ethoxy group, a 1-(2-methoxyethoxy)ethoxy group, a 1-(2-acetoxyethoxy)ethoxy group, a 1-[2-(1-adamantyloxy)ethoxy]ethoxy group, a 1-[2-(1-adamantanecarbonyloxy)ethoxy]ethoxy group, a 3-oxocyclohexyloxy group, a 4-methyltetrahydro-2-pyron-4-yloxy group and the like. Of these, at least one selected from the group consisting of an ethoxyethoxy group, an ethoxypropyloxy group, an ethoxybutyloxy group, an isopropyloxyethoxy group, a cyclohexyloxyethoxy group and a 1-(2-methylpropoxy)ethoxy group is preferable, at least one selected from the group consisting of an ethoxyethoxy group, an isopropyloxyethoxy group and a cyclohexyloxyethoxy group is more preferable, and a 1-ethoxyethoxy group is still more preferable.

It is possible to exemplify, as one aspect of the novolak resin (A1c) having an acid-labile group, for example, a resin comprising a structural unit represented by formula (a3A) (hereinafter sometimes referred to as "structural unit (a3A)") or a structural unit represented by formula (a3B) (hereinafter sometimes referred to as "structural unit (a3B)"):

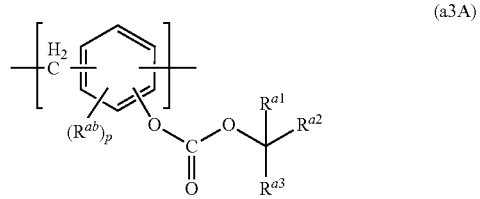

(a3A)

wherein, in formula (a3A), $R^{a1}$, $R^{a2}$ and $R^{a3}$ each independently represent an alkyl group having 1 to 8 carbon atoms or an alicyclic hydrocarbon group having 3 to 20 carbon atoms, or $R^{a1}$ and $R^{a2}$ are bonded to each other to form a ring having 3 to 20 carbon atoms together with carbon atoms to which $R^{a1}$ and $R^{a2}$ are bonded, and $R^{a3}$ represents an alkyl group having 1 to 8 carbon atoms or an alicyclic hydrocarbon group having 3 to 20 carbon atoms, $R^{ab}$ represents a hydroxy group, an alkyl group having 1 to 6 carbon atoms or an alkoxy group having 1 to 6 carbon atoms, and p represents 0, 1, 2 or 3, and when p is 2 or 3, $R^{ab}$ may be the same or different:

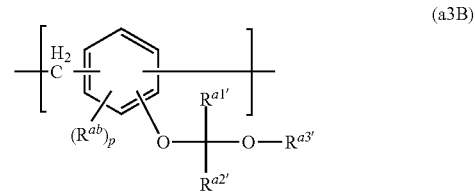

(a3B)

wherein, in formula (a3B), $R^{a1'}$ and $R^{a2'}$ each independently represent a hydrogen atom or a hydrocarbon group having 1 to 20 carbon atoms, $R^{a3'}$ represents a hydrocarbon group having 1 to 20 carbon atoms, or $R^{a1'}$ represents a hydrogen atom or a hydrocarbon group having 1 to 20 carbon atoms, and $R^{a2'}$ and $R^{a3'}$ are bonded to each other to form an heterocyclic ring having 3 to 20 carbon atoms together with carbon atoms and oxygen atoms to which $R^{a2'}$ and $R^{a3'}$ are bonded, a methylene group included in the hydrocarbon group having 1 to 20 carbon atoms and the heterocyclic ring having 3 to 20 carbon atoms may be replaced by an oxygen atom or a sulfur atom, $R^{ab}$ represents a hydroxy group, an alkyl group having 1 to 6 carbon atoms or an alkoxy group having 1 to 6 carbon atoms, and p represents 0, 1, 2 or 3, and when p is 2 or 3, $R^{ab}$ may be the same or different.

Examples of the alkyl group having 1 to 6 carbon atoms represented by $R^{ab}$ include a methyl group, an ethyl group, a propyl group, a butyl group, a pentyl group, a hexyl group and the like. The alkyl group having 1 to 6 carbon atoms is preferably an alkyl group having 1 to 4 carbon atoms, more preferably an alkyl group having 1 to 3 carbon atoms, and still more preferably a methyl group.

Examples of the alkoxy group having 1 to 6 carbon atoms represented by $R^{ab}$ include a methoxy group, an ethoxy group, a propoxy group, a butoxy group, a pentyloxy group, a hexyloxy group and the like. The alkoxy group having 1 to 6 carbon atoms is preferably an alkoxy group having 1 to 4 carbon atoms, more preferably an alkoxy group having 1 to 3 carbon atoms, and still more preferably a methoxy group.

$R^{ab}$ is preferably an alkyl group having 1 to 4 carbon atoms or an alkoxy group having 1 to 4 carbon atoms, more preferably an alkyl group having 1 to 3 carbon atoms or an alkoxy group having 1 to 3 carbon atoms, still more preferably a methyl group, an ethyl group, a methoxy group or an ethoxy group, and yet more preferably a methyl group or a methoxy group.

p is preferably 0 to 2, and more preferably 0 or 1.

Examples of the combination of structural units included in the novolak resin (A1c) having an acid-labile group include those represented by formula (A1c-1) to formula (A1c-12).

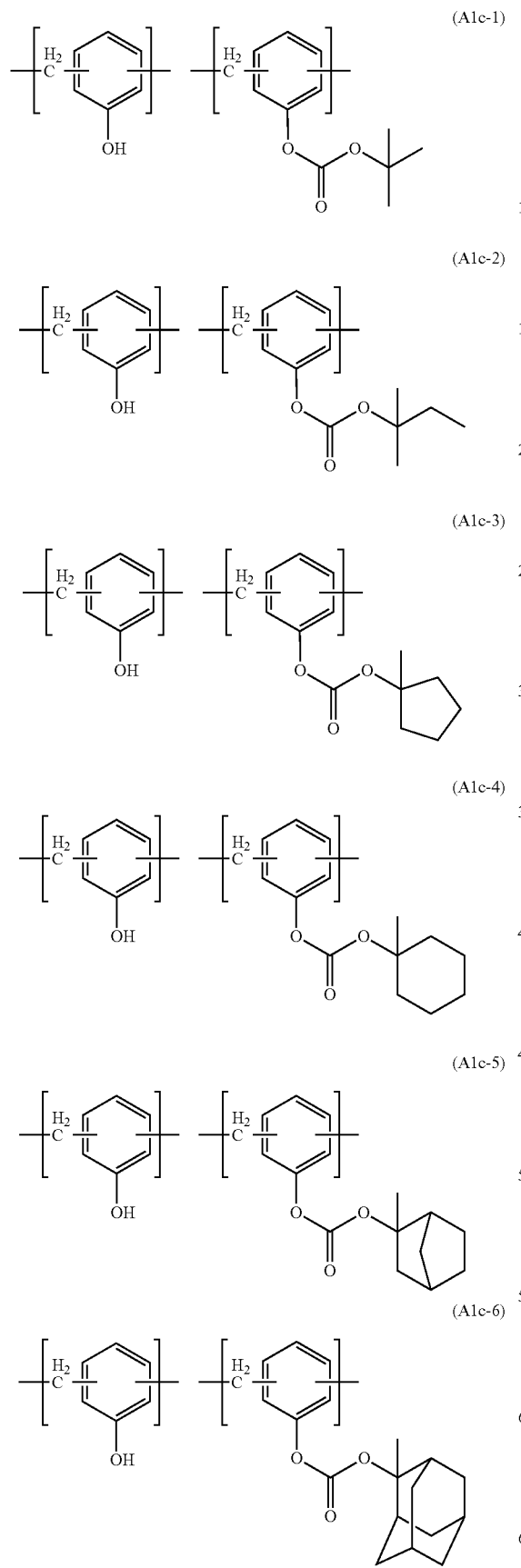
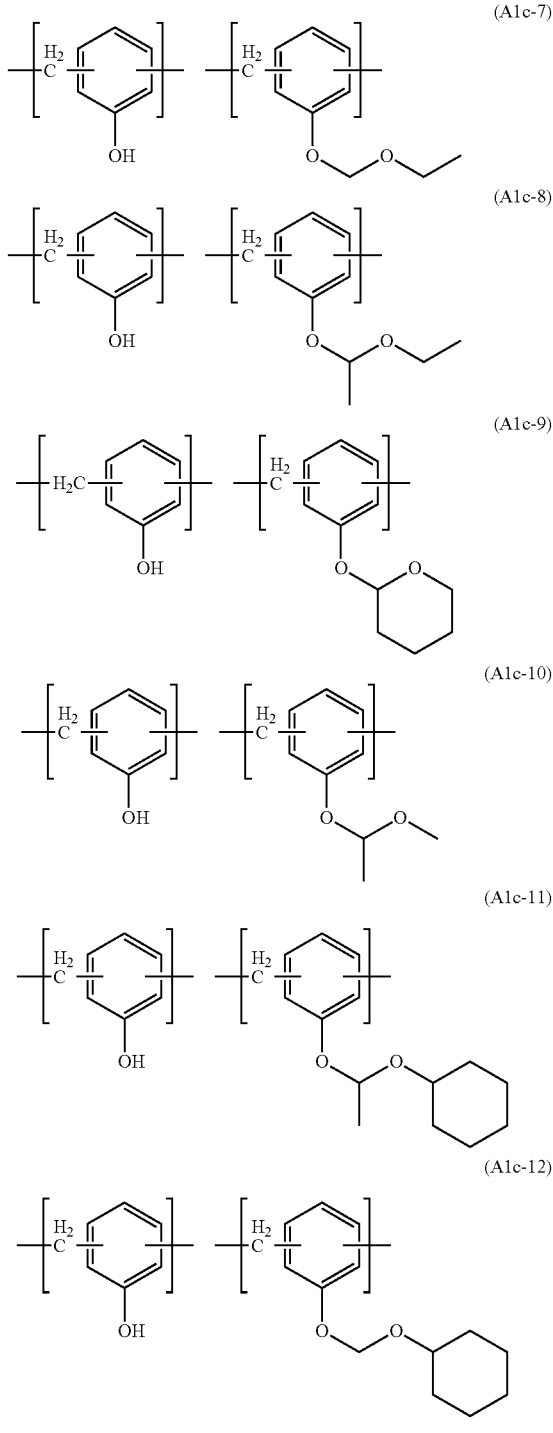

The introduction proportion (introduction ratio) of the acid-labile group is preferably 5 mol % or more, more preferably 10 mol % or more, and still more preferably 20 mol % or more, relative to the phenolic hydroxyl group included in the novolak resin of the resin (A1c). The introduction ratio is preferably 80 mol % or less, more preferably 70 mol % or less, and still more preferably 60 mol % or less. There is also an introduction ratio which is more suited for the acid-labile group.

When the resin (A1) has an acid-labile group (2), the introduction proportion of the acid-labile group (2) is preferably 20 mol % or more, and more preferably 30 mol % or more, relative to the above-mentioned phenolic hydroxyl group. When the resin (A1) has an ethoxyethoxy group as the acid-labile group, the introduction proportion is more preferably 30 to 60 mol %. When the resin has a propyloxyethoxy group, the introduction proportion is still more preferably 20 to 60 mol %. When the resin has a cyclohexyloxyethoxy group, the introduction proportion is still more preferably 20 to 60 mol %. By setting the introduction proportion within this range, it is possible to effectively secure resolution, residual film ratio and heat resistance after pattern formation in the resist composition using this resin.

The introduction proportion of the acid-labile group can be measured, for example, by $^1$H-NMR.

Examples of the method for introducing an acid-labile group into the phenolic hydroxyl group of the novolak resin include methods known in the art. For example, when an ethoxyethoxy group is introduced as the acid-labile group, it is possible to exemplify a method in which a predetermined amount of ethyl vinyl ether is added to a novolak resin at room temperature in the presence of an acid catalyst and a reaction is performed in the presence of an acid catalyst for a predetermined time, followed by the addition of diethyl ether and further water washing.

The weight-average molecular weight of the resin (A1c) is preferably 3,000 or more, more preferably 4,000 or more, preferably 200,000 or less, and more preferably 100,000 or less. The weight-average molecular weight is a value determined by gel permeation chromatography using polystyrene as the standard product. The detailed conditions of this analysis are mentioned in Examples of the present application.

The content of the resin (A1c) is preferably 10% by mass or more, more preferably 15% by mass or more, still more preferably 30% by mass or more, preferably 95% by mass or less, more preferably 85% by mass or less, and still more preferably 70% by mass or less, based on the total amount of the resin included in the resist composition.

<Resin (A2)>

The resin (A2) is preferably an alkali-soluble resin. The alkali-soluble resin is a resin which has an acidic group (sometimes referred to as hydrophilic group) and is soluble in an alkali developer. The acidic group is, for example, a carboxy group, a sulfo group, a hydroxy group (a phenolic hydroxyl group, etc.) or the like.

Examples of the alkali-soluble resin include alkali-soluble resins known in the resist field, for example, a novolak resin, a resin comprising a structural unit (a2-1) and not comprising a structural unit (a1), for example, a resin comprising a structural unit derived from hydroxystyrene, a resin comprising a structural unit derived from a (meth)acrylic acid ester, and polyalkylene glycol, and preferably a novolak resin. It is preferable that the alkali-soluble resin has no acid-labile group. In other words, the alkali-soluble resin is preferably a resin which comprises a structural unit having an acidic group and does not comprise a structural unit having an acid-labile group. It is preferable that the alkali-soluble resin causes no change of the solubility in an aqueous alkali solution due to contact with an acid. The alkali-soluble resin may be used alone, or two or more thereof may be used in combination.

In the resin (A2), the total content of the structural unit having an acidic group is preferably 3 to 100 mol %, more preferably 5 to 100 mol %, still more preferably 10 to 100 mol %, yet more preferably 30 to 100 mol %, further preferably 50 to 100 mol %, further more preferably 60 to 100 mol %, especially preferably 70 to 100 mol %, and particularly preferably 80 to 100 mol %, based on all structural units of the resin (A2).

The resin (A2) may include a structural unit having an acidic group alone, or a plurality thereof.

It is possible to exemplify, as the alkali-soluble resin, for example, a resin in which the residual film ratio is 0% or more and 90% or less when performing the development with an alkali developer under actual use conditions. The residual film ratio is preferably 0% or more 85% or less, and more preferably 0% or more 80% or less.

The residual film ratio can be measured, for example, in the following manner. The resin is dissolved in an organic solvent and then optionally filtered using a filter followed by application on a substrate using a spin coater and further removal of the organic solvent by heating. The thickness of the thus obtained organic film on the substrate is measured by a film thickness meter, and after performing the development with a 2.38% by mass aqueous alkali solution, the film thickness is measured again by a film thickness meter after the development. It is possible to obtain a residual film ratio by dividing the film thickness after the development by the film thickness before the development with respect to the measured value thus obtained. The development conditions are actual use conditions. For example, the developing temperature is 5 to 60° C., and the developing time is 5 to 600 seconds. Examples of the alkali developer include various aqueous alkali solutions used in this field, for example, an aqueous solution of tetramethylammonium hydroxide or (2-hydroxyethyl)trimethylammonium hydroxide (known as choline).

The novolak resin is a resin obtained by condensing a phenol compound with aldehyde in the presence of a catalyst and can be selected, for example, from those mentioned as for the resin (A1c).

Examples of one aspect of the novolak resin include a resin comprising a structural unit represented by formula (a4) (hereinafter sometimes referred to as "structural unit (a4)"):

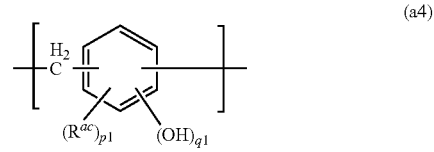

wherein, in formula (a4), $R^{ac}$ represents a hydroxy group, an alkyl group having 1 to 6 carbon atoms or an alkoxy group having 1 to 6 carbon atoms, p1 represents 0, 1, 2 or 3, and when p1 is 2 or 3, $R^{ac}$ may be the same or different, and q1 represents 1, 2 or 3, in which the total of p1 and q1 is 4 or less.

Examples of the alkyl group having 1 to 6 carbon atoms and the alkoxy group having 1 to 6 carbon atoms as for $R^{ac}$ include the same groups as for $R^{ab}$.

$R^{ac}$ is preferably an alkyl group having 1 to 4 carbon atoms or an alkoxy group having 1 to 4 carbon atoms, more preferably an alkyl group having 1 to 3 carbon atoms or an alkoxy group having 1 to 3 carbon atoms, still more preferably a methyl group, an ethyl group, a methoxy group or an ethoxy group, and yet more preferably a methyl group or a methoxy group.

p1 is preferably 0 to 2, and more preferably 1 or 2.

q1 is preferably 1 or 2, and more preferably 1.

The weight-average molecular weight of the novolak resin is preferably 3,000 or more, more preferably 4,000 or more, still more preferably 5,000 or more, and yet more preferably 6,000 or more, and is preferably 100,000 or less, more preferably 50,000 or less, still more preferably 10,000 or less, yet more preferably 9,000 or less, and further preferably 8,000 or less. By setting the weight-average molecular weight within this range, it is possible to effectively prevent the film from thinning and leaving residue after the development. The weight-average molecular weight is a value determined by gel permeation chromatography using polystyrene as the standard product. The detailed conditions of this analysis are mentioned in Examples of the present application.

Examples of the resin comprising a structural unit derived from hydroxystyrene include a resin comprising a structural unit derived from a monomer having a phenolic hydroxyl group, for example, hydroxystyrenes such as hydroxystyrene (p-hydroxystyrene, m-hydroxystyrene, o-hydroxystyrene) and isopropenylphenol (p-isopropenylphenol, m-isopropenylphenol, o-isopropenylphenol), and specific examples thereof include a resin comprising a structural unit represented by formula (a2-1). The resin comprising a structural unit derived from hydroxystyrene may comprise, in addition to the structural unit derived from the above monomer, structural units derived from monomers exemplified in the below-mentioned resins comprising a structural unit derived from a (meth)acrylic acid ester.

The resin comprising a structural unit derived from hydroxystyrene is typically poly(vinylphenol) (poly(hydroxystyrene)), and preferably poly(p-vinylphenol) (poly(p-hydroxystyrene)). Specific examples thereof include a resin comprising a structural unit represented by formula (a2-1). Such poly(vinylphenol) can be obtained, for example, by polymerizing a monomer mentioned in JP 2010-204634 A.

Examples of the resin comprising a structural unit derived from a (meth)acrylic acid ester include those obtained by using the following compounds as monomers and polymerizing a combination of one or more monomers by a conventional method. In other words, examples of the resin comprising a structural unit derived from a (meth)acrylic acid ester include resins comprising a structural unit derived from the following monomers:

monomers having a carboxy group, such as (meth)acrylic acid;

monomers having a hydroxy group, such as 2-hydroxyethyl (meth)acrylate and 2-hydroxypropyl (meth)acrylate; and monomers having a plurality of ether bonds, for example, polyethylene glycol monomethyl ether (meth)acrylates (polyalkylene glycol monoalkyl ether (meth)acrylates) such as diethylene glycol monomethyl ether (meth)acrylate, triethylene glycol monomethyl ether (meth)acrylate, tetraethylene glycol monomethyl ether (meth)acrylate, pentaethylene glycol monomethyl ether (meth)acrylate, hexaethylene glycol monomethyl ether (meth)acrylate, heptaethylene glycol monomethyl ether (meth)acrylate, octaethylene glycol monomethyl ether (meth)acrylate and nonaethylene glycol monomethyl ether (meth)acrylate.

It is possible to use the above-mentioned monomers in combination with (meth)acrylic acid alkyl esters such as methyl (meth)acrylate, ethyl (meth)acrylate, propyl (meth)acrylate, tert-butyl (meth)acrylate and hexyl (meth)acrylate; (meth)acrylic acid cycloalkyl esters (monocyclic (meth) acrylic acid esters) such as cyclopentyl (meth)acrylate and cyclohexyl (meth)acrylate; polycyclic (meth)acrylic acid esters such as adamantyl (meth)acrylate and norbornyl (meth)acrylate; (meth)acrylic acid aryl esters such as phenyl (meth)acrylate and benzyl (meth)acrylate; and ethylene glycol monoalkyl ether (meth)acrylates (alkylene glycol monoalkyl ether (meth)acrylates) such as ethylene glycol monomethyl ether (meth)acrylate, ethylene glycol monoethyl ether (meth)acrylate, ethylene glycol monopropyl ether (meth) acrylate and ethylene glycol monobutyl ether (meth)acrylate. In addition to the above-mentioned monomer, styrenes such as styrene, α-methylstyrene, 4-methylstyrene, 2-methylstyrene, 3-methylstyrene, 4-methoxystyrene and 4-isopropoxystyrene; carboxylic acids such as crotonic acid, maleic acid, fumaric acid, citraconic acid, mesaconic acid and itaconic acid; and hydroxystyrenes exemplified in the above-mentioned resin comprising a structural unit derived from hydroxystyrene may be used in combination. It is also possible to exemplify, as the structural unit derived from the monomers mentioned above, structural units represented by formula (a2-1) to formula (a2-4).

The polyalkylene glycol is a polymer obtained by addition polymerization of alcohols with an alkylene oxide. Examples of alcohols include butanol, ethylene glycol, propylene glycol, glycerin, pentaerythritol and the like. Examples of the alkylene oxide include ethylene oxide, propylene oxide, butylene oxide and the like. Examples of the polyalkylene glycol include polyethylene glycol, polypropylene glycol, polybutylene glycol and the like.

The content of the resin (A2) is preferably 5% by mass or more, more preferably 10% by mass or more, and still more preferably 20% by mass or more, and is preferably 90% by mass or less, more preferably 80% by mass or less, still more preferably 70% by mass or less, and yet more preferably 65% by mass or less, based on the total amount of the resin included in the resist composition.

The resist composition of the present invention further comprises a resin (A2) in a resist composition comprising a compound (I), a resin (A1) and an acid generator (B). The resin (A2) is capable of adjusting the solubility in a developer (an aqueous alkali solution) of a resist by an interaction with the compound (I), and becomes resistant to a developer (an aqueous alkali solution) and a plating solution by crosslinking with the compound (I), thus enabling an improvement in accuracy of a plated molded article.

A mass ratio ((A1):(A2)) of each content of the resin (A1) and the resin (A2) included in the resist composition is usually 20:80 to 80:20, and preferably 30:70 to 70:30. By setting the mass ratio within this range, the accuracy of the plated molded article can be further improved, which is suitable.

Each content of resin (A1) and the resin (A2) in the resist composition of the present invention is preferably 80% by mass or more and 99% by mass or less based on the total amount of the solid of the resist composition. The content of the resin (A1) is preferably 1% by mass or more and 98% by mass or less, and more preferably 5% by mass or more and 90% by mass or less, based on the total amount of the solid of the resist composition. The content of the resin (A2) is preferably 1% by mass or more and 98% by mass or less, and more preferably 5% by mass or more and 90% by mass or less, based on the total amount of the solid of the resist composition. The solid content and the content of each component included in the resist composition of the present invention can be measured, for example, by known analytical means such as liquid chromatography or gas chromatography.

<Acid Generator (B)>

The acid generator (B) is a compound capable of generating an acid by decomposing upon light irradiation (exposure). The acid thus generated is capable of eliminating a leaving group included in the acid-labile group of the resin (A1), thus converting the acid-labile group into a hydrophilic group (e.g., a carboxy group, a hydroxy group (a phenolic hydroxyl group, etc.)). In other words, by exposing the resist composition including the resin (A1), a resist is made soluble in a developer (an aqueous alkali solution).

Either nonionic or ionic acid generator may be used as the acid generator (B).

Examples of the nonionic acid generator include organic halides, for example, sulfonate esters (e.g., 2-nitrobenzyl ester, aromatic sulfonate, oxime sulfonate, N-sulfonyloxyimide, sulfonyloxyketone, diazonaphthoquinone 4-sulfonate), sulfones (e.g., disulfone, ketosulfone, sulfonyldiazomethane) and the like. Typical examples of the ionic acid generator include onium salts containing an onium cation (e.g., diazonium salt, phosphonium salt, sulfonium salt, iodonium salt). Examples of the anion of the onium salt include sulfonic acid anion, sulfonylimide anion, sulfonylmethide anion and the like.

Specific examples of the acid generator (B) include compounds generating an acid upon exposure to radiation mentioned in JP 63-26653 A, JP 55-164824 A, JP 62-69263 A, JP 63-146038 A, JP 63-163452 A, JP 62-153853 A, JP 63-146029 A, U.S. Pat. Nos. 3,779,778, 3,849,137, DE Patent No. 3914407 and EP Patent No. 126,712. Compounds produced by a known method may also be used. These acid generators (B) may be used alone, or two or more thereof may also be used in combination.

The nonionic acid generator is preferably a compound having a group represented by formula (B1) (* represents a bond):

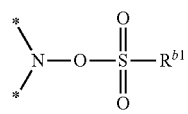

(B1)

wherein, in formula (B1), $R^{b1}$ represents a hydrocarbon group having 1 to 18 carbon atoms which may have a fluorine atom, and a methylene group included in the hydrocarbon group having 1 to 18 carbon atoms may be replaced by an oxygen atom or a carbonyl group.

The nitrogen atom may have a double bond.

Examples of the hydrocarbon group having 1 to 18 carbon atoms in hydrocarbon group having 1 to 18 carbon atoms which may have a fluorine atom as for $R^{b1}$ include a linear or branched chain hydrocarbon group having 1 to 18 carbon atoms, an alicyclic hydrocarbon group having 3 to 18 carbon atoms, an aromatic hydrocarbon group having 6 to 18 carbon atoms, and a group having 4 to 18 carbon atoms obtained by combining these groups.

The linear or branched chain hydrocarbon group having 1 to 18 carbon atoms is preferably an alkyl group having 1 to 18 carbon atoms, and examples thereof include a methyl group, an ethyl group, a propyl group, a butyl group, a pentyl group, a hexyl group, a heptyl group, an octyl group, a nonyl group, a decyl group and the like. Of these, a linear hydrocarbon group is preferable.

Examples of the alicyclic hydrocarbon group having 3 to 18 carbon atoms include a cyclopropyl group, a cyclobutyl group, a cyclopentyl group, a cyclohexyl group, a cycloheptyl group, a cyclooctyl group, an adamantyl group and the like.

The aromatic hydrocarbon group having 6 to 18 carbon atoms is preferably an aryl group having 6 to 18 carbon atoms, and examples thereof include aryl groups such as a phenyl group, a naphthyl group, an anthryl group, a biphenyl group and a phenanthryl group.

Examples of the group obtained by combining a chain hydrocarbon group with an alicyclic hydrocarbon group (the group having 4 to 18 carbon atoms) among the group having 4 to 18 carbon atoms obtained by combining the above groups include a methylcyclohexyl group, a dimethylcyclohexyl group, a methylnorbornyl group, an isobornyl group, a 2-alkyladamantan-2-yl group, a 1-(adamantan-1-yl)alkan-1-yl group and the like.

The group obtained by combining a chain hydrocarbon group with an aromatic hydrocarbon group (the group having 7 to 18 carbon atoms) is, for example, an aralkyl group or an aromatic hydrocarbon group having an alkyl group, and specific examples thereof include a benzyl group, a phenethyl group, a phenylpropyl group, a trityl group, a naphthylmethyl group, a naphthylethyl group, a p-methylphenyl group, a p-tert-butylphenyl group, a tolyl group, a xylyl group, a cumenyl group, a mesityl group, a 2,6-diethylphenyl group, a 2-methyl-6-ethylphenyl group and the like.

The group obtained by combining an alicyclic hydrocarbon group with an aromatic hydrocarbon group (the group having 9 to 18 carbon atoms) is, for example, an aromatic hydrocarbon group having an alicyclic hydrocarbon group or an alicyclic hydrocarbon group having an aromatic hydrocarbon group, and specific examples thereof include a p-cyclohexylphenyl group, a p-adamantylphenyl group, a phenylcyclohexyl group and the like.

Of the hydrocarbon group having 1 to 18 carbon atoms represented by $R^{b1}$, an alkyl group having 1 to 10 carbon atoms or an aromatic hydrocarbon group having 6 to 10 carbon atoms is preferable, an alkyl group having 1 to 8 carbon atoms is more preferable, and an alkyl group having 1 to 4 carbon atoms is still more preferable.

Examples of the group in which a methylene group included in the alicyclic hydrocarbon group having 3 to 18 carbon atoms in $R^{b1}$ is replaced by an oxygen atom or a carbonyl group include groups represented by formula (Y1) to formula (Y12). Groups represented by formula (Y7) to formula (Y9) are preferable, and a group represented by formula (Y9) is more preferable.

(Y1)

(Y2)

(Y3)

(Y4)

(Y5) 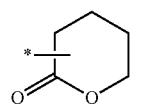

(Y6) 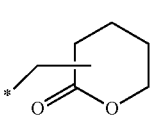

(Y7) 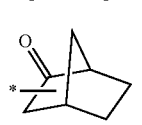

(Y8) 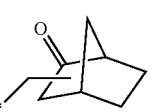

(Y9) 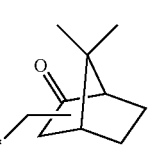

(Y10) 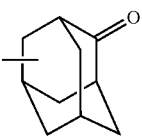

(Y11) 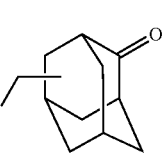

(Y12) 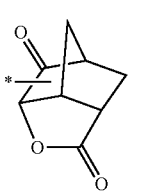

The hydrocarbon group having 1 to 18 carbon atoms which has a fluorine atom is a group in which one or more hydrogen atoms included in the hydrocarbon group having 1 to 18 carbon atoms are substituted with a fluorine atom, and specific examples thereof include fluoroalkyl groups such as a fluoromethyl group, a fluoroethyl group, a fluoropropyl group, a fluorobutyl group, a fluoropentyl group, a fluorohexyl group, a fluoroheptyl group, a fluorooctyl group, a fluorononyl group and a fluorodecyl group; fluorocycloalkyl groups such as a fluorocyclopropyl group, a fluorocyclobutyl group, a fluorocyclopentyl group, a fluorocyclohexyl group, a fluorocycloheptyl, a fluorocyclooctyl group and a fluoroadamantyl group; and fluoroaryl groups such as a fluorophenyl group, a fluoronaphthyl group and a fluoroanthryl group.

The hydrocarbon group having 1 to 18 carbon atoms which has a fluorine atom is preferably an alkyl group having 1 to 10 carbon atoms which has a fluorine atom, or an aromatic hydrocarbon group having 6 to 10 carbon atoms which has a fluorine atom, more preferably a perfluoroalkyl group having 1 to 8 carbon atoms, and still more preferably a perfluoroalkyl group having 1 to 4 carbon atoms.

Examples of the compound having a group represented by formula (B1) include compounds represented by formula (b1) to formula (b3). Compounds represented by formula (b1) and formula (b2) are preferable, and a compound represented by formula (b1) is more preferable:

(b1) 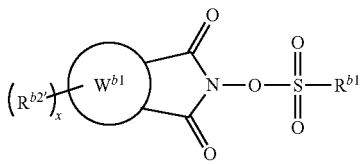

(b2) 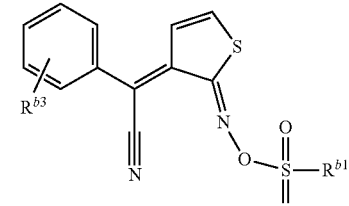

(b3) 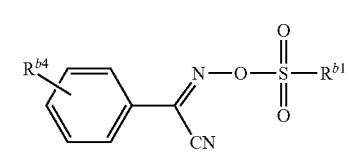

wherein, in formula (b1) to formula (b3), $R^{b1}$ is the same as defined above, $R^{b2'}$, $R^{b3}$ and $R^{b4}$ each independently represent a hydrogen atom, an alkyl group having 1 to 8 carbon atoms or an alkoxy group having 1 to 8 carbon atoms, ring $W^{b1}$ represents an aromatic hydrocarbon ring having 6 to 14 carbon atoms or an aromatic heterocyclic ring having 6 to 14 carbon atoms, and x represents an integer of 0 to 2, and when x is 2, a plurality of $R^{b2'}$ may be the same or different.

Examples of the alkyl group having 1 to 8 carbon atoms include a methyl group, an ethyl group, a propyl group, a butyl group, a pentyl group and the like, and a methyl group is preferable.

Examples of the alkoxy group having 1 to 8 carbon atoms include a methoxy group, an ethoxy group, a propoxy group, a butoxy group, a pentyloxy group and the like, and a methoxy group is preferable.

Examples of the aromatic hydrocarbon ring having 6 to 14 carbon atoms include a benzene ring, a naphthalene ring, an anthracene ring and the like.

Examples of the aromatic heterocyclic ring having 6 to 14 carbon atoms include a ring in which the numbers of atoms constituting the ring is 6 to 14, and the following rings are preferable.

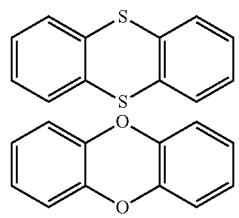

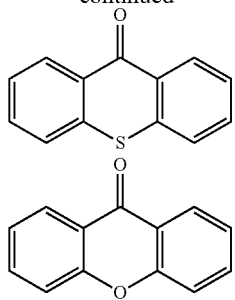

The ring $W^{b1}$ is preferably a naphthalene ring.

The compound represented by formula (b1) is preferably a compound represented by any one of formula (b4) to formula (b7), and more preferably a compound represented by formula (b4):

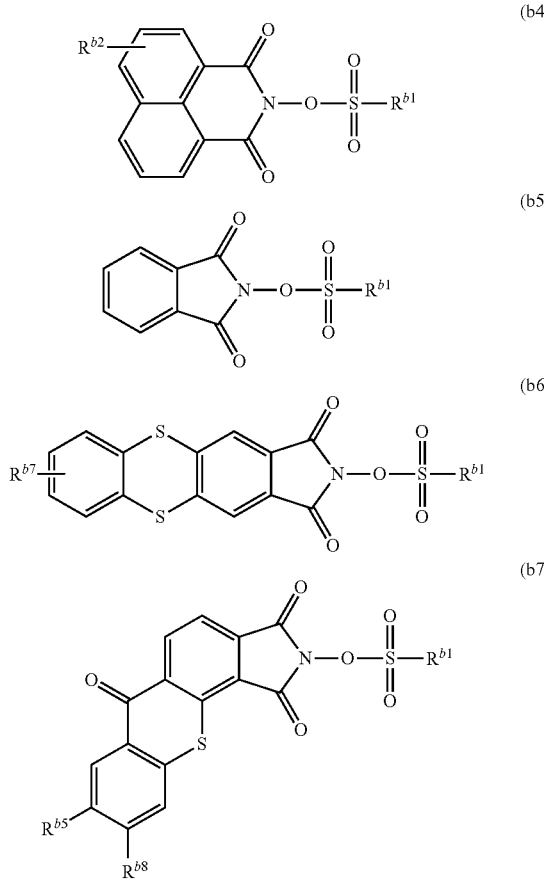

wherein, in formula (b4) to formula (b7), $R^{b1}$ is the same as defined above, and $R^{b2}$, $R^{b5}$, $R^{b6}$ and $R^{b7}$ each independently represent a hydrogen atom or an alkyl group having 1 to 8 carbon atoms.

Examples of the alkyl group having 1 to 8 carbon atoms include a methyl group, an ethyl group, a propyl group, a butyl group, a pentyl group and the like, and a methyl group is preferable.

Examples of the compound represented by formula (b1) include compounds represented by formula (b1-1) to formula (b1-14). A compound represented by formula (b1-6) or formula (b1-7) is preferable.

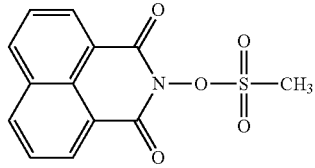

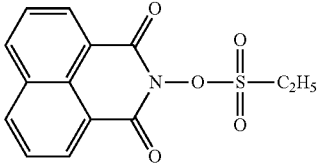

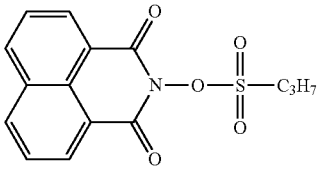

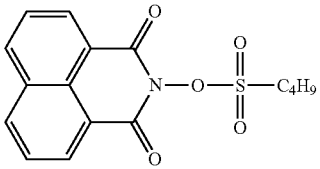

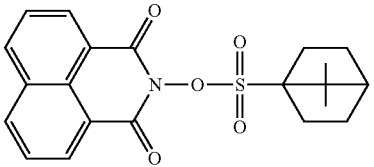

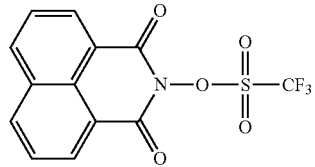

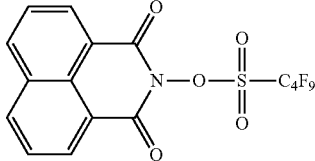

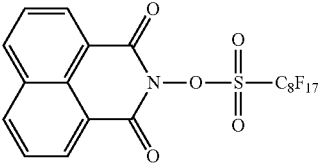

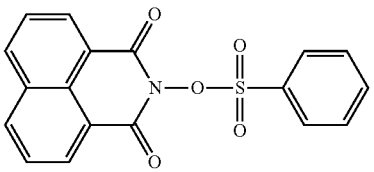

(b1-10)
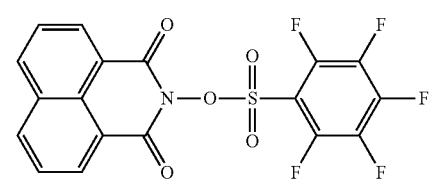
(b1-11)
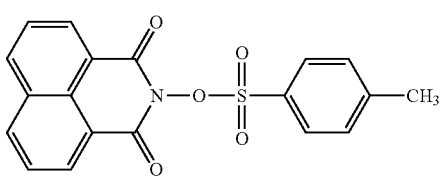
(b1-12)
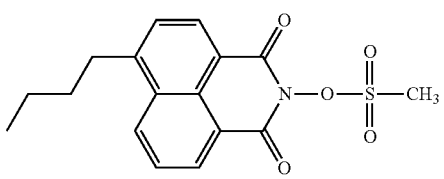
(b1-13)
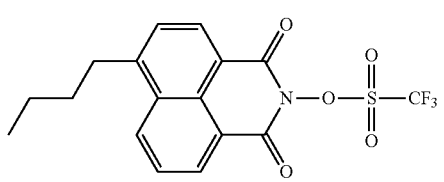
(b1-14)
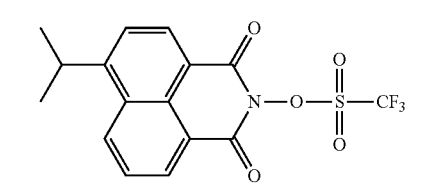
Examples of the compound represented by formula (b2) include compounds represented by the following formulas.
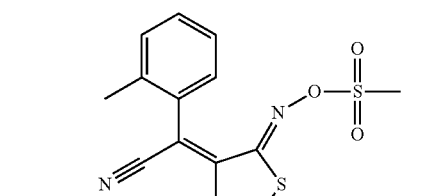
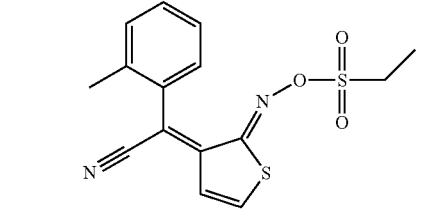
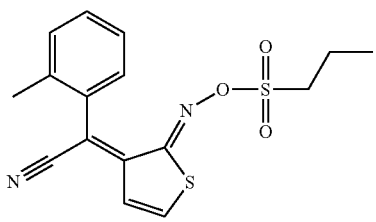
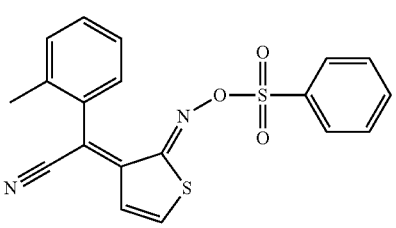
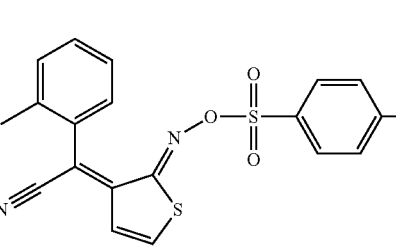
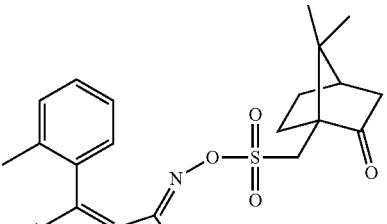
Examples of the compound represented by formula (b3) include compounds represented by the following formulas.
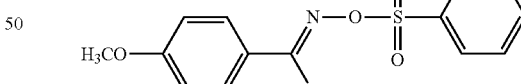
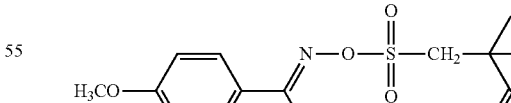
The ionic acid generator is preferably a compound represented by formula (b8) or formula (b9):

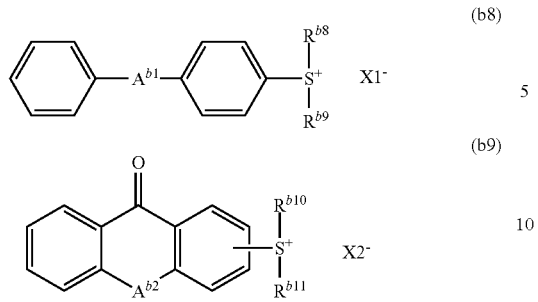

(b8)

(b9)

wherein, in formula (b8) and formula (b9), $A^{b1}$ and $A^{b2}$ each independently represent an oxygen atom or a sulfur atom, $R^{b8}$, $R^{b9}$, $R^{b10}$ and $R^{b11}$ each independently represent an alkyl group having 1 to 10 carbon atoms or an aromatic hydrocarbon group having 6 to 12 carbon atoms, and X1⁻ and X2⁻ represent an organic anion.

Examples of the alkyl group having 1 to 10 carbon atoms include a methyl group, an ethyl group, a propyl group, a butyl group, a pentyl group, a hexyl group, a heptyl group, an octyl group and the like.

Examples of the aromatic hydrocarbon group having 6 to 12 carbon atoms include aryl groups such as a phenyl group, a naphthyl group, an anthryl group, a biphenyl group and a phenanthryl group. The aromatic hydrocarbon group may further have a substituent and the aromatic hydrocarbon group having a substituent is, for example, an aromatic hydrocarbon group having an aralkyl group or an alkyl group, and specific examples thereof include a benzyl group, a phenethyl group, a phenylpropyl group, a trityl group, a naphthylmethyl group, a naphthylethyl group, a p-methylphenyl group, a p-tert-butylphenyl group, a tolyl group, a xylyl group, a cumenyl group, a mesityl group, a 2,6-diethylphenyl group, a 2-methyl-6-ethylphenyl group and the like.

$R^8$, $R^{b9}$, $R^{b10}$ and $R^{b11}$ are each preferably an aromatic hydrocarbon group having 6 to 12 carbon atoms, and more preferably a phenyl group.

Examples of the organic anion represented by X1⁻ and X2⁻ include a sulfonic acid anion, a bis(alkylsulfonyl)amide anion, a tris(alkylsulfonyl)methide anion and the like, and a sulfonic acid anion is preferable, and a sulfonic acid anion represented by formula (b10) is more preferable:

(b10)

wherein, in formula (b10), $R^{b12}$ represents a hydrocarbon group having 1 to 18 carbon atoms which may have a fluorine atom, and a methylene group included in the hydrocarbon group may be replaced by an oxygen atom or a carbonyl group.

Examples of $R^{b12}$ include the same groups as for $R^{b1}$ in formula (B1).

Examples of the compound represented by formula (b8) include the following compounds.

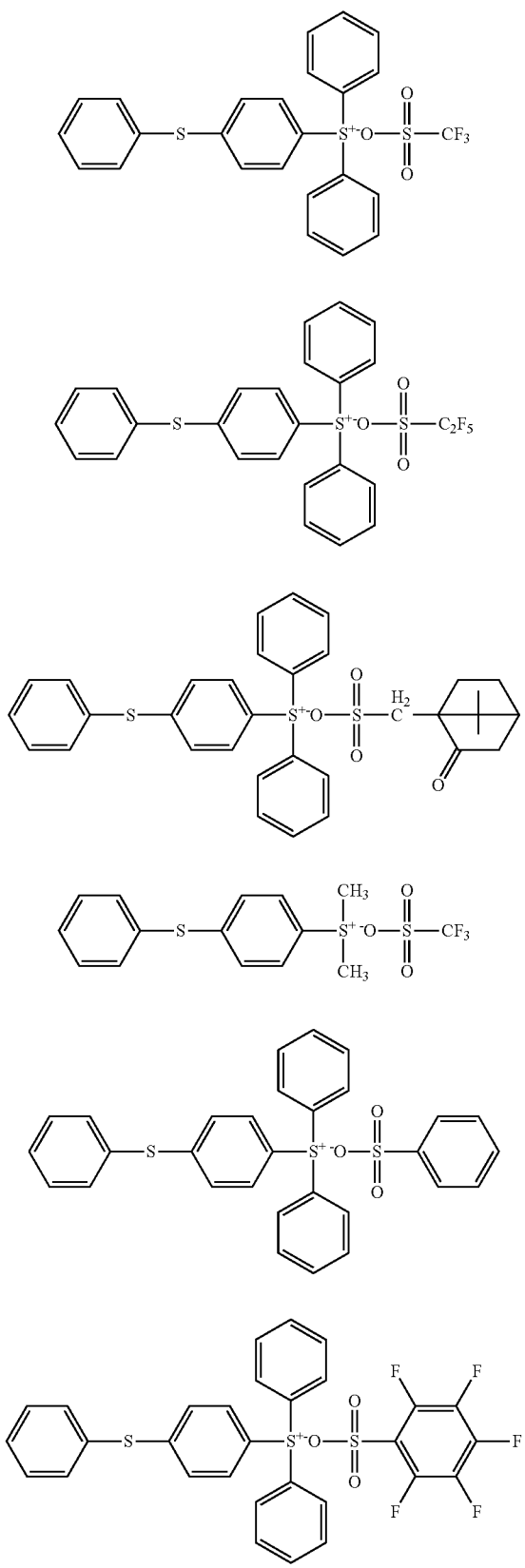

Examples of the compound represented by formula (b9) include the following compounds.

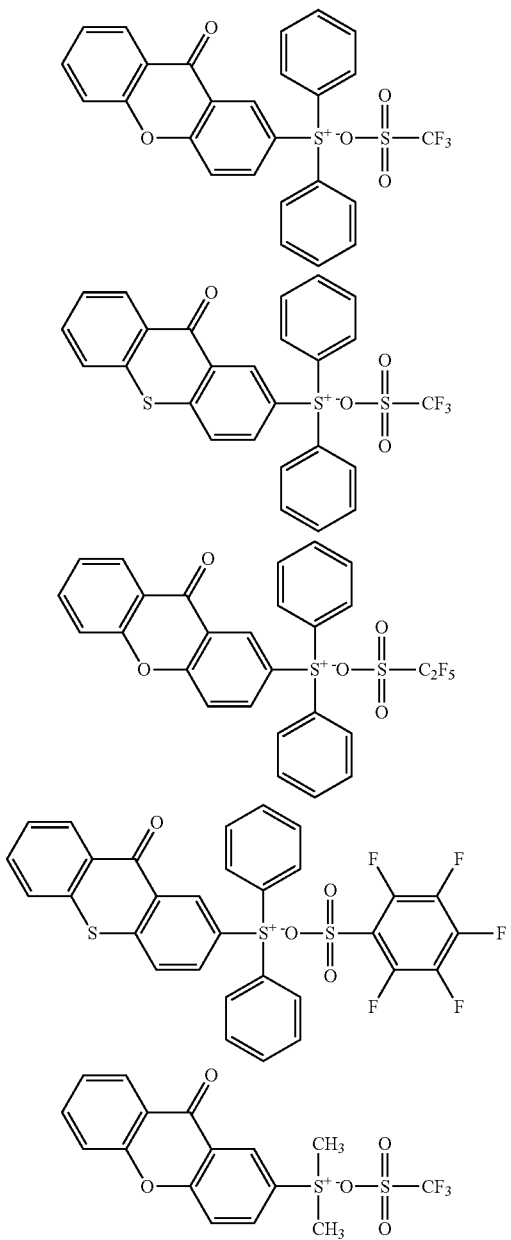

In the resist composition of the present invention, the content of the acid generator is preferably 0.1 part by mass or more and 40 parts by mass or less, more preferably 0.5 part by mass or more and 30 parts by mass or less, still more preferably 1 part by mass or more and 20 parts by mass or less, and yet more preferably 1 part by mass or more and 5 parts by mass or less, based on 100 parts by mass of the resin (A). The resist composition of the present invention may include an acid generator (B) alone, or a plurality thereof.

<Solvent (D)>

The content of the solvent (D) in the resist composition is usually 45% by mass or more, preferably 50% by mass or more, and more preferably 55% by mass or more, and is usually 99.9% by mass or less, preferably 99% by mass or less, and more preferably 90% by mass or less. The content of the solvent (E) can be measured, for example, by known analytical means such as liquid chromatography or gas chromatography.

Examples of the solvent (D) include glycol ether esters such as ethylcellosolve acetate, methylcellosolve acetate and propylene glycol monomethyl ether acetate; glycol ethers such as propylene glycol monomethyl ether; esters such as ethyl lactate, butyl acetate, amyl acetate and ethyl pyruvate; ketones such as acetone, methyl isobutyl ketone, 2-heptanone and cyclohexanone; and cyclic esters such as γ-butyrolactone. The solvent (D) may be included alone, or two or more thereof may be included.

<Quencher (C)>

The resist composition of the present invention may include a quencher (hereinafter sometimes referred to as "quencher (C)").

The quencher (C) is a compound having the action of trapping an acid generated from an acid generator upon exposure. Examples of the quencher (C) include a basic nitrogen-containing organic compound.

Examples of the basic nitrogen-containing organic compound include amine and an ammonium salt. Examples of the amine include an aliphatic amine (including primary amine, secondary amine and tertiary amine), an aromatic amine and the like.

Examples of the amine include a compound represented by formula (C1) or formula (C2):

(C1)

wherein, in formula (C1), $R^{c1}$, $R^{c2}$ and $R^{c3}$ each independently represent a hydrogen atom, an alkyl group having 1 to 6 carbon atoms, an alicyclic hydrocarbon group having 3 to 10 carbon atoms or an aromatic hydrocarbon group having 6 to 10 carbon atoms, the alkyl group having 1 to 6 carbon atoms and the alicyclic hydrocarbon group having 3 to 10 carbon atoms may have at least one selected from the group consisting of a hydroxy group, an amino group and an alkoxy group having 1 to 6 carbon atoms, and the aromatic hydrocarbon group having 6 to 10 carbon atoms may have at least one selected from the group consisting of an alkyl group having 1 to 6 carbon atoms, an alkoxy group having 1 to 6 carbon atoms and an alicyclic hydrocarbon group having 3 to 10 carbon atoms.

Examples of the alkyl group having 1 to 6 carbon atoms, the alicyclic hydrocarbon group having 3 to 10 carbon atoms, the aromatic hydrocarbon group having 6 to 10 carbon atoms and the alkoxy group having 1 to 6 carbon atoms in formula (C1) include the same as mentioned above.

Examples of the compound represented by formula (C1) include 1-naphthylamine, 2-naphthylamine, aniline, diisopropylaniline, 2-, 3- or 4-methylaniline, 4-nitroaniline, N-methylaniline, N,N-dimethylaniline, diphenylamine, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, dibutylmethylamine, methyldipentylamine, dihexylmethylamine, dicyclohexylmethylamine, diheptylmethylamine, methyldioctylamine, methyldinonylamine, didecylmethylamine, ethyldibutylamine, ethyldipentylamine, ethyldihexylamine, ethyldiheptylamine, ethyldioctylamine, ethyldinonylamine, ethyldidecylamine, tris[2-(2-methoxyethoxy)ethyl]amine, triisopropanolamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane and the like. Diisopropylaniline is preferable, and 2,6-diisopropylaniline is particularly preferable:

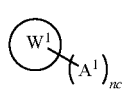
(C2)

wherein, in formula (C2), ring $W^1$ represents a heterocyclic ring having a nitrogen atom in atoms constituting the ring, or a benzene ring having a substituted or unsubstituted amino group, and the heterocyclic ring and the benzene ring may have at least one selected from the group consisting of a hydroxy group and an alkyl group having 1 to 4 carbon atoms, $A^1$ represents a phenyl group or a naphthyl group, and nc represents 2 or 3, and a plurality of $A^1$ may be the same or different.

The substituted or unsubstituted amino group is represented by —N($R^4$)($R^5$), and $R^4$ and $R^5$ each independently represent a hydrogen atom, a chain hydrocarbon group having 1 to 10 carbon atoms, an alicyclic hydrocarbon group having 3 to 10 carbon atoms or an aromatic hydrocarbon group having 6 to 14 carbon atoms.

Examples of the chain hydrocarbon group having 1 to 10 carbon atoms include alkyl groups having 1 to 10 carbon atoms such as a methyl group, an ethyl group, a propyl group, a butyl group, a pentyl group, a hexyl group, a heptyl group and an octyl group.

Examples of the alicyclic hydrocarbon group having 3 to 10 carbon atoms include groups which are the same as in $R^{a1}$ to $R^{a3}$ in formula (10).

Examples of the aromatic hydrocarbon group having 6 to 14 carbon atoms include groups which are the same as in $R^{a1'}$ to $R^{a3'}$ in formula (20).

The heterocyclic ring having a nitrogen atom in atoms constituting the ring may be either an aromatic ring or a nonaromatic ring, and may have other hetero atoms (e.g., oxygen atom, sulfur atom) together with the nitrogen atom. The number of nitrogen atoms possessed by the heterocyclic ring is, for example, 1 to 3. Examples of the heterocyclic ring include a ring represented by any one of formula (Y13) to formula (Y28). One hydrogen atom included in the ring is eliminated to form a bond with A.

(Y13)

(Y14)

(Y15)

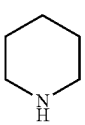
(Y16)

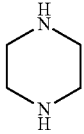
(Y17)

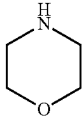
(Y18)

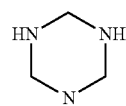
(Y19)

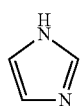
(Y20)

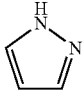
(Y21)

(Y22)

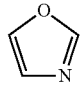
(Y23)

(Y24)

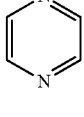
(Y25)

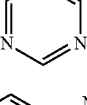
(Y26)

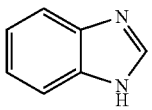
(Y27)

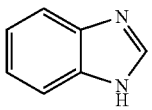
(Y28)

The ring $W^1$ is preferably a heterocyclic ring having a nitrogen atom in atoms constituting the ring, more preferably a 5- or 6-membered aromatic heterocyclic ring having a nitrogen atom in atoms constituting the ring, and still more preferably a ring represented by any one of formula (Y20) to formula (Y25).

Examples of the compound represented by formula (C2) include a compound represented by any one of formula (C2-1) to formula (C2-11). A compound represented by any one of formula (C2-2) to formula (C2-8) is preferable.

(C2-1)
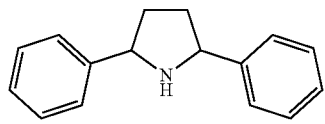

(C2-2)
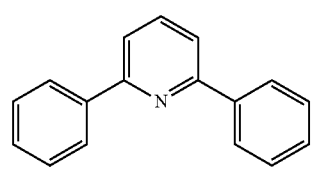

(C2-3)
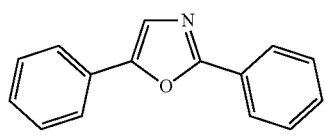

(C2-4)
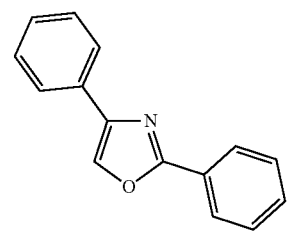

(C2-5)
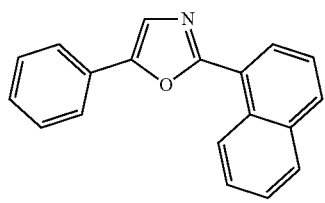

(C2-6)
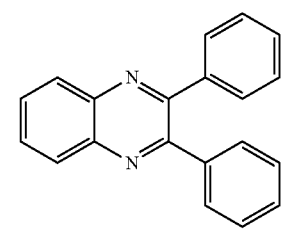

(C2-7)
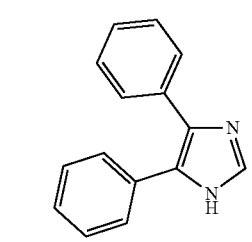

(C2-8)
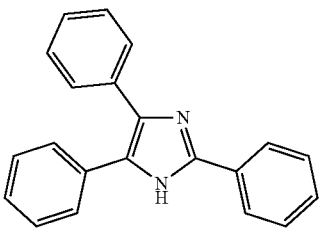

(C2-9)
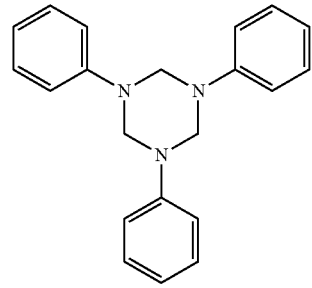

(C2-10)
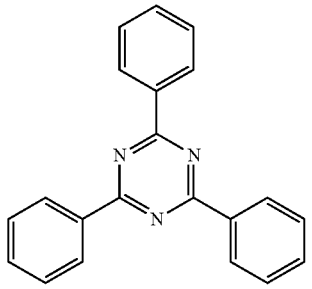

(C2-11)

The content of the quencher (C) in the solid of the resist composition is preferably 0.0001 to 5% by mass, more preferably 0.0001 to 4% by mass, still more preferably 0.001 to 3% by mass, yet more preferably 0.01 to 1.0% by mass, and further preferably 0.1 to 0.7% by mass.

<Adhesion Improver (E)>

The adhesion improver (E) is not particularly limited as long as it is possible to prevent corrosion of metal used in a substrate or wiring and/or to improve the adhesion. A rust-preventive effect is exhibited by preventing corrosion of the metal. In addition to the effect, it is possible to improve the adhesion between the substrate or the metal and the resist composition.

Examples of the adhesion improver (E) include a sulfur-containing compound, an aromatic hydroxy compound, a benzotriazole-based compound, a triazine-based compound and a silicon-containing compound. These compounds can be used alone, or two or more thereof can be used in combination.

The sulfur-containing compound may be, for example, a compound having a sulfide bond and/or a mercapto group. The sulfur-containing compound may be either a chain compound or a compound having a cyclic structure.

Examples of the chain compound include dithiodiglycerol [S(CH$_2$CH(OH)CH$_2$(OH))$_2$], bis(2,3-dihydroxypropylthio) ethylene [CH$_2$CH$_2$ (SCH$_2$CH(OH) CH$_2$ (OH))$_2$], sodium 3-(2,3-dihydroxypropylthio)-2-methyl-propylsulfoninate [CH$_2$ (OH)CH(OH)CH$_2$SCH$_2$CH(CH$_3$)CH$_2$SO$_3$Na], 1-thioglycerol [HSCH$_2$CH(OH)CH$_2$(OH)], sodium 3-mercapto-1-propanesulfonate [HSCH$_2$CH$_2$CH$_2$SO$_3$Na], 2-mercaptoethanol [HSCH$_2$CH$_2$ (OH)], thioglycolic acid [HSCH$_2$CO$_2$H], 3-mercapto-1-propanol [HSCH$_2$CH$_2$CH$_2$] and the like.

The sulfur-containing compound is preferably a compound having a sulfide bond and a mercapto group, and more preferably a heterocyclic compound having a sulfide bond and a mercapto group. The heterocyclic compound is more preferably a heterocyclic compound having a sulfide bond in ring constitution. In the sulfur-containing compound, the number of sulfide bonds and mercapto groups is not particularly limited, and may be 1 or more.

The heterocyclic ring in the heterocyclic compound may be either a monocyclic or polycyclic ring, or may be either a saturated or unsaturated ring. It is preferable that the heterocyclic ring further has a hetero atom other than a sulfur atom. Examples of the hetero atom include an oxygen atom and a nitrogen atom, and a nitrogen atom is preferable.

The heterocyclic ring is preferably a heterocyclic ring having 2 to 12 carbon atoms, and more preferably a heterocyclic ring having 2 to 6 carbon atoms. The heterocyclic ring is preferably monocyclic. The heterocyclic ring is preferably unsaturated. The heterocyclic ring is preferably unsaturated and monocyclic.

Examples of the heterocyclic ring include the following heterocyclic rings.

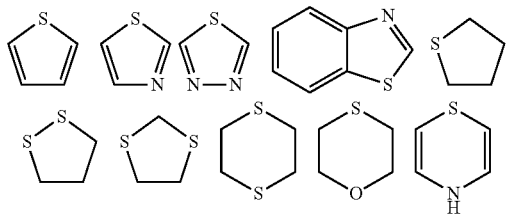

The sulfur-containing compound may be a polymer. This polymer preferably has a structure having a sulfide bond and a mercapto group in the side chain. A structure having a sulfide bond and a mercapto group (hereinafter sometimes referred to as unit (1)) and a main chain are preferably bonded together with a linking group such as an amide bond, an ether bond, a thioether bond, and an ester bond.

The polymer may be either a homopolymer or a copolymer.

When the polymer is a copolymer, the copolymer may include the above-mentioned structural unit having an acid-labile group (a1) and structural unit having no acid-labile group (a2).

The weight-average molecular weight of the homopolymer and the copolymer is usually 3,000 or more, preferably 5,000 or more, usually 100,000 or less, and preferably 50,000 or less. The weight-average molecular weight is a value determined by gel permeation chromatography using polystyrene as the standard product.

When the sulfur-containing compound is a polymer, the content of the structural unit having a sulfide bond and a mercapto group is usually 0.1 to 50 mol %, preferably 0.5 to 30 mol %, and more preferably 1 to 20 mol %, based on all structural units of the polymer of the sulfur-containing compound.

The sulfur-containing compound is preferably, for example, a compound represented by formula (IA) or a polymer having a structural unit represented by formula (IB):

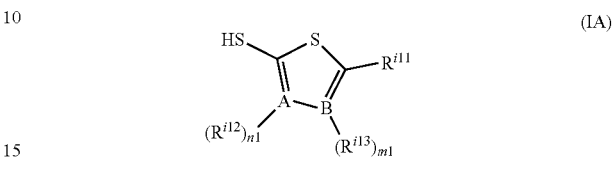

wherein, in formula (IA),

R$^{i11}$ represents a hydrogen atom, a chain hydrocarbon group having 1 to 10 carbon atoms, an aromatic hydrocarbon group having 6 to 14 carbon atoms, an alicyclic hydrocarbon group having 3 to 18 carbon atoms, a group represented by —SR$^{11}$, or a group represented by —NR$^{12}$R$^{13}$, R$^{11}$, R$^{12}$ and R$^{13}$ each independently represent a hydrogen atom, a chain hydrocarbon group having 1 to 10 carbon atoms, an aromatic hydrocarbon group having 6 to 14 carbon atoms, an alicyclic hydrocarbon group having 3 to 10 carbon atoms, or an acyl group having 2 to 12 carbon atoms, and these chain hydrocarbon group, aromatic hydrocarbon group, alicyclic hydrocarbon group and acyl group may have a hydroxy group, R$^{i12}$ and R$^{i13}$ each independently represent a hydrogen atom, a chain hydrocarbon group having 1 to 10 carbon atoms, an aromatic hydrocarbon group having 6 to 14 carbon atoms, or an alicyclic hydrocarbon group having 3 to 18 carbon atoms, A and B each independently represent a nitrogen atom or a carbon atom, and n1 and m1 each independently represent 0 or 1, in which, when A is a nitrogen atom, n1 represents 0, when A is a carbon atom, n1 represents 1, when B is a nitrogen atom, m1 represents 0, and when B is a carbon atom, m1 represents 1.

Examples of the chain hydrocarbon group having 1 to 10 carbon atoms include alkyl groups having 1 to 10 carbon atoms such as a methyl group, an ethyl group, a propyl group, a butyl group, a pentyl group, a hexyl group, a heptyl group and an octyl group.

Examples of the aromatic hydrocarbon group having 6 to 14 carbon atoms include aryl groups having 6 to 14 carbon atoms such as a phenyl group, a naphthyl group, an anthryl group, a biphenyl group and a phenanthryl group. The aromatic hydrocarbon group may further have a substituent and the aromatic hydrocarbon group having a substituent is, for example, an aromatic hydrocarbon group having an aralkyl group or an alkyl group, and specific examples thereof include a benzyl group, a phenethyl group, a phenylpropyl group, a trityl group, a naphthylmethyl group, a naphthylethyl group, a p-methylphenyl group, a p-tert-butylphenyl group, a tolyl group, a xylyl group, a cumenyl group, a mesityl group, a 2,6-diethylphenyl group, a 2-methyl-6-ethylphenyl group and the like.

Examples of the alicyclic hydrocarbon group having 3 to 18 carbon atoms include monocyclic alicyclic hydrocarbon groups, for example, cycloalkyl groups such as a cyclopentyl group, a cyclohexyl group, a cycloheptyl group and a cyclooctyl group; and polycyclic alicyclic hydrocarbon groups such as a decahydronaphthyl group, an adamantyl group and a norbornyl group.

$R^{i1}$ is preferably a chain hydrocarbon group having 1 to 10 carbon atoms or an acyl group having 2 to 12 carbon atoms, and it is preferable that $R^{i2}$ and $R^{i3}$ each independently represent a hydrogen atom, a chain hydrocarbon group having 1 to 10 carbon atoms, an aromatic hydrocarbon group having 6 to 14 carbon atoms or an acyl group having 2 to 12 carbon atoms.

Examples of the acyl group having 2 to 12 carbon atoms include an acetyl group, a propionyl group, a butyryl group, a valeryl group, a hexylcarbonyl group, a heptylcarbonyl group, an octylcarbonyl group, a decylcarbonyl group, a dodecylcarbonyl group, a benzoyl group and the like.

$R^{i11}$ is more preferably a hydrogen atom or a mercapto group.

$R^{i12}$ and $R^{i13}$ each independently represent preferably a hydrogen atom or an alkyl group having 1 to 4 carbon atoms, and more preferably a hydrogen atom.

It is preferable that at least one of A and B is a nitrogen atom, and it is more preferable that both of them are a nitrogen atom:

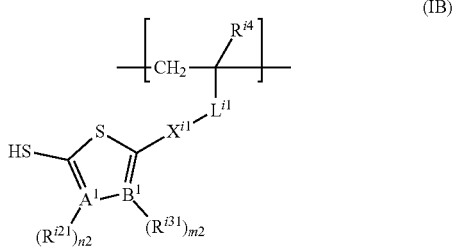
(IB)

wherein, in formula (IB), $R^{i21}$ and $R^{i31}$ each independently represent a hydrogen atom, a chain hydrocarbon group having 1 to 10 carbon atoms, an aromatic hydrocarbon group having 6 to 14 carbon atoms or an alicyclic hydrocarbon group having 3 to 18 carbon atoms, A1 and B1 each independently represent a nitrogen atom or a carbon atom, n2 and m2 each independently represent 0 or 1, in which, when A1 is a nitrogen atom, n2 represents 0, when A1 is a carbon atom, n2 represents 1, when B1 is a nitrogen atom, m2 represents 0, and when B1 is a carbon atom, m2 represents 1, $R^{i4}$ represents a hydrogen atom or a methyl group, $X^{i1}$ represents a sulfur atom and an NH group, and $L^{i1}$ represents a divalent hydrocarbon group having 1 to 20 carbon atoms, and a methylene group included in the hydrocarbon group may be replaced by an oxygen atom or a carbonyl group.

Examples of the chain hydrocarbon group having 1 to 10 carbon atoms as for $R^{i21}$ and $R^{i31}$ include alkyl groups having 1 to 10 carbon atoms such as a methyl group, an ethyl group, a propyl group, a butyl group, a pentyl group, a hexyl group, a heptyl group and an octyl group, and an alkyl group having 1 to 4 carbon atoms is preferable.

Examples of the aromatic hydrocarbon group having 6 to 14 carbon atoms as for $R^{i21}$ and $R^{i31}$ include aryl groups having 6 to 14 carbon atoms such as a phenyl group, a naphthyl group, an anthryl group, a biphenyl group and a phenanthryl group, and an aryl group having 6 to 10 carbon atoms is preferable. The aromatic hydrocarbon group may further have a substituent and the aromatic hydrocarbon group having a substituent is, for example, an aromatic hydrocarbon group having an aralkyl group or an alkyl group, and specific examples thereof include a benzyl group, a phenethyl group, a phenylpropyl group, a trityl group, a naphthylmethyl group, a naphthylethyl group, a p-methylphenyl group, a p-tert-butylphenyl group, a tolyl group, a xylyl group, a cumenyl group, a mesityl group, a 2,6-diethylphenyl group, a 2-methyl-6-ethylphenyl group and the like.

Examples of the alicyclic hydrocarbon group having 3 to 18 carbon atoms as for $R^{i21}$ and $R^{i31}$ include monocyclic alicyclic hydrocarbon groups, for example, cycloalkyl groups having 3 to 18 carbon atoms such as a cyclopentyl group, a cyclohexyl group, a cycloheptyl group and a cyclooctyl group; and polycyclic alicyclic hydrocarbon groups such as a decahydronaphthyl group, an adamantyl group and a norbornyl group, and an alicyclic hydrocarbon group having 5 to 10 carbon atoms is preferable.

It is preferable that $R^{i21}$ and $R^{i31}$ each independently represent a hydrogen atom or an alkyl group having 1 to 4 carbon atoms.

Examples of the divalent hydrocarbon group having 1 to 20 carbon atoms represented by $L^{i1}$ include alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group and a heptadecane-1,17-diyl group, an ethane-1,1-diyl group, a propane-1,1-diyl group, a propane-1,2-diyl group, a propane-2,2-diyl group, a pentane-2,4-diyl group, a 2-methylpropane-1,3-diyl group, a 2-methylpropane-1,2-diyl group, a pentane-1,4-diyl group and a 2-methylbutane-1,4-diyl group;

monocyclic divalent alicyclic saturated hydrocarbon groups, for example, cycloalkanediyl groups such as a cyclobutane-1,3-diyl group, a cyclopentane-1,3-diyl group, a cyclohexane-1,4-diyl group and a cyclooctane-1,5-diyl group;

polycyclic divalent alicyclic saturated hydrocarbon groups such as a norbornane-1,4-diyl group, a norbornane-2,5-diyl group, an adamantane-1,5-diyl group and an adamantane-2,6-diyl group; and arylene groups such as a phenylene group, a tolylene group and a naphthylene group.

$L^{i1}$ is preferably an alkanediyl group having 2 to 14 carbon atoms having an ester bond, or a group obtained by combining an arylene group having 6 to 10 carbon atoms with an alkanediyl group having 1 to 11 carbon atoms.

The structural unit represented by formula (IB) is preferably a structural unit represented by formula (IB-1) or a structural unit represented by formula (IB-2):

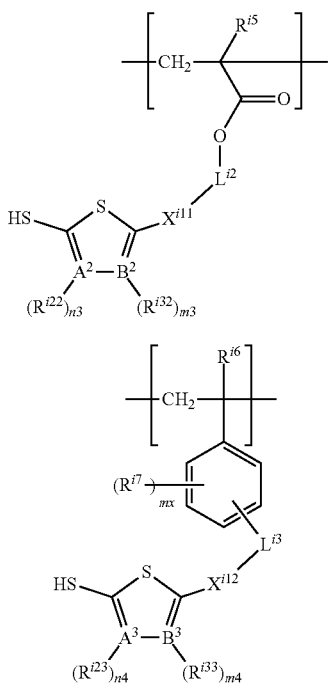

wherein, in formula (IB-1), $R^{i22}$ and $R^{i32}$ each independently represent a hydrogen atom, a chain hydrocarbon group having 1 to 10 carbon atoms, an aromatic hydrocarbon group having 6 to 14 carbon atoms or an alicyclic hydrocarbon group having 3 to 18 carbon atoms, $A^2$ and $B^3$ each independently represent a nitrogen atom or a carbon atom, n3 and m3 each independently represent 0 or 1, in which, when $A^2$ is a nitrogen atom, n3 represents 0, when $A^2$ is a carbon atom, n3 represents 1, when $B^2$ is a nitrogen atom, m3 represents 0, and when $B^2$ is a carbon atom, m3 represents 1, $X^{i11}$ represents a sulfur atom and an NH group, $L^{i2}$ represents a divalent hydrocarbon group having 1 to 18 carbon atoms, and a methylene group included in the hydrocarbon group may be replaced by an oxygen atom or a carbonyl group, $R^{i5}$ represents a hydrogen atom or a methyl group:
wherein, in formula (IB-2), $R^{i23}$ and $R^{i33}$ each independently represent a hydrogen atom, a chain hydrocarbon group having 1 to 10 carbon atoms, an aromatic hydrocarbon group having 6 to 14 carbon atoms or an alicyclic hydrocarbon group having 3 to 18 carbon atoms, $A^3$ and $B^3$ each independently represent a nitrogen atom or a carbon atom, n4 and m4 each independently represent 0 or 1, in which, and when $A^3$ is a nitrogen atom, n4 represents 0, when $A^3$ is a carbon atom, n4 represents 1, when $B^3$ is a nitrogen atom, m4 represents 0, and when $B^3$ is a carbon atom, m4 represents 1, $X^{i12}$ represents a sulfur atom and an NH group, $L^{i3}$ represents a divalent hydrocarbon group having 1 to 14 carbon atoms, and a methylene group included in the hydrocarbon group may be replaced by an oxygen atom or a carbonyl group, $R^{i7}$ represents an alkyl group having 1 to 6 carbon atoms or an alkoxy group having 1 to 6 carbon atoms, $R^{i6}$ represents a hydrogen atom or a methyl group, and mx represents an integer of 0 to 4.

Examples of the chain hydrocarbon group having 1 to 10 carbon atoms represented by $R^{i22}$, $R^{i32}$, $R^{i23}$ and $R^{i33}$ include those which are the same as the chain hydrocarbon group having 1 to 10 carbon atoms represented by $R^{i21}$ and $R^{i31}$.

Examples of the aromatic hydrocarbon group having 6 to 14 carbon atoms represented by $R^{i22}$, $R^{i32}$, $R^{i23}$ and $R^{i33}$ include those which are the same as the aromatic hydrocarbon group having 6 to 14 carbon atoms represented by $R^{i21}$ and $R^{i31}$.

Examples of the alicyclic hydrocarbon group having 3 to 18 carbon atoms represented by $R^{i22}$, $R^{i32}$, $R^{i23}$ and $R^{i33}$ include those which are the same as the alicyclic hydrocarbon group having 3 to 18 carbon atoms represented by $R^{i21}$ and $R^{i31}$.

Examples of the divalent hydrocarbon group having 1 to 18 carbon atoms represented by $L^{i2}$ include alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, a heptadecane-1,17-diyl group, an ethane-1,1-diyl group, a propane-1,1-diyl group, a propane-1,2-diyl group, a propane-2,2-diyl group, a pentane-2,4-diyl group, a 2-methylpropane-1,3-diyl group, a 2-methylpropane-1,2-diyl group, a pentane-1,4-diyl group and a 2-methylbutane-1,4-diyl group;

monocyclic divalent alicyclic saturated hydrocarbon groups, for example, cycloalkanediyl groups such as a cyclobutane-1,3-diyl group, a cyclopentane-1,3-diyl group, a cyclohexane-1,4-diyl group and a cyclooctane-1,5-diyl group;

polycyclic divalent alicyclic saturated hydrocarbon groups such as a norbornane-1,4-diyl group, a norbornane-2,5-diyl group, an adamantane-1,5-diyl group and an adamantane-2,6-diyl group; and arylene groups such as a phenylene group, a tolylene group and a naphthylene group.

$L^{i2}$ is preferably an alkanediyl group having 1 to 14 carbon atoms, and more preferably an alkanediyl group having 1 to 11 carbon atoms.

Examples of the divalent hydrocarbon group having 1 to 14 carbon atoms represented by $L^{i3}$ include alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, an ethane-1,1-diyl group, a propane-1,1-diyl group, a propane-1,2-diyl group, a propane-2,2-diyl group, a pentane-2,4-diyl group, a 2-methylpropane-1,3-diyl group, a 2-methylpropane-1,2-diyl group, a pentane-1,4-diyl group and a 2-methylbutane-1,4-diyl group;

monocyclic divalent alicyclic saturated hydrocarbon groups, for example, cycloalkanediyl groups such as a cyclobutane-1,3-diyl group, a cyclopentane-1,3-diyl group, a cyclohexane-1,4-diyl group and a cyclooctane-1,5-diyl group; and polycyclic divalent alicyclic saturated hydrocarbon groups such as a norbornane-1,4-diyl group, a norbornane-2,5-diyl group, an adamantane-1,5-diyl group and an adamantane-2,6-diyl group.

$L^{i3}$ is preferably an alkanediyl group having 1 to 14 carbon atoms, and more preferably an alkanediyl group having 1 to 11 carbon atoms.

It is preferable that $L^{i3}$ is bonded to the p-position based on the site of bonding to the main chain in the phenyl group.

Examples of the alkyl group having 1 to 6 carbon atoms represented by $R^{i7}$ include a methyl group, an ethyl group, a propyl group, an isopropyl group and the like.

Examples of the alkoxy group having 1 to 6 carbon atoms represented by $R^{i7}$ include a methoxy group, an ethoxy group, a propoxy group, a butoxy group and the like.

Examples of the sulfur-containing compound include a compound represented by any one of a compound represented by formula (I-1) to a compound represented by formula (I-26). Of these, a compound represented by formula (I-1) to a compound represented by formula (I-13) are preferable, and a compound represented by formula (I-1), a compound represented by formula (I-4) and a compound represented by formula (I-11) are more preferable.

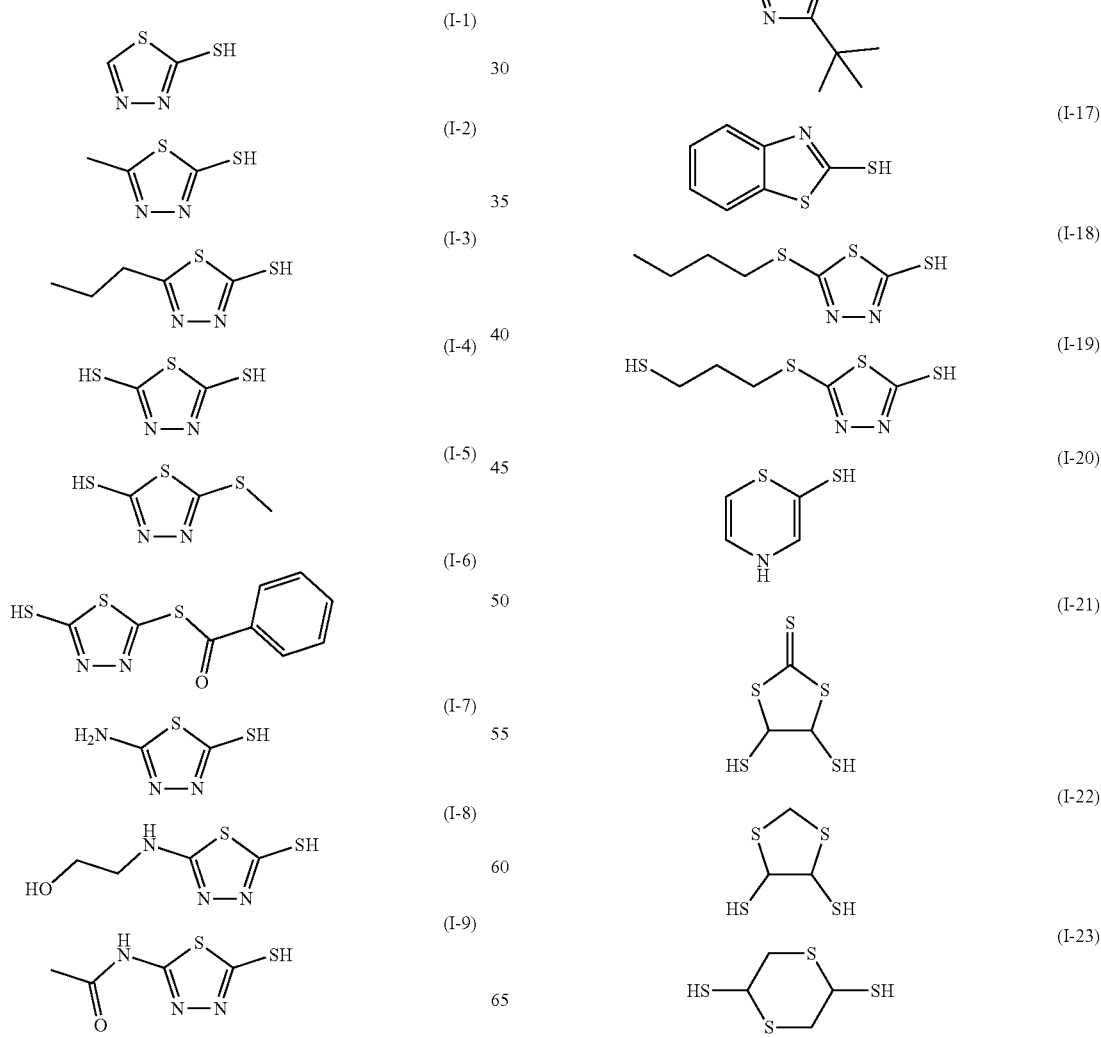

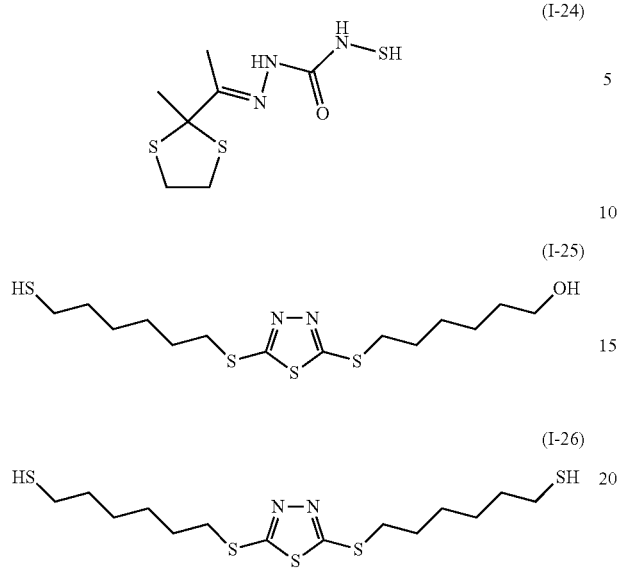

(I-24)
(I-25)
(I-26)

Examples of the sulfur-containing compound include a homopolymer composed of any one of a structural unit among structural units represented by formula (I-27) to formula (I-38), or a copolymer including one or more of these structural units.

A copolymer including one or more structural units represented by formula (I-27) to formula (I-36) is preferable, and a copolymer including a structural unit represented by formula (I-33) is more preferable.

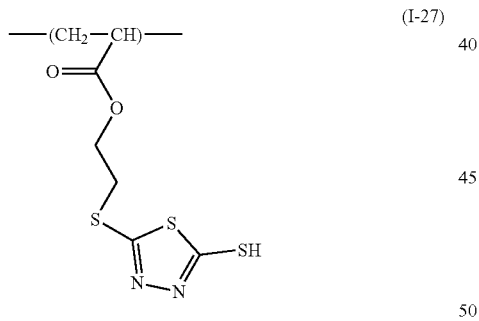

(I-27)

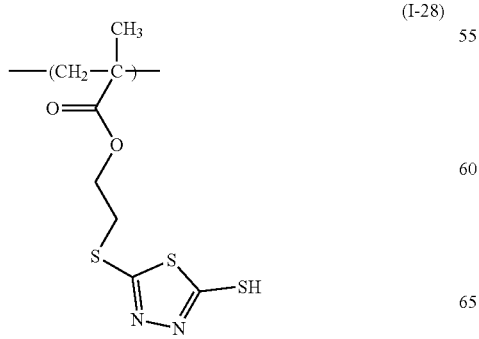

(I-28)

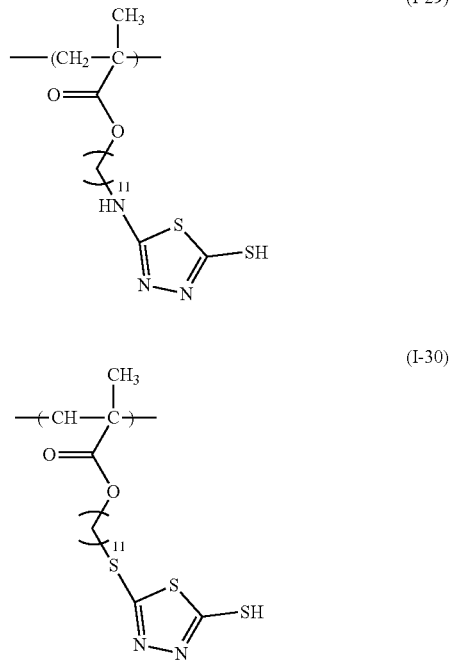

(I-29)
(I-30)
(I-31)

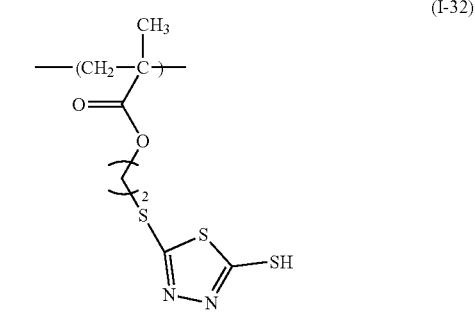

(I-32)
(I-33)

(I-34)
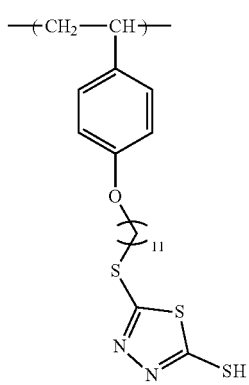
(I-35)
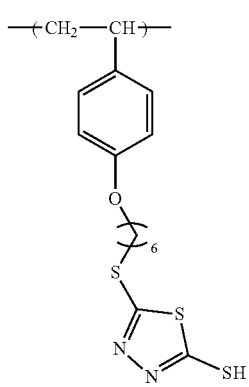
(I-36)
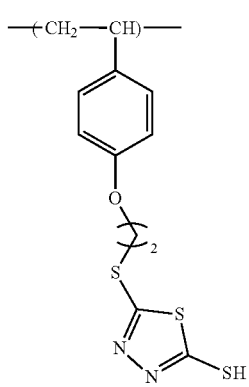
(I-37)
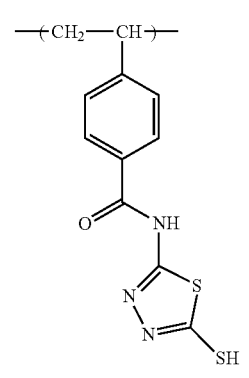
(I-38)
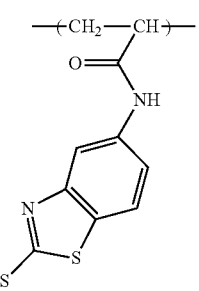
Examples of such copolymer include a copolymer composed of structural units represented by formula (I-39) to formula (I-48). Of these, a polymer including structural units represented by formula (I-39) to formula (I-44) is preferable.
(I-39)
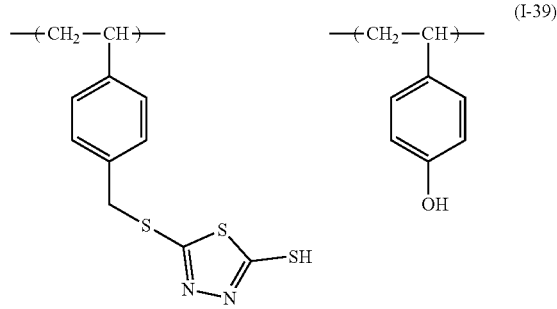
(I-40)
(I-41)
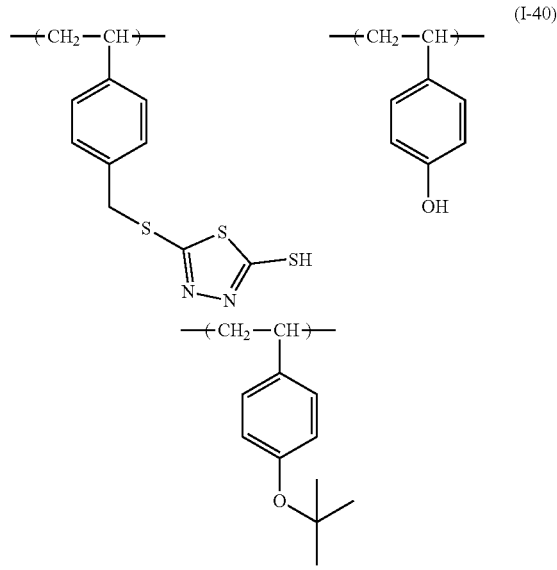
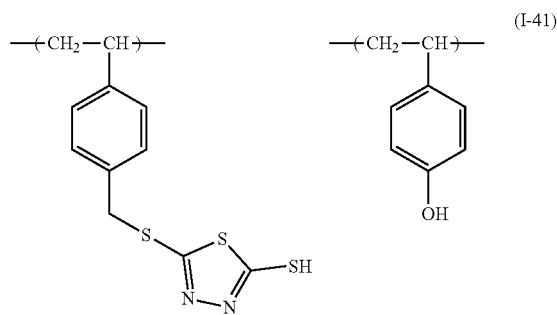

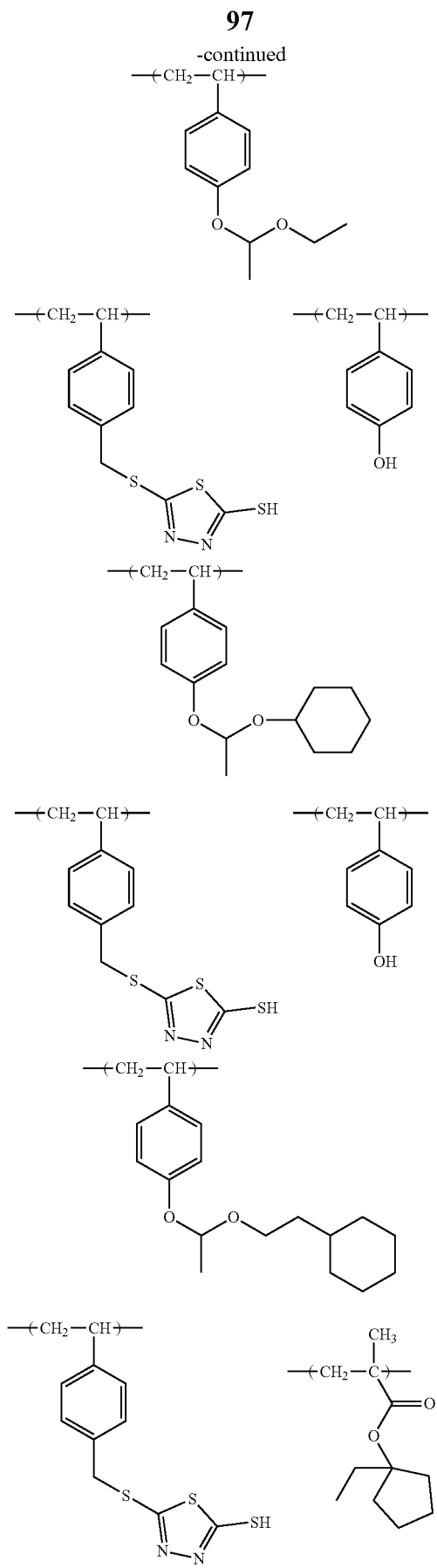
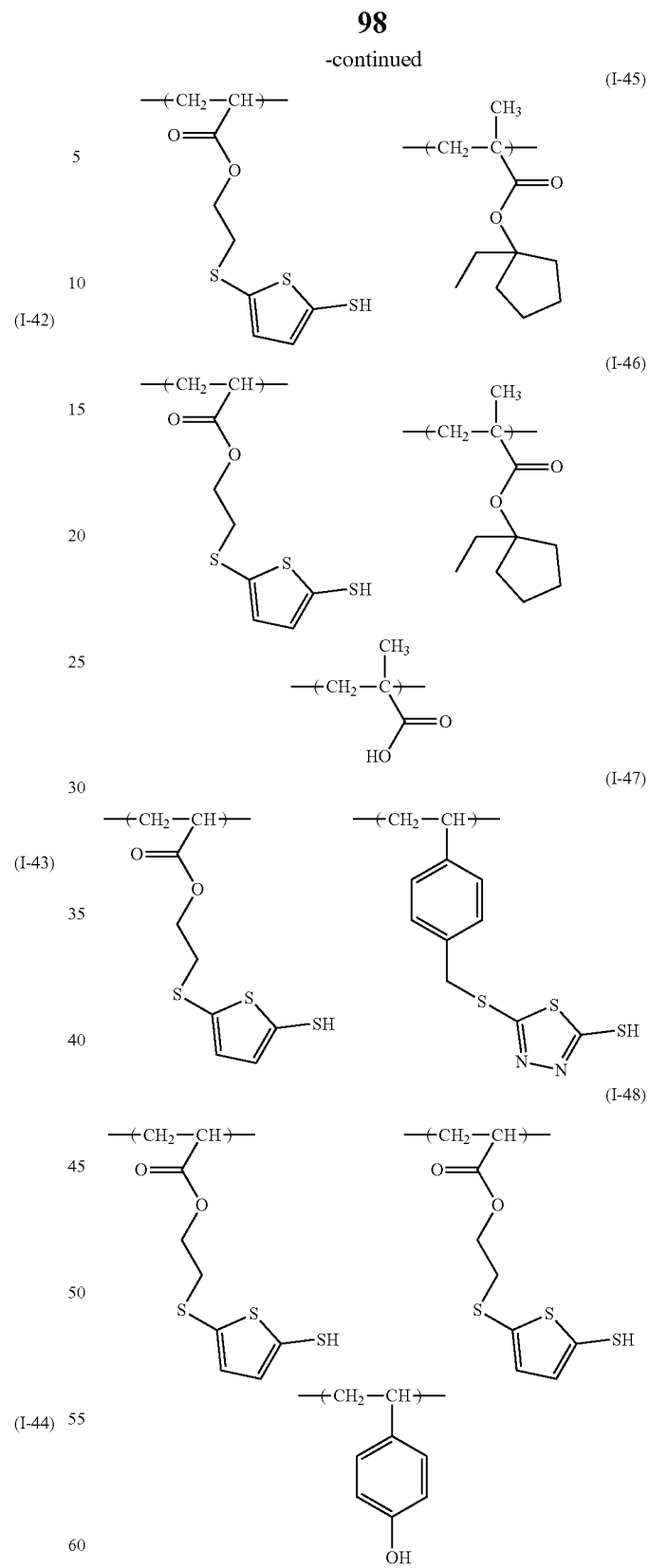
The sulfur-containing compound may be either those obtained by synthesizing using a known method (e.g., JP 2010-79081 A) or commercially available products. The polymer including a sulfur-containing compound may be commercially available products (e.g., Bismuththiol (manufactured by Tokyo Chemical Industry Co., Ltd.) or those obtained by synthesizing using a known method (e.g., JP 2001-75277 A).

Examples of the aromatic hydroxy compound include phenol, cresol, xylenol, pyrocatechol (=1,2-dihydroxybenzene), tert-butylcatechol, resorcinol, hydroquinone, pyrogallol, 1,2,4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, aminoresorcinol, p-hydroxybenzoic acid, o-hydroxybenzoic acid, 2,4-dihydroxybenzoic acid, 2,5-dihydroxybenzoic acid, 3,4-dihydroxybenzoic acid, 3,5-dihydroxybenzoic acid, gallic acid and the like.

Examples of the benzotriazole-based compound include a compound represented by formula (IX):

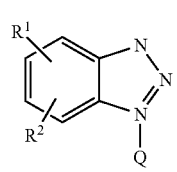

(IX)

wherein, in formula (IX), $R^1$ and $R^2$ each independently represent a hydrogen atom, a hydrocarbon group having 1 to 10 carbon atoms which may have a substituent, a carboxy group, an amino group, a hydroxy group, a cyano group, a formyl group, a sulfonylalkyl group or a sulfo group, Q represents a hydrogen atom, a hydroxy group, a hydrocarbon group having 1 to 10 carbon atoms which may have a substituent, an aryl group or —$R^{3X}$—N($R^4$) ($R^{5X}$), and the hydrocarbon group may have an amide bond or an ester bond in the structure, $R^{3X}$ represents an alkanediyl group having 1 to 6 carbon atoms, and  represents a bond with a nitrogen atom included in the ring, and $R^{4X}$ and $R^{5X}$ each independently represent a hydrogen atom, a hydroxy group, an alkyl group having 1 to 6 carbon atoms, a hydroxyalkyl group having 1 to 6 carbon atoms or an alkoxyalkyl group having 2 to 6 carbon atoms.

The hydrocarbon group having 1 to 10 carbon atoms as for $R^1$, $R^2$ and Q may be either an aliphatic hydrocarbon group having 1 to 10 carbon atoms or an aromatic hydrocarbon group having 6 to 10 carbon atoms, or may have a saturated and/or unsaturated bond.

The aliphatic hydrocarbon group having 1 to 10 carbon atoms is preferably an alkyl group, and examples of the alkyl group include a methyl group, an ethyl group, an n-propyl group, an isopropyl group, an n-butyl group, a sec-butyl group, a tert-butyl group, an n-pentyl group, a methylpentyl group, an n-hexyl group, an n-heptyl group and the like.

The aromatic hydrocarbon group having 6 to 10 carbon atoms is preferably an aryl group, and examples of the aryl group include a phenyl group, a naphthyl group, an anthryl group, a biphenyl group, a phenanthryl group and the like.

The aromatic hydrocarbon group may further have a substituent and the aromatic hydrocarbon group having a substituent is, for example, an aromatic hydrocarbon group having an aralkyl group or an alkyl group, and specific examples thereof include a benzyl group, a phenethyl group, a phenylpropyl group, a trityl group, a naphthylmethyl group, a naphthylethyl group, a p-methylphenyl group, a p-tert-butylphenyl group, a tolyl group, a xylyl group, a cumenyl group, a mesityl group, a 2,6-diethylphenyl group, a 2-methyl-6-ethylphenyl group and the like.

Examples of the substituent which may be possessed by the hydrocarbon group having 1 to 10 carbon atoms include a hydroxyalkyl group, an alkoxyalkyl group and the like.

The alkanediyl group having 1 to 6 carbon atoms as for $R^{3X}$ may be either linear or branched, and examples thereof include a methylene group, an ethylene group, a propane-1,3-diyl group, a propane-1,2-diyl group and the like.

Examples of the alkyl group having 1 to 6 carbon atoms as for $R^{4X}$ and $R^{5X}$ include a methyl group, an ethyl group, a propyl group, an isopropyl group and the like.

Examples of the hydroxyalkyl group having 1 to 6 carbon atoms as for $R^{4X}$ and $R^{5X}$ include a hydroxymethyl group, a hydroxyethyl group, a dihydroxyethyl group and the like.

Examples of the alkoxyalkyl group having 2 to 6 carbon atoms as for $R^{4X}$ and $R^{5X}$ include a methoxymethyl group, a methoxyethyl group, a dimethoxyethyl group and the like.

When the resist composition of the present invention is applied to a substrate with Cu formed thereon, preferred is a compound in which Q is represented by **—$R^{3X}$—N($R^{4X}$) ($R^{5X}$) in formula (IX). Particularly, when at least one of RX and $R^{5X}$ is an alkyl group having 1 to 6 carbon atoms, a benzotriazole-based compound is preferably used when other components capable of dissolving this compound exist, although the water solubility deteriorates.

When the resist composition of the present invention is applied to a substrate having an inorganic material layer (e.g., polysilicon film, amorphous silicon film, etc.), preferred are those in which Q represents a water-soluble group in formula (IX). Specifically, preferred are a hydrogen atom, an alkyl group having 1 to 3 carbon atoms, a hydroxyalkyl group having 1 to 3 carbon atoms, a hydroxy group and the like. Thus, it is possible to more effectively exhibit the anticorrosion property of the substrate.

Examples of the benzotriazole-based compound include benzotriazole, 5,6-dimethylbenzotriazole, 1-hydroxybenzotriazole, 1-methylbenzotriazole, 1-aminobenzotriazole, 1-phenylbenzotriazole, 1-hydroxymethylbenzotriazole, methyl 1-benzotriazolecarboxylate, 5-benzotriazolecarboxylic acid, 1-methoxy-benzotriazole, 1-(2,2-dihydroxyethyl)-benzotriazole, 1-(2,3-dihydroxypropyl)benzotriazole, or 2,2'-{[(4-methyl-1H-benzotriazol-1-yl)methyl]imino}bisethanol, 2,2'-{[(5-methyl-1H-benzotriazol-1-yl)methyl]imino}bisethanol, 2,2'-{[(4-methyl-1H-benzotriazol-1-yl)methyl]imino}bisethane, 2,2'-{[(4-methyl-1H-benzotriazol-1-yl)methyl]imino}bispropane and the like.

Examples of the triazine-based compound include a compound represented by formula (II):

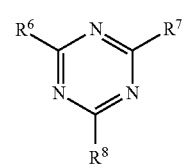

(II)

wherein, in formula (II), $R^6$, $R^7$ and $R^8$ each independently represent a halogen, a hydrogen atom, a hydroxy group, an amino group, a mercapto group, a hydrocarbon group having 1 to 10 carbon atoms which may be substituted, an alkoxy group having 1 to 10 carbon atoms which may be substituted, or a hydrocarbon group-substituted amino group having 1 to 10 carbon atoms.

Examples of the halogen atom include a fluorine atom, a chlorine atom, a bromine atom and an iodine atom.

Examples of the hydrocarbon group having 1 to 10 carbon atoms include those which are the same as mentioned above.

Examples of the alkoxy group having 1 to 10 carbon atoms include a methoxy group, an ethoxy group, a propoxy group and the like.

Examples of the triazine-based compound include 1,3,5-triazine-2,4,6-trithiol and the like.

Examples of the silicon-containing compound include a compound represented by formula (IIA):

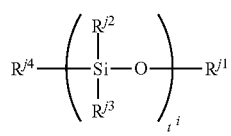

(IIA)

wherein, in formula (IIA), $R^{j1}$ represents an aliphatic hydrocarbon group having 1 to 5 carbon atoms or a mercaptoalkyl group having 1 to 5 carbon atoms, $R^{j2}$ to $R^{j4}$ each independently represent an aliphatic hydrocarbon group having 1 to 5 carbon atoms, an alkoxy group having 1 to 5 carbon atoms, a mercapto group or a mercaptoalkyl group having 1 to 5 carbon atoms, and at least one of $R^{j2}$ to $R^{j4}$ is a mercapto group or a mercaptoalkyl group having 1 to 5 carbon atoms, and $t^i$ represents an integer of 1 to 10.

Examples of the aliphatic hydrocarbon group having 1 to 5 carbon atoms include alkyl groups having 1 to 5 carbon atoms such as a methyl group, an ethyl group, a propyl group, a butyl group and a pentyl group.

Examples of the alkoxy group having 1 to 5 carbon atoms include a methoxy group, an ethoxy group and the like.

Examples of the mercaptoalkyl group having 1 to 5 carbon atoms include a methylmercapto group, an ethylmercapto group, a propylmercapto group and the like.

$R^{j1}$ is preferably a methyl group, an ethyl group or a mercaptoalkyl group having 1 to 3 carbon atoms, and more preferably a methyl group or a mercaptopropyl group (particularly, a 3-mercaptopropyl group).

$R^{j2}$ to $R^{j4}$ each independently represent preferably a methyl group, an ethyl group, a methoxy group or an ethoxy group, and more preferably a methyl group or a methoxy group. At least one of these groups is preferably a mercapto group or a mercaptoalkyl group having 1 to 3 carbon atoms, and more preferably a mercapto group or a mercaptopropyl group.

$R^{j2}$ and $R^{j3}$ may be the same or different from each other and is preferably the same from the viewpoint of the productivity.

Examples of the compound of formula (IIA) include compounds represented by the following formula (II-1) to formula (II-7).

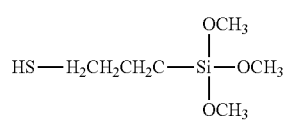

(II-1)

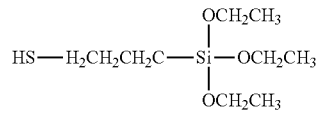

(II-2)

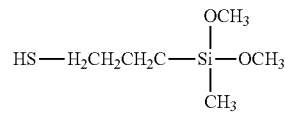

(II-3)

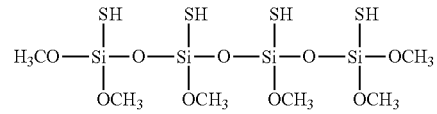

(II-4)

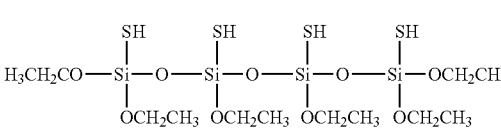

(II-5)

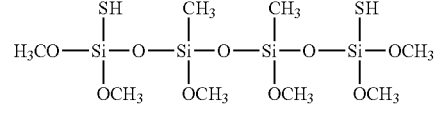

(II-6)

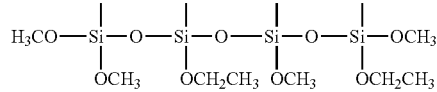

(II-7)

Of these, 3-mercaptopropyltrimethoxysilane, 3-mercaptopropyltriethoxysilane and the like are preferable.

The content of the adhesion improver (E) is preferably 0.001% by mass or more, more preferably 0.002% by mass or more, still more preferably 0.005% by mass or more, and particularly preferably 0.008% by mass or more, and is preferably 20% by mass or less, more preferably 10% by mass or less, still more preferably 4% by mass or less, yet more preferably 3% by mass or less, further preferably 1% by mass or less, and particularly preferably 0.1% by mass or less, based on the total amount of the solid of the resist composition. By setting the content within this range, it is possible to produce a resist composition capable of forming a resist pattern with high accuracy, and thus the adhesion between the resist pattern and the substrate can be secured.

<Other Components>

The resist composition according to the present invention may also include components other than the components mentioned above (hereinafter sometimes referred to as "other components (F)"), if necessary. The other components (F) are not particularly limited and it is possible to use various additives known in the resist field, for example, sensitizers, dissolution inhibitors, surfactants, stabilizers and dyes.

When other components (F) are used, the content is appropriately selected according to the type of other components (F).

2. Preparation of Resist Composition

The resist composition according to the present invention can be prepared by mixing a compound (I), a resin (A1), a resin (A2) and an acid generator (B), and if necessary, resins other than the resin (A1) and the resin (A2), a quencher (C), a solvent (D), an adhesion improver (E) and other components (F). The order of mixing these components is any order and is not particularly limited. It is possible to select, as the temperature during mixing, appropriate temperature from 10 to 40° C., according to the type of the resin, the solubility in the solvent (D) of the resin and the like. It is possible to select, as the mixing time, appropriate time from 0.5 to 24 hours according to the mixing temperature. The mixing means is not particularly limited and it is possible to use mixing with stirring.

After mixing the respective components, the mixture is preferably filtered through a filter having a pore diameter of about 0.003 to 50 μm.

3. Method for Producing Resist Pattern

The method for producing a resist pattern according to the present invention includes:

(1) a step of applying the resist composition of the present invention on a metal surface of a substrate having the metal surface,
(2) a step of drying the applied resist composition to form a composition layer,
(3) a step of exposing the composition layer, and
(4) a step of heating the exposed composition layer.

The resist composition can be usually applied on a substrate using a conventionally used apparatus, such as a spin coater. Examples of the substrate include inorganic substrates such as a silicon wafer. On the substrate, a semiconductor device (e.g., transistor, diode, etc.) may be formed in advance. When the resist composition of the present invention is used for bump formation, the substrate is preferably a substrate on which a conductive material is laminated. Examples of the conductive material include at least one metal selected from the group consisting of gold, copper, nickel, tin, palladium and silver, or an alloy containing at least one metal selected from the group, and preferably copper or an alloy containing copper.

Before applying the resist composition, the substrate may be washed, and an organic antireflection film may be formed on the substrate.

The solvent is removed by drying the applied composition to form a composition layer. Drying is performed by evaporating the solvent using a heating device such as a hot plate (so-called "prebake"), or a decompression device. The heating temperature is preferably 50 to 200° C. and the heating time is preferably 30 to 600 seconds. The pressure during drying under reduced pressure is preferably about 1 to $1.0 \times 10^5$ Pa.

After drying, the thickness of the composition thus obtained is preferably 1 to 150 μm, and more preferably 1.5 to 100 μm.

The composition layer thus obtained is usually exposed using an aligner. It is possible to use, as an exposure source, various exposure sources, for example, light sources capable of emitting light having a wavelength of 345 to 436 nm (g-ray (wavelength: 436 nm), h-ray (wavelength: 405 nm), i-ray (wavelength: 365 nm), exposure sources capable of emitting laser beam in an ultraviolet region such as KrF excimer laser (wavelength of 248 nm), ArF excimer laser (wavelength of 193 nm) and $F_2$ excimer laser (wavelength of 157 nm), an exposure source capable of emitting harmonic laser beam in a far-ultraviolet or vacuum ultra violet region by wavelength-converting laser beam from a solid-state laser source (YAG or semiconductor laser), an exposure source capable of emitting electron beam or EUV and the like. In the present specification, such exposure to radiation is sometimes collectively referred to as "exposure". The exposure is usually performed through a mask corresponding to a pattern to be required. When electron beam is used as the exposure source, exposure may be performed by direct writing without using the mask.

The exposed composition layer may be subjected to a heat treatment (so-called "post-exposure bake") to promote the elimination reaction in an acid-labile group of the resin (A1). The heating temperature is usually about 50 to 200° C., and preferably about 70 to 150° C. The heating time is usually 40 to 400 seconds, and preferably 50 to 350 seconds.

The heated composition layer is usually developed with a developer using a development apparatus. Examples of the developing method include a dipping method, a paddle method, a spraying method, a dynamic dispensing method and the like. The developing temperature is preferably, for example, 5 to 60° C. and the developing time is preferably, for example, 5 to 600 seconds. It is possible to produce a positive resist pattern or negative resist pattern by selecting the type of the developer as follows.

When the positive resist pattern is produced from the resist composition of the present invention, an alkaline developer is used as the developer. The alkaline developer may be various aqueous alkaline solutions used in this field. Examples thereof include aqueous solutions of tetramethylammonium hydroxide and (2-hydroxyethyl)trimethylammonium hydroxide (commonly known as choline). The surfactant may be contained in the alkaline developer.

It is preferable that the developed resist pattern is washed with ultrapure water and then water remaining on the substrate and the pattern is removed.

When the negative resist pattern is produced from the resist composition of the present invention, a developer containing an organic solvent (hereinafter sometimes referred to as "organic developer") is used as the developer.

Examples of the organic solvent contained in the organic developer include ketone solvents such as 2-hexanone and 2-heptanone; glycol ether ester solvents such as propylene glycol monomethyl ether acetate; ester solvents such as butyl acetate; glycol ether solvents such as propylene glycol monomethyl ether; amide solvents such as N,N-dimethylacetamide; and aromatic hydrocarbon solvents such as anisole.

The content of the organic solvent in the organic developer is preferably 90% by mass or more and 100% by mass or less, more preferably 95% by mass or more and 100% by mass or less, and still more preferably the organic developer is substantially composed of the organic solvent.

Particularly, the organic developer is preferably a developer containing butyl acetate and/or 2-heptanone. The total content of butyl acetate and 2-heptanone in the organic developer is preferably 50% by mass or more and 100% by mass or less, more preferably 90% by mass or more and 100% by mass or less, and still more preferably the organic developer is substantially composed of butyl acetate and/or 2-heptanone.

The surfactant may be contained in the organic developer. A trace amount of water may be contained in the organic developer.

During development, the development may be stopped by replacing by a solvent with the type different from that of the organic developer.

The developed resist pattern is preferably washed with a rinsing solution. The rinsing solution is not particularly limited as long as it does not dissolve the resist pattern, and it is possible to use a solution containing an ordinary organic solvent which is preferably an alcohol solvent or an ester solvent.

After washing, the rinsing solution remaining on the substrate and the pattern is preferably removed.

It is possible to form a resist pattern having a shape with high accuracy by exposing a resist obtained by using the resist composition of the present invention.

4. Method for Producing Plated Molded Article

Using a resist pattern formed by the above method as a mold, an electrode material is deposited by plating and the resist pattern is stripped, and thus a plated molded article such as bump and rewiring can be formed.

The method for producing a plated molded article of the present invention includes:

(5) a step of forming a plated molded article using a resist pattern as a mold, and (6) a step of stripping the resist pattern.

Using a resist pattern formed on a substrate having a conductive layer as a mold, a conductive material is deposited by a known method using a plating solution to form a plated molded article.

Examples of the plating solution include a copper plating solution, a gold plating solution, a nickel plating solution, a solder plating solution, a silver-tin plating solution and the like.

After forming the plated molded article, the resist pattern is removed by a known method using a stripping solution.

Examples of the stripping solution include ethylene glycol alkyl ethers such as ethylene glycol monomethyl ether, ethylene glycol monoethyl ether, ethylene glycol monopropyl ether and ethylene glycol monobutyl ether; diethylene glycol dialkyl ethers such as diethylene glycol dimethyl ether, diethylene glycol diethyl ether, diethylene glycol dipropyl ether and diethylene glycol dibutyl ether; ethylene glycol alkyl acetates such as methyl cellosolve acetate and ethyl cellosolve acetate; propylene glycol alkyl ether acetates such as propylene glycol monomethyl ether acetate, propylene glycol monoethyl ether acetate and propylene glycol monopropyl ether acetate; ketones such as acetone, methyl ethyl ketone, cyclohexanone and methyl amyl ketone; aromatic hydrocarbons such as toluene and xylene; cyclic ethers such as dioxane; and esters such as methyl 2-hydroxypropionate, ethyl 2-hydroxypropionate, ethyl 2-hydroxy-2-methylpropionate, ethyl 3-ethoxypropionate, ethyl ethoxyacetate, ethyl oxyacetate, methyl 2-hydroxy-3-methylbutanoate, 3-methoxybutyl acetate, 3-methyl-3-methoxybutyl acetate, ethyl formate, ethyl acetate, butyl acetate, methyl acetoacetate and ethyl acetoacetate. These stripping solutions may be used alone, or a mixture of two or more thereof may be used.

It is possible to form a plated molded article such as bump and rewiring by the above method.

When the plated molded article is formed, a surface of a conductive layer surface may be subjected to an ashing treatment to improve the adhesion between the conductive layer and the plated molded article. Examples of the method for an ashing treatment include a method using oxygen plasma.

Since the plated molded article obtained by using the resist pattern of the present invention causes less swelling in a plating bath, a plated molded article can be formed with high accuracy.

5. Applications

The resist composition of the present invention is useful for the production of a thick resist film. For example, it is useful for the production of a resist film having a thickness of 1 to 150 μm.

The resist composition of the present invention is also useful for the production of bump and rewiring by a plating step. Bump and rewiring can be usually formed by the following procedure when producing using a resist composition. Thus, it is possible to produce a resist pattern having particularly excellent pattern shape.

First, a conductive material (seed metal) is laminated on a wafer with a semiconductor device formed thereon to form a conductive layer. Thereafter, a resist pattern is formed on the conductive layer using the resist composition of the present invention. Using the resist pattern as a mold, an electrode material (e.g., Cu, Ni, solder, etc.) is deposited by plating and then the resist pattern and the conductive layer remaining under the resist pattern are removed by etching, and thus bump and rewiring can be formed. After removal of the conductive layer, the electrode material may be melted by a heat treatment to obtain bump, if necessary.

EXAMPLES

The present invention will be described more specifically by way of Examples. Percentages and parts expressing the contents or amounts used in the Examples are by mass unless otherwise specified.

The weight-average molecular weight is a value determined by gel permeation chromatography under the following conditions.

Apparatus: Model HLC-8120GPC (manufactured by TOSOH CORPORATION)

Column: TSKgel Multipore $H_{XL}$-M×3+guardcolumn (manufactured by TOSOH CORPORATION)

Eluent: tetrahydrofuran

Flow rate: 1.0 mL/min

Detector: RI detector

Column temperature: 40° C.

Injection amount: 100 μl

Molecular weight standards: polystyrene standard (manufactured by TOSOH CORPORATION)

Synthesis Example 1 [Synthesis of Resin (A1)-1]

20 Parts of poly-p-hydroxystyrene (S-4P; manufactured by Maruzen Petrochemical CO, LTD.) was dissolved in 240 parts of methyl isobutyl ketone at room temperature and concentrated by an evaporator. In a four-necked flask equipped with a reflux condenser, a stirrer and a thermometer, the concentrated resin solution and 0.003 part of p-toluenesulfonic acid dihydrate were added. While maintaining the thus obtained mixture at 20 to 25° C., 5.05 parts of ethyl vinyl ether was added dropwise to the mixture over 10 minutes. The mixture was stirred at 20 to 25° C. for 2 hours. The reaction mixture thus obtained was diluted with 200 parts of methyl isobutyl ketone, followed by washing with ion-exchanged water and further isolation through separation five times. The organic layer thus obtained was concentrated until the amount became 45 parts using an evaporator and 150 parts of propylene glycol monomethyl ether acetate was added, followed by concentration again to obtain 78 parts (solid content of 29%) of a propylene glycol monomethyl ether acetate solution of a resin (A1)-1. The resin (A1)-1 is a resin having the following structural units. The weight-average molecular weight of the resin (A1)-1 was $1.16 \times 10^4$. The ratio of a hydroxy group in poly-p-hydroxystyrene substituted with an ethoxyethoxy group was 40.9%.

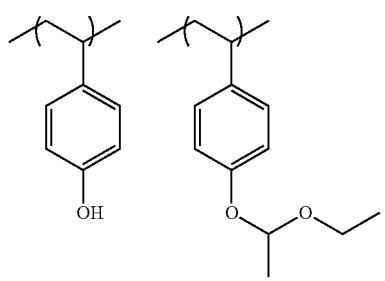

Synthesis Example 2 [Synthesis of Resin (A1)-2]

In a flask, 120 parts of a phenol novolak resin (PSM-4326, manufactured by Gun Ei Chemical Industry Co., Ltd.) and 960 parts of methyl isobutyl ketone were charged and dissolved. The phenol novolak resin solution thus obtained was washed with ion-exchanged water five times, followed by isolation through separation. The organic layer thus obtained was concentrated until the amount became 327.3 parts. The concentration of the resin included in the thus obtained resin solution was 35.2%.

In a flask, 56.8 parts of the resin solution, 76.52 parts of methyl isobutyl ketone and 0.0036 part of p-toluenesulfonic acid monohydrate were added. To this mixture, 8.81 parts of ethyl vinyl ether was added dropwise, followed by a reaction at room temperature for 3 hours. To this reaction solution, ion-exchanged water was added, and after stirring and standing, the organic layer was isolated through separation. Washing with ion-exchanged water was repeated four times, and thus washing was performed five times in total. Then, the organic layer was isolated and concentrated. In order to remove moisture and methyl isobutyl ketone by azeotropy, propylene glycol monomethyl ether acetate was added, followed by concentration to obtain 57.44 parts of a resin solution. The resin solution thus obtained was a solution of a resin in which a hydroxy group of a phenol novolak resin is partially 1-ethoxyethylated. As a result of analysis of this resin by $^1$H-NMR, it was found that 53.0% of hydroxy groups of the phenol novolak resin were substituted with 1-ethoxyethyl ether. As a result of the measurement using the dry weight reduction method, the concentration of the resin solution was 45.0%. This resin is referred to as a resin (A1)-2. The resin (A1)-2 is a resin including the following structural units. The weight-average molecular weight of the resin (A1)-2 was $7.2 \times 10^3$.

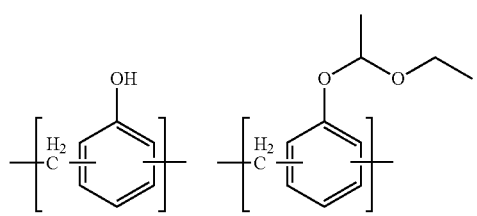

Synthesis Example 3 [Synthesis of Resin (A2)-1]

In a four-necked flask equipped with a stirrer, a reflux condenser and a thermometer, 413.5 parts of 2,5-xylenol, 103.4 parts of salicylaldehyde, 20.1 parts of p-toluenesulfonic acid and 826.9 parts of methanol were added, followed by heating to reflux and further warm-keeping for 4 hours. After cooling, 1,320 parts of methyl isobutyl ketone was added and 1,075 parts of the solvent was distilled off under normal pressure. 762.7 Parts of m-cresol and 29.0 parts of 2-tert-butyl-5-methylphenol were added thereto, and after raising the temperature to 65° C., 678 parts of an aqueous 37% formalin solution was added dropwise over 1.5 hours while adjusting the temperature so that the temperature reaches 87° C. after completion of the dropwise addition. The mixture thus obtained was kept warm at 87° C. for 10 hours and 1,115 parts of methyl isobutyl ketone was added, followed by washing through separation with ion-exchanged water three times. To the mixture thus obtained, 500 parts of methyl isobutyl ketone was added, followed by concentration under reduced pressure until the total amount became 3,435 parts. To the mixture thus obtained, 3,796 parts of methyl isobutyl ketone and 4,990 parts of n-heptane were added, followed by raising the temperature to 60° C. and further stirring for 1 hour. Thereafter, the under layer containing the resin was isolated through separation, followed by dilution with 3,500 parts of propylene glycol monomethyl ether acetate and further concentration to obtain 1,690 parts (solid content of 43%) of a propylene glycol monomethyl ether acetate solution of a resin (A2)-1. The weight-average molecular weight of the novolak resin (A2)-1 was $7 \times 10^3$. When developing with an aqueous 2.38% by mass tetramethylammonium hydroxide solution, a residual film ratio was 74%. The residual film ratio was measured by the method mentioned in <Resin (A2)> of the Detailed Description of the Invention.

<Preparation of Resist Composition>

A mixture obtained by mixing and dissolving the respective components shown in Table 1 was filtered through a fluororesin filter having a pore diameter of 0.5 μm to prepare resist compositions.

TABLE 1

| Resist composition | Resin (A1) and Resin (A2) | Acid generator (B) | Compound (I) | Quencher (C) | Solvent (D) |
|---|---|---|---|---|---|
| Composition 1 | (A1)-1 = 6.75 parts (A2)-1 = 6.75 parts | (B)-1 = 0.3 part | (I)-1 = 1 part | (C)-1 = 0.055 part | (D)-1 = 47 parts |
| Composition 2 | (A1)-1 = 6.75 parts (A2)-1 = 6.75 parts | (B)-1 = 0.175 part (B)-2 = 0.125 part | (I)-1 = 1 part | (C)-1 = 0.055 part | (D)-1 = 47 parts |
| Composition 3 | (A1)-1 = 6.75 parts (A2)-1 = 6.75 parts | (B)-1 = 0.175 part (B)-2 = 0.125 part | (I)-2 = 1.5 parts | (C)-1 = 0.055 part | (D)-1 = 47 parts |
| Composition 4 | (A1)-1 = 6.75 parts (A2)-1 = 6.75 parts | (B)-1 = 0.175 part (B)-2 = 0.125 part | (I)-3 = 1 part | (C)-1 = 0.055 part | (D)-1 = 47 parts |
| Composition 5 | (A1)-1 = 6.75 parts (A2)-1 = 6.75 parts | (B)-1 = 0.24 part | (I)-3 = 1.25 parts | (C)-1 = 0.055 part | (D)-1 = 47 parts |
| Composition 6 | (A1)-2 = 6.75 parts (A2)-1 = 6.75 parts | (B)-1 = 0.24 part | (I)-3 = 1.25 parts | (C)-1 = 0.055 part | (D)-1 = 47 parts |
| Comparative Composition 1 | (A1)-1 = 6.75 parts (A2)-1 = 6.75 parts | (B)-1 = 0.3 part | — | (C)-1 = 0.055 part | (D)-1 = 47 parts |
| Comparative Composition 2 | (A1)-1 = 13.5 parts | (B)-1 = 0.3 part | (I)-3 = 1 part | (C)-1 = 0.055 part | (D)-1 = 47 parts |

<Resin>
  (A1)-1: Resin (A1)-1
  (A1)-2: Resin (A1)-2
  (A2)-1: Resin (A2)-1
<Acid Generator (B)>
  (B)-1: N-Hydroxynaphthalimide triflate (NAI-105; manufactured by Midori Kagaku Co., Ltd.)

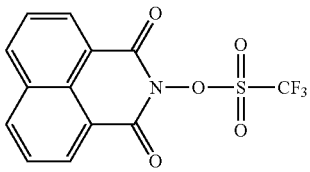 [SMILES: O=C1c2cccc3cccc(c23)C(=O)N1OS(=O)(=O)C(F)(F)F]

(B)-2: Compound represented by the following formula (PAG-103; manufactured by BASF)

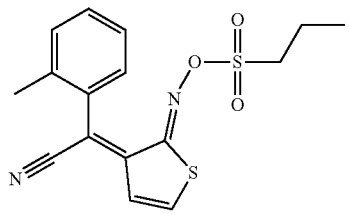 [SMILES: CCCS(=O)(=O)O/N=C1\SC=C\C1=C(/C#N)c1ccccc1C]

<Compound (I)>
  (I)-1: synthesized by the method mentioned in JP 3-185447 A

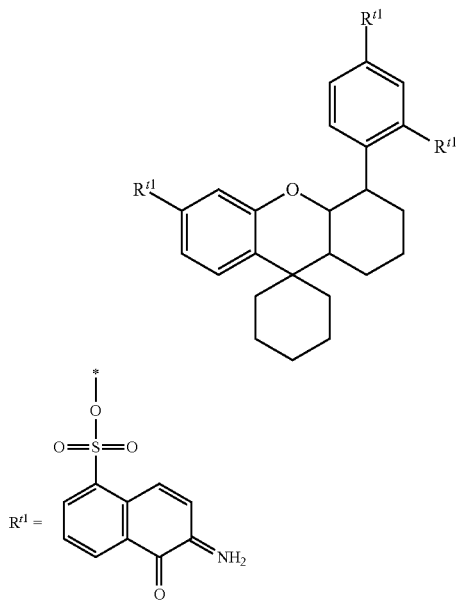

(I)-2: synthesized by the method mentioned in JP 9-110762 A

1 Mol of the following compound in which $R^{t1}$, $R^{t6}$, $R^{t7}$, $R^{t9}$ and $R^{t10}$ are a hydroxy group was reacted with 2 mol of sulfonyl chloride, and almost 100% of the reaction proceeded. Therefore, mainly, it was confirmed that the reaction product is a di-substituted derivative in which a hydrogen atom in two hydroxy groups in $R^{t1}$, $R^{t6}$, $R^{t7}$, $R^{t9}$ and $R^{t10}$ is substituted with a 1,2-naphthoquinone diazide sulfonyl group (MS:M+:1080).

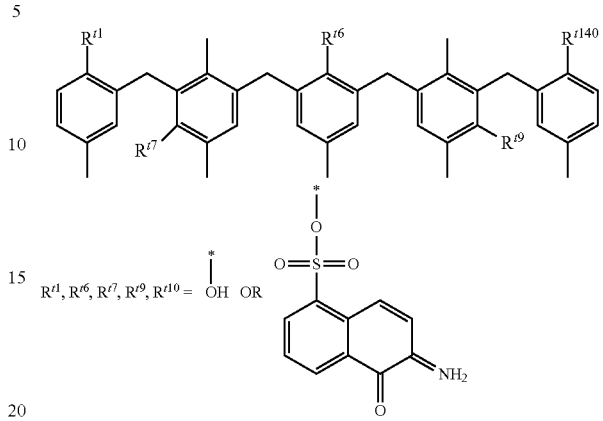

(I)-3: synthesized by the method mentioned in JP 8-245461 A

1 Mol of the following compound in which $R^{t1}$, $R^{t7}$, $R^{t9}$ and $R^{t10}$ are a hydroxy group was reacted with 2 mol of sulfonyl chloride, and almost 100% of the reaction proceeded. Therefore, mainly, it was confirmed that the reaction product is a di-substituted derivative in which a hydrogen atom in two hydroxy groups in $R^{t1}$, $R^{t7}$, $R^{t9}$ and $R^{t10}$ is substituted with a 1,2-naphthoquinone diazide sulfonyl group (MS:M+:960).

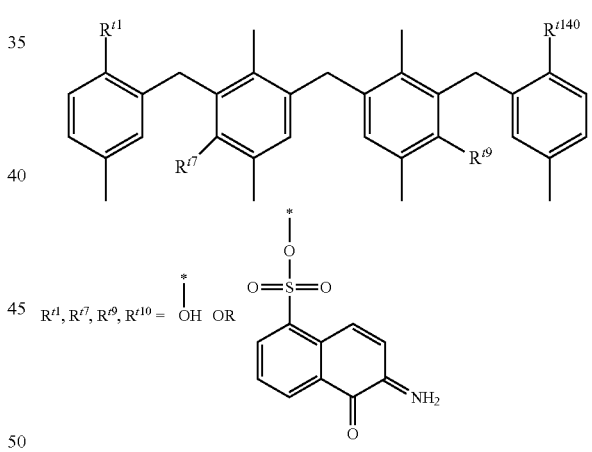

<Quencher (C)>
  (C)-1: 2,4,5-Triphenylimidazole (manufactured by Tokyo Chemical Industry Co., Ltd.)
<Solvent (D)>
  (D)-1: Propylene glycol monomethyl ether acetate Examples 1 to 6, Comparative Examples 1 and 2

(Evaluation of Exposure of Resist Composition with i-Ray)

On a 4-inch substrate in which copper had been vapor-deposited on a silicon wafer, each of the resist compositions prepared above was spin-coated so that the thickness of the resulting film became 1.5 µm after pre-baking.

Then, the substrate was subjected to pre-baking on a direct hotplate at 100° C. for 180 seconds to form a composition layer.

Using an i-ray stepper (NSR-2005i9C, manufactured by Nikon Corporation, NA=0.5) and a mask for forming a 1:1 line and space pattern (line width of 1 μm), each wafer thus formed with the composition layer was subjected to exposure with the exposure dose being varied stepwise.

After exposure, each wafer was subjected to post-exposure baking on a hot plate at 90° C. for 60 seconds, and each wafer was subjected to paddle development for 180 seconds with an aqueous 2.38% by mass tetramethylammonium hydroxide solution to obtain resist patterns.

The resist pattern obtained after development was observed by a scanning electron microscope and the effective sensitivity was expressed as the exposure dose at which a 1:1 line and space pattern with a line width of 1 μm was obtained.

<Evaluation of Resolution>

The resist pattern obtained in the effective sensitivity was observed by a scanning electron microscope and a minimum value of the line width of the resolved line and space pattern was measured.

<Evaluation of Roughness Due to Standing Wave Effect>

The cross-sectional shape of a line and space pattern with the line width of 0.6 μm obtained in the effective sensitivity was observed by a scanning electron microscope and each line width of a and b shown in FIG. 1 was measured. The case where the calculated value derived from b/a is less than 0.8 was rated "C", the case where the calculated value derived from b/a is 0.8 or more and less than 0.9 was rated "B", and the case where the calculated value derived from b/a is 0.9 or more was rated "A". a is the line width of the longest part in a predetermined line (a maximum value of line width) (pnm), while b is the line width of the shortest part in a predetermined line (a minimum value of line width) (μm). The results shown in the table are results on the line in which the value of b/a is the smallest among the observed lines.

<Evaluation of Plating Resistance>

A wafer with a pattern was fabricated at the effective sensitivity obtained in the above i-ray exposure evaluation, and then immersed in a Cu plating solution for 5 minutes, 15 minutes, and 30 minutes.

The immersed wafer with a pattern was observed by an optical microscope and a line and space pattern with a line width of 1 μm was observed.

The wafer where pattern collapse is observed at the immersion time of 15 minutes was rated "C", the wafer where pattern collapse is not observed at the immersion time of 15 minutes and pattern collapse is observed at the immersion time of 30 minutes was rated "B", and the wafer where pattern collapse is not observed at the immersion time of 30 minutes was rated "A".

TABLE 2

| | Resist composition | Resolution (μm) | Roughness | Plating resistance |
|---|---|---|---|---|
| Example 1 | Composition 1 | 0.4 | A | A |
| Example 2 | Composition 2 | 0.375 | B | A |
| Example 3 | Composition 3 | 0.375 | A | A |
| Example 4 | Composition 4 | 0.375 | B | A |
| Example 5 | Composition 5 | 0.375 | A | A |
| Example 6 | Composition 6 | 0.375 | A | A |
| Comparative Example 1 | Comparative Composition 1 | 0.475 | C | C |
| Comparative Example 2 | Comparative Composition 2 | 0.475 | C | C |

INDUSTRIAL APPLICABILITY

The resist composition of the present invention is suited for fine processing of semiconductors because it is capable of producing a resist pattern with satisfactory shape and plating resistance, and thus it is industrially very useful.

What is claimed is:

1. A resist composition comprising a compound (I) having a quinone diazide sulfonyl group, a resin comprising a structural unit having an acid-labile group (A1), an alkali-soluble resin (A2) and an acid generator (B).

2. The resist composition according to claim 1, wherein the compound (I) having a quinone diazide sulfonyl group is a compound having a group represented by formula (a), a group represented by formula (b) or a group represented by formula (c):

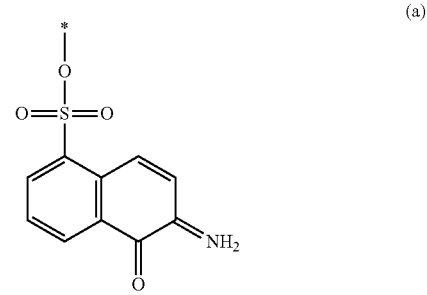

(a)

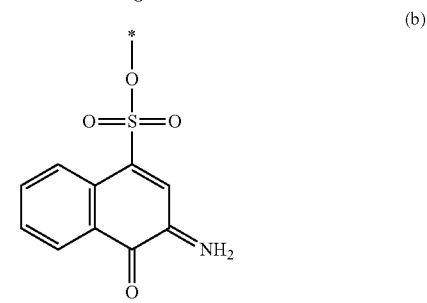

(b)

wherein, in formula (a) and formula (b), * represents a bond:

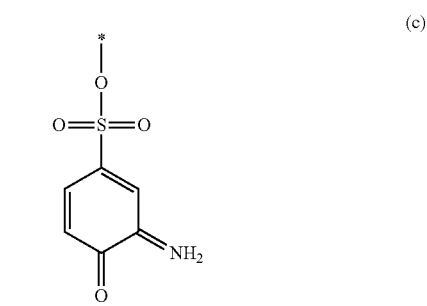

(c)

wherein, in formula (c), * represents a bond.

3. The resist composition according to claim 2, wherein the compound (I) having a quinone diazide sulfonyl group is at least one selected from the group consisting of a compound represented by formula (II), a compound represented by formula (III), a compound represented by formula (IV) and a compound represented by formula (V):

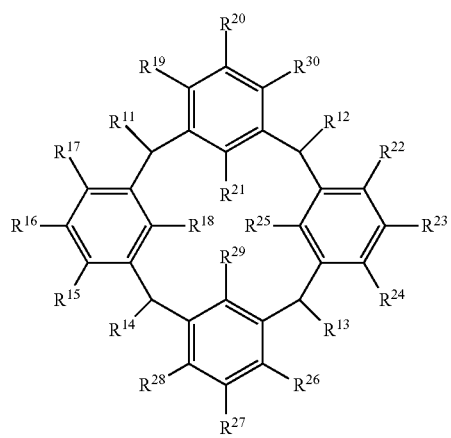

(II)

wherein, in formula (II),
- $R^{11}$ to $R^{14}$ each independently represent a hydrogen atom, a hydroxy group, a hydrocarbon group having 1 to 18 carbon atoms, a group represented by formula (a), a group represented by formula (b) or a group represented by formula (c), and a methylene group included in the hydrocarbon group having 1 to 18 carbon atoms may be replaced by an oxygen atom, a carbonyl group or $-NR^{d1}-$,
- $R^{d1}$ represents a hydrogen atom or an alkyl group having 1 to 6 carbon atoms,
- $R^{15}$ to $R^{30}$ each independently represent a hydrogen atom, a hydroxy group, a group represented by formula (a), a group represented by formula (b) or a group represented by formula (c), and
- at least one of $R^{11}$ to $R^{30}$ is a group represented by formula (a), a group represented by formula (b) or a group represented by formula (c):

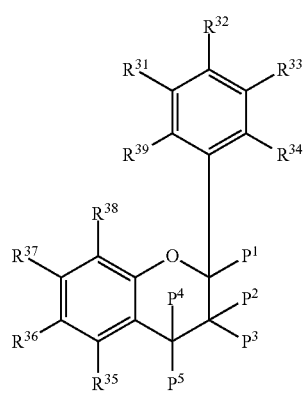

(III)

wherein, in formula (III),
- $R^{31}$ to $R^{39}$ each independently represent a hydrogen atom, a hydroxy group, an alkyl group having 1 to 6 carbon atoms, a group represented by formula (a), a group represented by formula (b) or a group represented by formula (c), and at least one of $R^{31}$ to $R^{39}$ is a group represented by formula (a), a group represented by formula (b) or a group represented by formula (c),
- $P^1$ to $P^5$ each independently represent a hydrogen atom, a hydrocarbon group having 1 to 18 carbon atoms, a methylene group included in the hydrocarbon group having 1 to 18 carbon atoms may be replaced by an oxygen atom, a carbonyl group or $-NR^{d2}-$, and $P^1$ and $P^2$ may be bonded to each other to form a ring together with two carbon atoms to which $P^1$ and $P^2$ are bonded, and $P^4$ and $P^5$ may be bonded to each other to form a ring together with carbon atoms to which $P^4$ and $P^5$ are bonded, and
- $R^{d2}$ represents a hydrogen atom or an alkyl group having 1 to 6 carbon atoms:

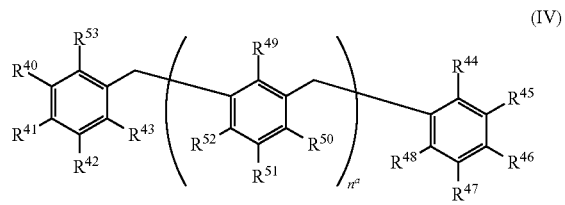

(IV)

wherein, in formula (IV),
- $R^{40}$ to $R^{53}$ each independently represent a hydrogen atom, a hydroxy group, an alkyl group having 1 to 6 carbon atoms, a group represented by formula (a), a group represented by formula (b) or a group represented by formula (c), and at least one of $R^{40}$ to $R^{53}$ is a group represented by formula (a), a group represented by formula (b) or a group represented by formula (c), and
- $n^a$ represents an integer of 1 to 5, and when $n^a$ is an integer of 2 or more, a plurality of $R^{49}$ to $R^{52}$ may be the same or different from each other:

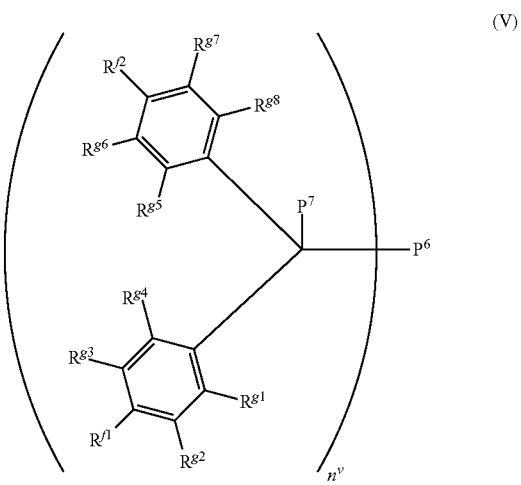

(V)

wherein, in formula (V),
- $R^{f1}$, $R^{f2}$ and $R^{g1}$ to $R^{g8}$ each independently represent a hydrogen atom, a hydroxy group, an alkyl group having 1 to 6 carbon atoms, a group represented by formula (a), a group represented by formula (b) or a group represented by formula (c), and at least one of $R^{f1}$, $R^{f2}$ and $R^{g1}$ to $R^{g8}$ is a group represented by formula (a), a group represented by formula (b) or a group represented by formula (c),
- $P^6$ represents a monovalent aromatic hydrocarbon group having 6 to 12 carbon atoms or a divalent aromatic hydrocarbon group having 6 to 12 carbon atoms, and the aromatic hydrocarbon group may be substituted with at least one selected from the group consisting of a hydroxy group and an alkyl group having 1 to 6 carbon atoms, $P^7$ represents a hydrogen atom or a hydrocarbon group having 1 to 18 carbon atoms which may have a substituent, a methylene group included in the hydrocarbon group having 1 to 18 carbon atoms may be replaced by an oxygen atom, a carbonyl group or $-NR^{d3}-$, and $P^6$ and $P^7$ may be bonded to each other to form a ring, $n^v$ represents 1 or 2, and $R^{d3}$ represents a hydrogen atom or an alkyl group having 1 to 6 carbon atoms.

4. The resist composition according to claim 1, wherein the resin comprising a structural unit having an acid-labile group (A1) is a resin comprising a structural unit having a group represented by formula (10) or a group represented by formula (20):

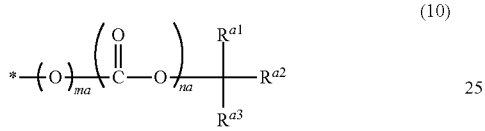

(10)

wherein, in formula (10), $R^{a1}$, $R^{a2}$ and $R^{a3}$ each independently represent an alkyl group having 1 to 8 carbon atoms or an alicyclic hydrocarbon group having 3 to 20 carbon atoms, or $R^{a1}$ and $R^{a2}$ are bonded to each other to form a ring having 3 to 20 carbon atoms together with carbon atoms to which $R^{a1}$ and $R^{a2}$ are bonded, and $R^{a3}$ represents an alkyl group having 1 to 8 carbon atoms or an alicyclic hydrocarbon group having 3 to 20 carbon atoms, ma and na each independently represent 0 or 1, at least one of ma and na represents 1, and * represents a bond:

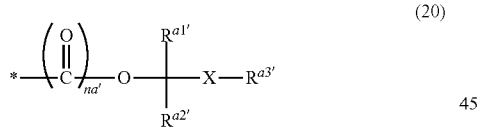

(20)

wherein, in formula (20), $R^{a1'}$ and $R^{a2'}$ each independently represent a hydrogen atom or a hydrocarbon group having 1 to 20 carbon atoms, $R^{a3'}$ represents a hydrocarbon group having 1 to 20 carbon atoms, or $R^{a1'}$ represents a hydrogen atom or a hydrocarbon group having 1 to 20 carbon atoms, and $R^{a2'}$ and $R^{a3'}$ are bonded to each other to form an heterocyclic ring having 3 to 20 carbon atoms together with carbon atoms and X to which $R^{a2'}$ and $R^{a3'}$ are bonded, a methylene group included in the hydrocarbon group having 1 to 20 carbon atoms and the heterocyclic ring having 3 to 20 carbon atoms may be replaced by an oxygen atom or a sulfur atom, X represents an oxygen atom or a sulfur atom, na' represents 0 or 1, and * represents a bond.

5. The resist composition according to claim 1, wherein the resin comprising a structural unit having an acid-labile group (A1) is a resin comprising a structural unit represented by formula (a1-1) or a structural unit represented by formula (a1-2):

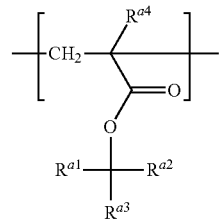

(a1-1)

wherein, in formula (a1-1), $R^{a1}$, $R^{a2}$ and $R^{a3}$ each independently represent an alkyl group having 1 to 8 carbon atoms or an alicyclic hydrocarbon group having 3 to 20 carbon atoms, or $R^{a1}$ and $R^{a2}$ are bonded to each other to form a ring having 3 to 20 carbon atoms together with carbon atoms to which $R^{a1}$ and $R^{a2}$ are bonded, and $R^{a3}$ represents an alkyl group having 1 to 8 carbon atoms or an alicyclic hydrocarbon group having 3 to 20 carbon atoms, and $R^{a4}$ represents a hydrogen atom or a methyl group:

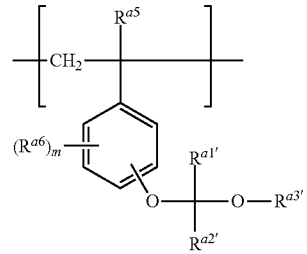

(a1-2)

wherein, in formula (a1-2), $R^{a1'}$ and $R^{a2'}$ each independently represent a hydrogen atom or a hydrocarbon group having 1 to 20 carbon atoms, $R^{a3'}$ represents a hydrocarbon group having 1 to 20 carbon atoms, or $R^{a1'}$ represents a hydrogen atom or a hydrocarbon group having 1 to 20 carbon atoms, and $R^{a2'}$ and $R^{a3'}$ are bonded to each other to form an heterocyclic ring having 3 to 20 carbon atoms together with carbon atoms and oxygen atoms to which $R^{a2'}$ and $R^{a3'}$ are bonded, and a methylene group included in the hydrocarbon group having 1 to 20 carbon atoms and the heterocyclic ring having 3 to 20 carbon atoms may be replaced by an oxygen atom or a sulfur atom, $R^{a5}$ represents a hydrogen atom or a methyl group, $R^{a6}$ represents an alkyl group having 1 to 6 carbon atoms or an alkoxy group having 1 to 6 carbon atoms, and m represents an integer of 0 to 4, and when m is 2 or more, a plurality of $R^{a6}$ may be the same or different from each other.

6. The resist composition according to claim 1, wherein the resin comprising a structural unit having an acid-labile group (A1) is a resin comprising a structural unit represented by formula (a3A) or a structural unit represented by formula (a3B):

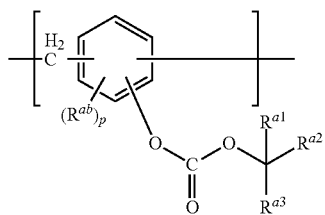

(a3A)

wherein, in formula (a3A), $R^{a1}$, $R^{a2}$ and $R^{a3}$ each independently represent an alkyl group having 1 to 8 carbon atoms or an alicyclic hydrocarbon group having 3 to 20 carbon atoms, or $R^{a1}$ and $R^{a2}$ are bonded to each other to form a ring having 3 to 20 carbon atoms together with carbon atoms to which $R^{a1}$ and $R^{a2}$ are bonded, and $R^{a3}$ represents an alkyl group having 1 to 8 carbon atoms or an alicyclic hydrocarbon group having 3 to 20 carbon atoms, $R^{ab}$ represents a hydroxy group, an alkyl group having 1 to 6 carbon atoms or an alkoxy group having 1 to 6 carbon atoms, and p represents 0, 1, 2 or 3, and when p is 2 or 3, $R^{ab}$ may be the same or different:

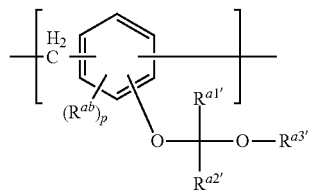

(a3B)

wherein, in formula (a3B), $R^{a1'}$ and $R^{a2'}$ each independently represent a hydrogen atom or a hydrocarbon group having 1 to 20 carbon atoms, $R^{a3'}$ represents a hydrocarbon group having 1 to 20 carbon atoms, or $R^{a1'}$ represents a hydrogen atom or a hydrocarbon group having 1 to 20 carbon atoms, and $R^{a2'}$ and $R^{a3'}$ are bonded to each other to form an heterocyclic ring having 3 to 20 carbon atoms together with carbon atoms and oxygen atoms to which $R^{a2'}$ and $R^{a3'}$ are bonded, a methylene group included in the hydrocarbon group having 1 to 20 carbon atoms and the heterocyclic ring having 3 to 20 carbon atoms may be replaced by an oxygen atom or a sulfur atom, $R^{ab}$ represents a hydroxy group, an alkyl group having 1 to 6 carbon atoms or an alkoxy group having 1 to 6 carbon atoms, and p represents 0, 1, 2 or 3, and when p is 2 or 3, $R^{ab}$ may be the same or different.

7. The resist composition according to claim 1, wherein the alkali-soluble resin (A2) is a resin which comprises a structural unit having a carboxy group or a hydroxy group and does not comprise a structural unit having an acid-labile group.

8. The resist composition according to claim 1, further comprising a quencher (C).

9. A method for producing a resist pattern, which comprises:
   (1) a step of applying the resist composition according to claim 1 on a metal surface of a substrate having the metal surface,
   (2) a step of drying the applied composition to form a composition layer,
   (3) a step of exposing the composition layer, and
   (4) a step of developing the exposed composition layer.

10. A method for producing a plated molded article, which comprises:
   (1) a step of applying the resist composition according to claim 1 on a metal surface of a substrate having the metal surface,
   (2) a step of drying the applied composition to form a composition layer,
   (3) a step of exposing the composition layer,
   (4) a step of developing the exposed composition layer,
   (5) a step of forming a plated molded article using the resist pattern thus obtained as a mold, and
   (6) a step of stripping the resist pattern.

* * * * *